(12) United States Patent
Zhao et al.

(10) Patent No.: US 11,486,039 B2
(45) Date of Patent: Nov. 1, 2022

(54) LASER-ASSISTED METAL-ORGANIC CHEMICAL VAPOR DEPOSITION DEVICES AND METHODS OF USE THEREOF

(71) Applicant: Ohio State Innovation Foundation, Columbus, OH (US)

(72) Inventors: Hongping Zhao, Columbus, OH (US); Zhaoying Chen, Columbus, OH (US)

(73) Assignee: Ohio State Innovation Foundation, Columbus, OH (US)

( * ) Notice: Subject to any disclaimer, the term of this patent is extended or adjusted under 35 U.S.C. 154(b) by 83 days.

(21) Appl. No.: 16/876,798

(22) Filed: May 18, 2020

(65) Prior Publication Data

US 2021/0355581 A1 Nov. 18, 2021

(51) Int. Cl.
| | | |
|---|---|---|
| *C23C 16/48* | (2006.01) | |
| *C23C 16/458* | (2006.01) | |
| *C23C 16/34* | (2006.01) | |
| *C30B 25/10* | (2006.01) | |
| *C30B 25/12* | (2006.01) | |
| *H01L 21/687* | (2006.01) | |
| *C30B 29/40* | (2006.01) | |
| *H01L 21/02* | (2006.01) | |
| *C30B 25/14* | (2006.01) | |

(52) U.S. Cl.
CPC .......... *C23C 16/483* (2013.01); *C23C 16/34* (2013.01); *C23C 16/4584* (2013.01); *C30B 25/105* (2013.01); *C30B 25/12* (2013.01); *C30B 25/14* (2013.01); *C30B 29/406* (2013.01); *H01L 21/0254* (2013.01); *H01L 21/0262* (2013.01); *H01L 21/68764* (2013.01); *H01L 21/68771* (2013.01)

(58) Field of Classification Search
CPC ... C23C 16/34; C23C 16/4584; C23C 16/483; C23C 16/047; C23C 16/0263; C23C 16/482; C30B 25/105; C30B 25/12; C30B 25/14; C30B 29/406; H01L 21/0254; H01L 21/0262; H01L 21/68764; H01L 21/68771
See application file for complete search history.

(56) References Cited

U.S. PATENT DOCUMENTS

| | | | |
|---|---|---|---|
| 4,726,320 A * | 2/1988 | Ichikawa | C23C 16/483 |
| | | | 118/715 |
| 10,233,544 B2 | 3/2019 | Lu et al. | |
| 2010/0300359 A1 | 12/2010 | Armour et al. | |
| 2011/0033638 A1* | 2/2011 | Ponnekanti | C23C 16/483 |
| | | | 427/569 |
| 2013/0243971 A1* | 9/2013 | Thompson | C23C 16/45548 |
| | | | 427/554 |
| 2016/0203972 A1 | 7/2016 | Sundaram et al. | |

(Continued)

FOREIGN PATENT DOCUMENTS

JP 02156086 A * 6/1990 .......... C23C 16/48

OTHER PUBLICATIONS

Lyons JL et al. Carbon impurities and the yellow luminescence in GaN, Appl. Phys. Lett. 97, 2010, 152108.

(Continued)

*Primary Examiner* — Matthew J Song
(74) *Attorney, Agent, or Firm* — Meunier Carlin & Curfman LLC

(57) ABSTRACT

Disclosed herein are laser-assisted metal-organic chemical vapor deposition devices and methods of use thereof.

13 Claims, 40 Drawing Sheets

(56) References Cited

U.S. PATENT DOCUMENTS

2016/0340783 A1    11/2016   Lu et al.
2017/0226636 A1    8/2017   Xiao

OTHER PUBLICATIONS

Nagashima T et al. Structural and optical properties of carbon-doped AlN substrates grown by hydride vapor phase epitaxy using AlN substrates prepared by physical vapor transport[J], Applied Physics Express, 2012, 5(12): 125501.

Ohta H et al. "5.0 kV breakdown-voltage vertical GaN p-n junction diodes," Jpn. J. Appl. Phys. 57(4S), 2018, 04FG09.

Wu S et al. Unambiguous Identification of Carbon Location on the N Site in Semi-insulating GaN. Physical review letters, 2018, 121(14): 145505.

Yang J et al. Emission efficiency enhanced by reducing the concentration of residual carbon impurities in InGaN/GaN multiple quantum well light emitting diodes[J]. Optics Express, 2016, 24(13): 13824-13831.

Zhang Y et al. Metalorganic Chemical Vapor Deposition Gallium Nitride with Fast Growth Rate for Vertical Power Device Applications, Phys. Status Solidi A Jan. 2021, 2000469.

Ban VS., Mass spectrometric studies of vapor-phase crystal growth II, GaN. J. Electrochem. Soc. 1972, 119, 761-765.

Golgir HR et al. Fast Growth of GaN Epilayers via Laser-Assisted Metal-Organic Chemical Vapor Deposition for Ultraviolet Photodetector Applications, ACS Appl. Mater. Interfaces 2017, 9, 21539-21547.

Golgir HR et al. Low-temperature growth of crystalline gallium nitride films using vibrational excitation of ammonia molecules in laser-assisted metalorganic chemical vapor deposition. Cryst. Growth Des. 2014, 14, 6248-6253.

Matsuoka T et al. Optical bandgap energy of wurtzite InN, Applied Physics Letters 2002, 81(7), 1246-1248.

Mishra UK et al. AlGaN/GaN HEMTs—an overview of device operation and applications, Proceedings of the IEEE 2002, 90(6), 1022-1031.

Mukai T et al. Characteristics of InGaN-based UV/blue/green/amber/red light-emitting diodes, Japanese Journal of Applied Physics 1999, 38(7R), 3976.

Usikov A et al. New results on HVPE growth of AlN, GaN, InN and their alloys, Phys. Stat. Sol.(c), 2008, 5(6), 1825-1828.

Wang X et al. Molecular beam epitaxy growth of GaN, AlN and InN, Progress in Crystal Growth and Characterization of Materials 2004, 48, 42-103.

Watson IM. Metal organic vapour phase epitaxy of AlN, GaN, InN and their alloys: A key chemical technology for advanced device applications, Coordination Chemistry Reviews 2013, 257(13-14), 2120-2141.

White AH et al. The decomposition of ammonia at high temperatures, J. Am. Chem. Soc. 1905, 27, 373-386.

Wu J. When group-III nitrides go infrared: New properties and perspectives, Journal of Applied Physics 2009, 106(1), 5.

Zare RN. Laser control of chemical reactions. Science 1998, 279, 1875.

International Search Report and Written Opinion dated May 16, 2022 in International Application No. PCT/US22/12656 (18 pages).

Golgir. Laser-assisted Metal Organic Chemical Vapor Deposition of Gallium Nitride, Dissertation, 2017.

Zhang et al. Laser-Assisted Metal-Organic Chemical Vapor Deposition of Gallium Nitride, Phys. Status Solidi (RRL) 2021, 15, 2100202.

\* cited by examiner

LASER-ASSISTED METAL-ORGANIC CHEMICAL VAPOR DEPOSITION DEVICES AND METHODS OF USE THEREOF

STATEMENT OF GOVERNMENT SUPPORT

This invention was made with government support under Grant No. GRT00052380 awarded by The Advanced Research Projects Agency-Energy (ARPA-E). The government has certain rights in the invention.

BACKGROUND

Semiconductor material systems are of interest for both optoelectronic and power electronic device applications. The fabrication of many semiconductor films mainly relies on epitaxy technology. Epitaxy methods include, for example, hydride vapor phase epitaxy (HYPE), molecular beam epitaxy (MBE), and metal-organic chemical vapor deposition (MOCVD). Low cracking efficiency of certain precursors is one of the key challenges for semiconductor epitaxy. Therefore, methods for enhancing the cracking efficiency of precursor are needed for high quality and efficient semiconductor epitaxy using MOCVD. The devices and methods discussed herein address these and other needs.

SUMMARY

In accordance with the purposes of the disclosed devices, methods, and systems as embodied and broadly described herein, the disclosed subject matter relates to Laser-assisted metal-organic chemical vapor deposition devices and methods of use thereof.

For example, described herein are laser-assisted metal-organic chemical vapor deposition (MOCVD) devices, the devices comprising: a plurality of laser injectors, wherein each of the plurality of laser injectors defines an inlet, an outlet opposite and spaced apart from the inlet, and an optical path extending from the inlet to the outlet; a set of first conduits, wherein each of the first conduits defines an inlet, an outlet opposite and spaced apart from the inlet, and a path for fluid flow from the inlet to the outlet; and a set of second conduits, wherein each of the second conduits defines an inlet, an outlet opposite and spaced apart from the inlet, and a path for fluid flow from the inlet to the outlet; wherein, when the device is assembled together with a wall defining a chamber, a rotatable substrate support surface disposed within the chamber, and a laser device for producing a plurality of laser beams: the plurality of laser injectors are configured such that the outlet of each of the plurality of laser injectors directs one of the plurality of laser beams onto the rotatable substrate support surface disposed within the chamber; the outlets of the set of first conduits are configured to introduce a first precursor into the chamber toward the rotatable substrate support surface such that the first precursor flows through at least one of the plurality of laser beams within the chamber prior to reaching the rotatable substrate support surface; and the outlets of the set of second conduits are configured to introduce a second precursor into the chamber toward the rotatable substrate support surface. In some examples, the first precursor is a V-group precursor and the second precursor is a III-group precursor. In some examples, the devices further comprise a laser device for producing the plurality of laser beams. In some examples, each of the plurality of laser injectors includes one or more lenses for expanding each of the laser beams onto the rotatable substrate support surface.

In some examples, the outlets of the set of first conduits are configured to introduce the first precursor substantially parallel to a central axis of each of the plurality of laser beams within the chamber.

In some examples, the devices further comprise a source distributor, wherein the plurality of laser injectors, the set of first conduits, the set of second conduits, or a combination thereof are defined by the source distributor. In some examples, the set of second conduits are defined by the source distributor, and wherein the outlets of the set of second conduits are evenly spaced throughout at least a portion of the source distributor.

In some examples, the plurality of laser injectors are positioned in a line. In some examples, the outlet(s) of one or more first conduits is/are located directly adjacent the outlet of at least one of the plurality of laser injectors. In some examples, the outlets of three or more of the first conduits are located directly adjacent the outlet of at least one of the plurality of laser injectors and the outlets of the three or more first conduits are evenly spaced around the periphery of the outlet of the at least one of the plurality of laser injectors.

Also disclosed herein are laser-assisted metal-organic chemical vapor deposition (MOCVD) devices, the devices comprising: a plurality of laser injectors, wherein each of the plurality of laser injectors defines an inlet, an outlet opposite and spaced apart from the inlet, and an optical path extending from the inlet to the outlet; a source distributor defining a plurality of conduits, wherein each of the plurality of conduits defines an inlet, an outlet opposite and spaced apart from the inlet, and a path for fluid flow extending from the inlet to the outlet; wherein, when the device is assembled together with a wall defining a chamber, a rotatable substrate support disposed within the chamber, and a laser device for producing a plurality of laser beams: the plurality of laser injectors are configured such that the outlet of each of the plurality of laser injectors directs one of the plurality of laser beams onto the rotatable substrate support surface disposed within the chamber; the outlets of the plurality of conduits are configured to introduce a first precursor and a second precursor into the chamber toward the rotatable substrate support surface; wherein the plurality of laser injectors are defined by the source distributor; wherein the outlets of the plurality of laser injectors are all positioned in an ordered array within a quadrant of the source distributor; wherein the outlets of the plurality of conduits are evenly spaced throughout the source distributor; wherein the outlet of each of the plurality of laser injectors is located directly adjacent the outlet of at least one of the plurality of conduits; and wherein the outlets of the plurality of laser injectors are regularly interspersed between the outlets of the plurality of conduits within the quadrant. In some examples, the first precursor is a V-group precursor and the second precursor is a III-group precursor. In some examples, each of the plurality of laser injectors includes one or more lenses for expanding each of the laser beams onto the rotatable substrate support surface. In some examples, the devices further comprise a laser device for producing the plurality of laser beams.

In some examples, the plurality of conduits comprise a set of first conduits and a set of second conduits, the outlets of the set of first conduits being configured to introduce the first precursor into the chamber toward the rotatable substrate support surface, the outlets of the set of second conduits being configured to introduce the second precursor into the chamber toward the rotatable substrate support surface. In some examples, the outlets of the set of first conduits are all located within the same quadrant of the source distributor as the plurality of laser injectors.

In some examples, the outlets of the plurality of conduits are configured to introduce the first precursor and the second precursor substantially parallel to a central axis of each of the plurality of laser beams within the chamber.

Also disclosed herein are laser-assisted metal-organic chemical vapor deposition (MOCVD) devices, the devices comprising: a source distributor defining a plurality of conduits, wherein each of the plurality of conduits defines an inlet, an outlet opposite and spaced apart from the inlet, and a path for fluid flow extending from the inlet to the outlet; a first precursor conduit defining an inlet, an outlet opposite and spaced apart from the inlet, and a path for fluid flow extending from the inlet to the outlet; and a second precursor conduit defining an inlet, an outlet opposite and spaced apart from the inlet, and a path for fluid flow extending from the inlet to the outlet; wherein, when the device is assembled together with a wall defining a chamber, a rotatable substrate support surface disposed within the chamber, and a laser device for producing one or more laser beams: the outlet of the second precursor conduit is configured to introduce a second precursor into the plurality of conduits, the outlets of the plurality of conduits being configured to introduce the second precursor into the chamber toward the rotatable substrate support surface; the outlet of the first precursor conduit is configured to introduce an irradiated first precursor into the plurality of conduits, the outlets of the plurality of conduits being configured to introduce the irradiated first precursor into the chamber towards the rotatable substrate support surface disposed within the chamber; and the irradiated first precursor is formed by irradiating a first precursor with the one or more laser beams prior to introducing the irradiated first precursor into the plurality of conduits. In some examples, the first precursor is a V-group precursor and the second precursor is a III-group precursor. In some examples, the inlet of the first precursor conduit is configured to receive the irradiated first precursor from an irradiation chamber or wherein the first precursor is irradiated by the one or more laser beams within the first precursor conduit.

Also disclosed herein are methods of use of the devices described herein.

Additional advantages of the disclosed devices, systems, and methods will be set forth in part in the description which follows, and in part will be obvious from the description. The advantages of the disclosed devices, systems, and methods will be realized and attained by means of the elements and combinations particularly pointed out in the appended claims. It is to be understood that both the foregoing general description and the following detailed description are exemplary and explanatory only and are not restrictive of the disclosed systems and methods, as claimed.

The details of one or more embodiments of the invention are set forth in the accompanying drawings and the description below. Other features, objects, and advantages of the invention will be apparent from the description and drawings, and from the claims.

BRIEF DESCRIPTION OF THE FIGURES

The accompanying figures, which are incorporated in and constitute a part of this specification, illustrate several aspects of the disclosure, and together with the description, serve to explain the principles of the disclosure.

DETAILED DESCRIPTION

Figure 1:
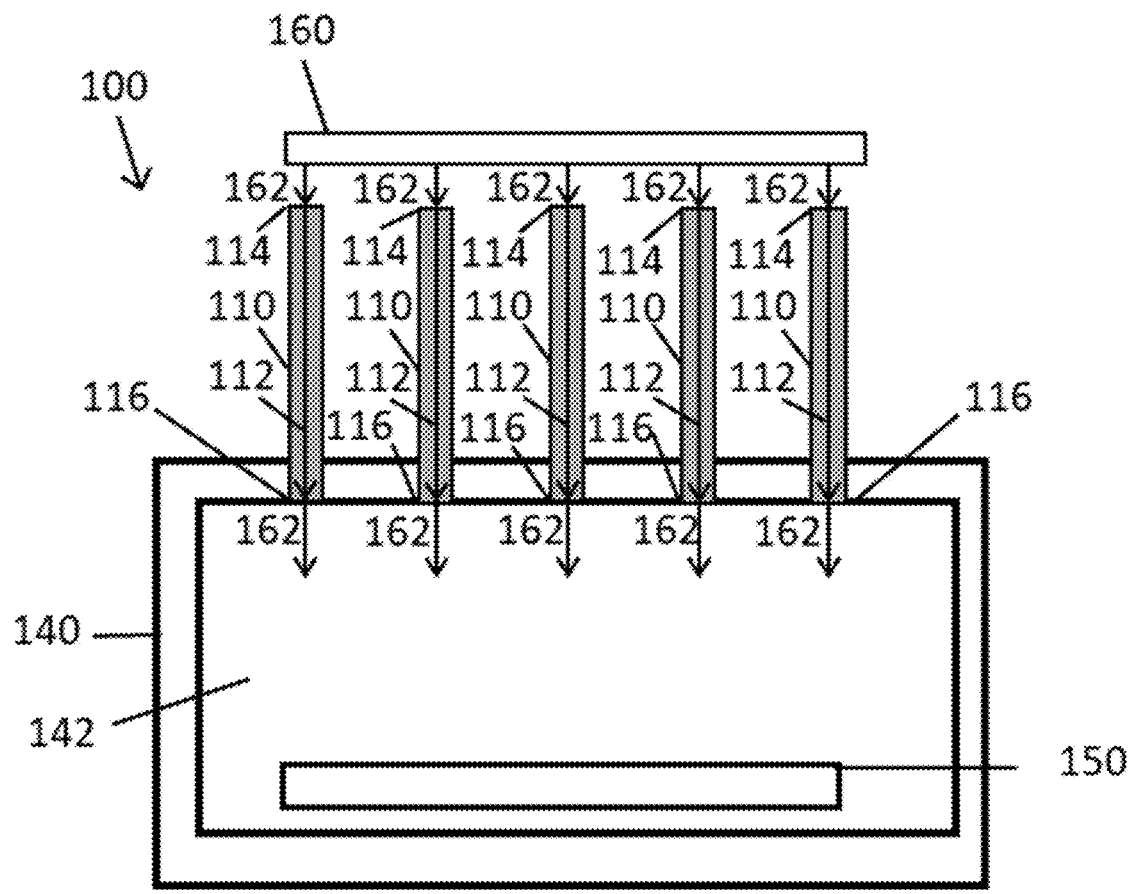
FIG. 1 is a cross-sectional plan view of a schematic of an example device as disclosed herein according to one implementation, where the set of first conduits and the set of second conduits (shown in FIG. 3) are omitted from this figure for clarity.

The devices, methods, and systems described herein may be understood more readily by reference to the following detailed description of specific aspects of the disclosed subject matter and the Examples included therein.

Before the present devices, methods, and systems are disclosed and described, it is to be understood that the aspects described below are not limited to specific synthetic methods or specific reagents, as such may, of course, vary. It is also to be understood that the terminology used herein is for the purpose of describing particular aspects only and is not intended to be limiting.

Also, throughout this specification, various publications are referenced. The disclosures of these publications in their entireties are hereby incorporated by reference into this application in order to more fully describe the state of the art to which the disclosed matter pertains. The references disclosed are also individually and specifically incorporated by reference herein for the material contained in them that is discussed in the sentence in which the reference is relied upon.

In this specification and in the claims that follow, reference will be made to a number of terms, which shall be defined to have the following meanings.

Throughout the description and claims of this specification the word "comprise" and other forms of the word, such as "comprising" and "comprises," means including but not limited to, and is not intended to exclude, for example, other additives, components, integers, or steps.

As used in the description and the appended claims, the singular forms "a," "an," and "the" include plural referents unless the context clearly dictates otherwise. Thus, for example, reference to "a composition" includes mixtures of two or more such compositions, reference to "an agent" includes mixtures of two or more such agents, reference to "the component" includes mixtures of two or more such components, and the like.

"Optional" or "optionally" means that the subsequently described event or circumstance can or cannot occur, and that the description includes instances where the event or circumstance occurs and instances where it does not.

Ranges can be expressed herein as from "about" one particular value, and/or to "about" another particular value. By "about" is meant within 5% of the value, e.g., within 4, 3, 2, or 1% of the value. When such a range is expressed, another aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

"Exemplary" means "an example of" and is not intended to convey an indication of a preferred or ideal embodiment. "Such as" is not used in a restrictive sense, but for explanatory purposes.

It is understood that throughout this specification the identifiers "first" and "second" are used solely to aid in distinguishing the various components and steps of the disclosed subject matter. The identifiers "first" and "second" are not intended to imply any particular order, amount, preference, or importance to the components or steps modified by these terms.

Figure 2:
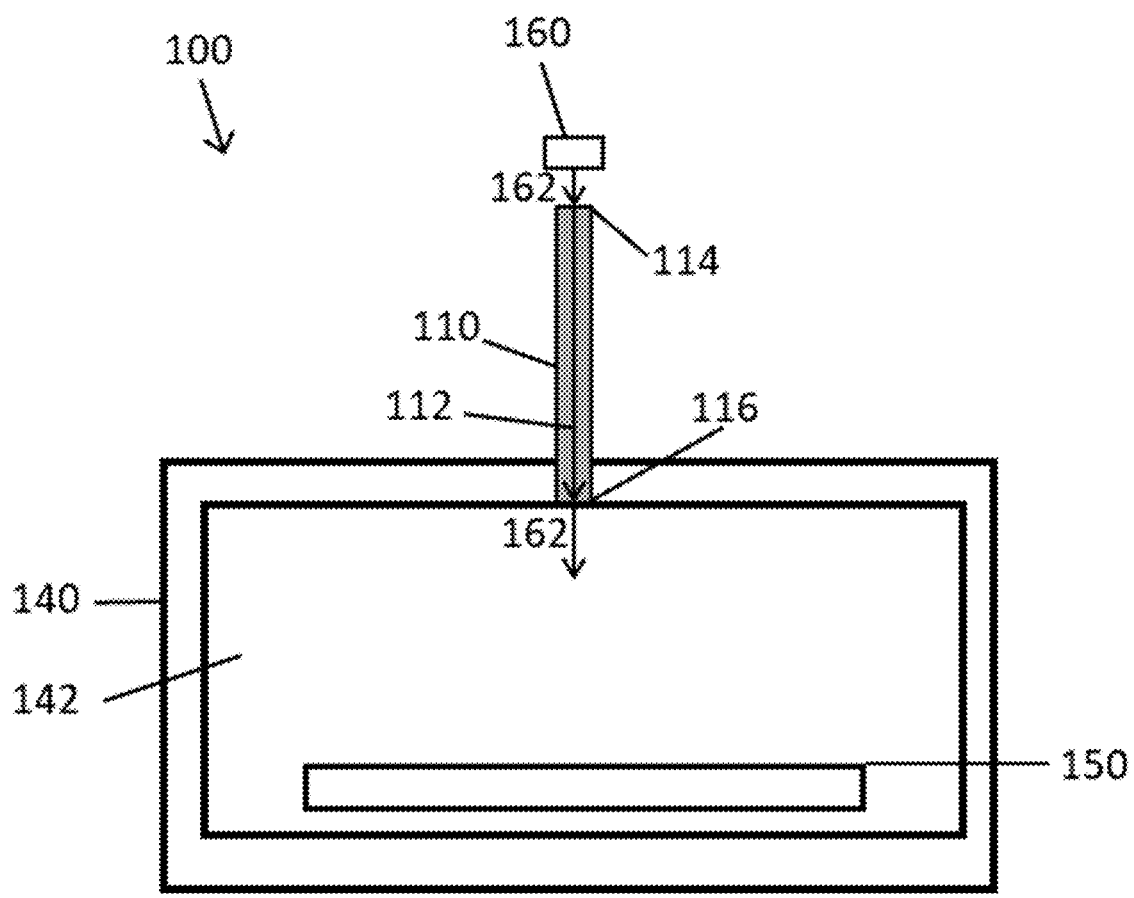
FIG. 2 is a schematic cross-sectional plan view, orthogonal to that of FIG. 1, of the example device shown in FIG. 1.
Figure 4:
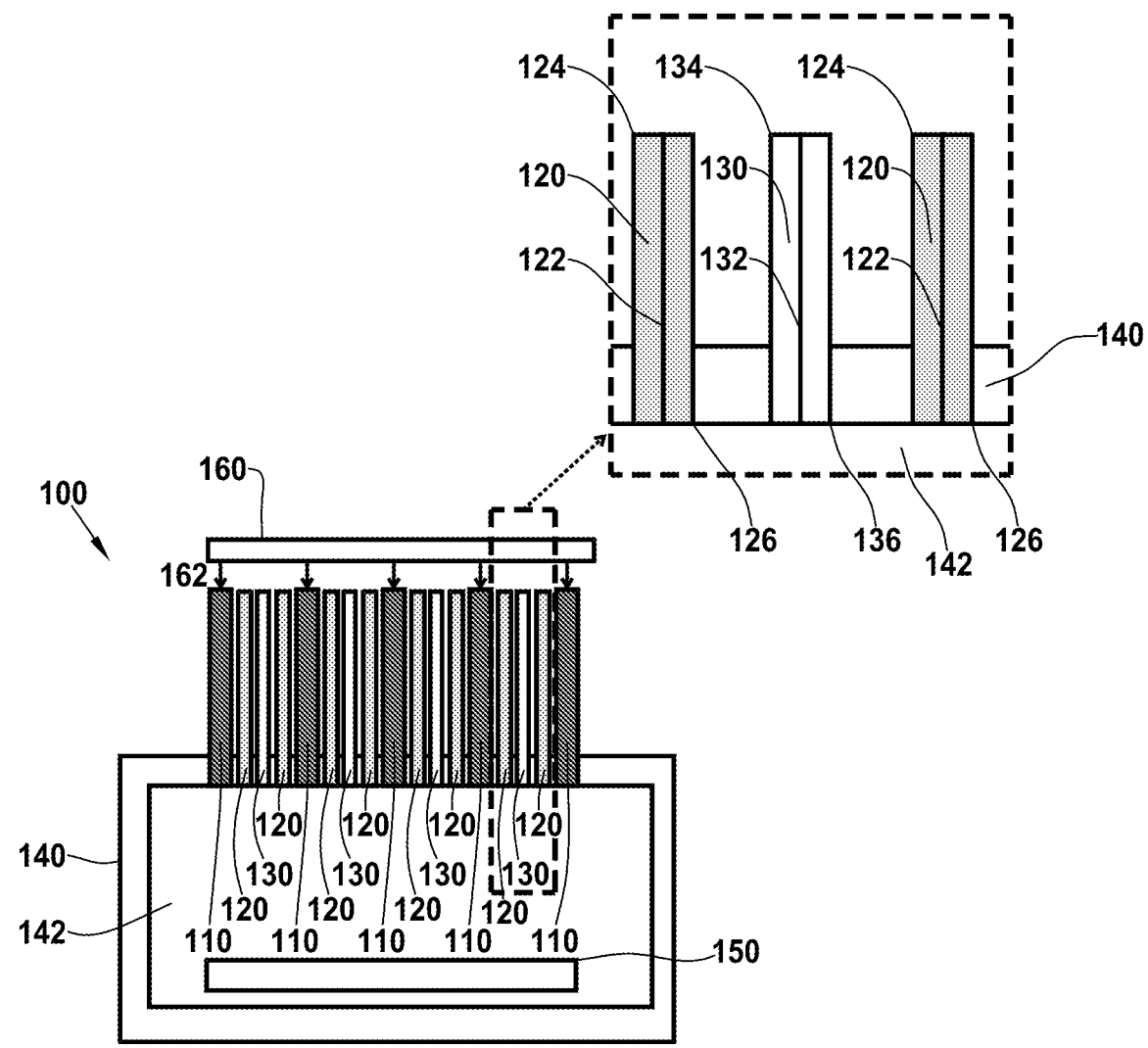
FIG. 4 is a schematic cross-sectional plan view (same view as in FIG. 1) of the example device shown in FIG. 1 with the set of first conduits and the set of second conduits also shown.
Figure 5:
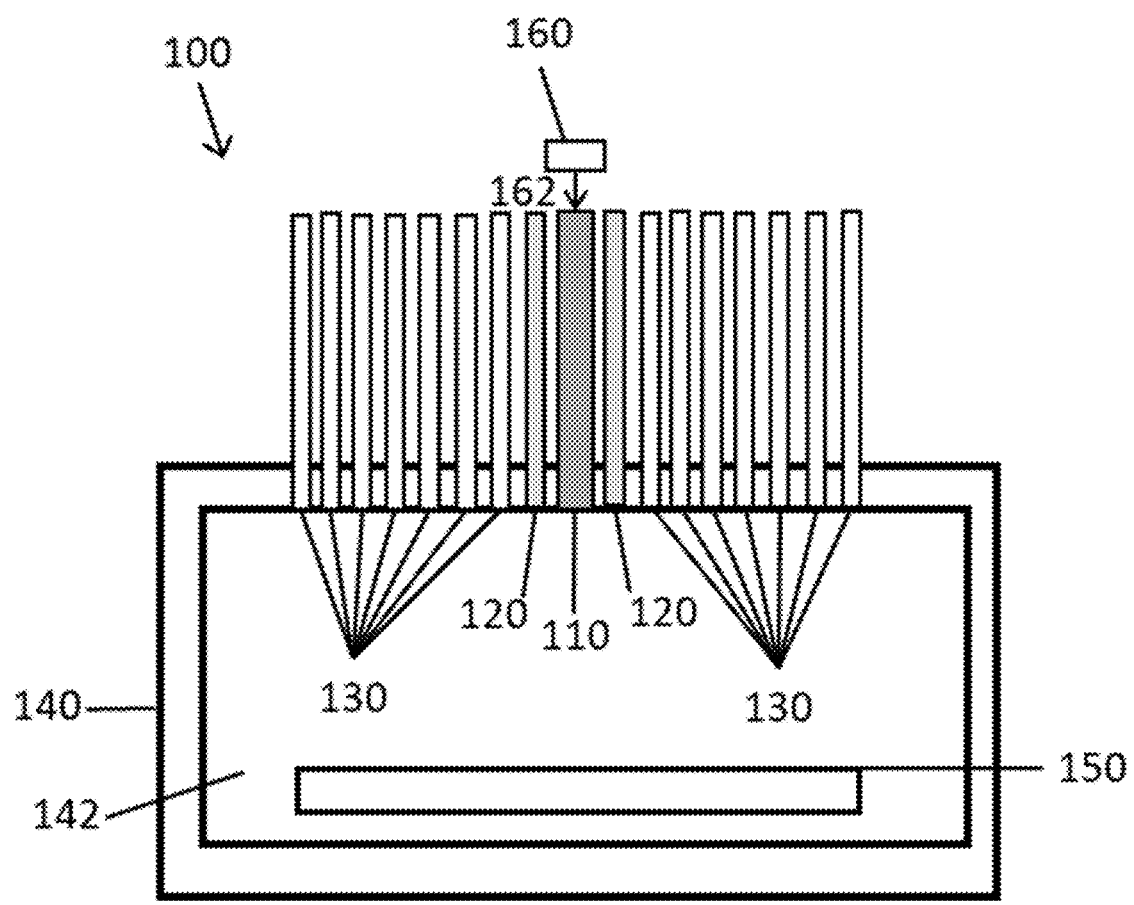
FIG. 5 is a schematic cross-sectional plan view, orthogonal to that of FIG. 4 (same view as in FIG. 2), of the example device shown in FIG. 4.

Disclosed herein are devices for laser-assisted metal-organic chemical vapor deposition devices. For example, FIG. 1 and FIG. 2 show two orthogonal views of a laser-assisted metal-organic chemical vapor deposition (MOCVD) device 100 according to one implementation, where certain elements have been omitted from FIG. 1 and FIG. 2 for clarity but are shown in FIG. 4 and FIG. 5 below. Referring to FIG. 1 and FIG. 2, the device 100 comprises: a plurality of laser injectors 110, wherein each of the plurality of laser injectors 110 defines an inlet 114, an outlet 116 opposite and spaced apart from the inlet 114, and an optical path 112 extending from the inlet 114 to the outlet 116; wherein, when the device 100 is assembled together with a wall 140 defining a chamber 142, a rotatable substrate support surface 150 disposed within the chamber 142, and a laser device 160 for producing a plurality of laser beams 162, the plurality of laser injectors 110 are configured such that the outlet 116 of each of the plurality of laser injectors 110 directs one of the plurality of laser beams 162 onto the rotatable substrate support surface 150 disposed within the chamber 142.

The plurality of laser injectors 110 can include two or more laser injectors 110 (e.g., 3 or more, 4 or more, 5 or more, 6 or more, 7 or more, 8 or more, 9 or more, 10 or more, 15 or more, 20 or more, 25 or more, 30 or more, 40 or more, 50 or more, 60 or more, 70 or more, 80 or more, 90 or more, 100 or more, 150 or more, 200 or more, 250 or more, 300 or more, 350 or more, 400 or more, 450 or more, 500 or more, 600 or more, 700 or more, 800 or more, 900 or more, or 1000 or more). The number of laser injectors 110 can be selected in view of the size of the chamber 142, the size of the rotatable substrate support surface 150, or a combination thereof.

The plurality of laser injectors 110 can be positioned in an ordered array. The ordered array can be designed, for example, in view of the number of laser injectors 110, the size of the chamber 142, the size of the rotatable substrate support surface 150, and the like, or a combination thereof. In some examples, the plurality of laser injectors 110 are positioned in a line. In some examples, the ordered array can be designed so as to provide a uniform distribution of lasers over the rotatable substrate support surface as the rotatable substrate support surface is rotated.

The cross-sectional shape of each of the plurality of laser injectors 110 in a plane perpendicular to the central longitudinal axis of said laser injector 110 can be any shape, such as a regular shape, an irregular shape, an isotropic shape, or an anisotropic shape. In some examples, the cross-sectional shape of the plurality of laser injectors 110 can be substantially circular, ovate, ovoid, elliptic, triangular, rectangular, polygonal, etc. In some examples, the cross-sectional shape of the plurality of laser injectors 110 can be substantially circular.

The outlets 116 of each of the plurality of laser injectors 110 can be any shape, such as a regular shape, an irregular shape, an isotropic shape, or an anisotropic shape. In some examples, the outlets 116 of the plurality of laser injectors 110 can have a shape that is substantially circular, ovate, ovoid, elliptic, triangular, rectangular, polygonal, etc. In some examples, the shape of the outlets 116 of the plurality of laser injectors 110 can be substantially circular. The outlets 116 of each of the plurality of laser injectors 110 can, for example, be the cross-section in a plane perpendicular to the longitudinal axis of said laser injector 110, such that the shape of the outlet 116 of each of the plurality of laser injectors 110 can be the cross-sectional shape of each of the plurality of laser injectors 110.

The plurality of laser injectors 110 can be configured such that each of the laser beams 162 has an average spot size on the rotatable substrate support surface 150. The term "average spot size," as used herein refers to the largest straight line distance between two points in the laser beam 162 in the plane of the rotatable substrate support surface 150. "Average spot size" and "mean spot size" are used interchangeably herein, and generally refer to the statistical mean spot size of the laser beams 162 on the rotatable substrate support surface 150 in a population of laser beams 162. For example, for a plurality of laser beams 162 with a substantially circular cross-section, the average spot size can refer to the diameter.

The plurality of laser injectors 110 can, for example, be configured such that the average spot size of the plurality of laser beams 162 on the rotatable substrate support surface 150 can be 1 millimeters (mm) or more (e.g., 5 mm or more, 10 mm or more, 15 mm or more, 20 mm or more, 25 mm or more, 30 mm or more, 35 mm or more, 40 mm or more, 45 mm or more, 50 mm or more, 60 mm or more, 70 mm or more, 80 mm or more, or 90 mm or more). In some examples, the plurality of laser injectors 110 can be configured such that the average spot size of the plurality of laser beams 162 on the rotatable substrate support surface 150 can be 100 mm or less (e.g., 90 mm or less, 80 mm or less, 70 mm or less, 60 mm or less, 50 mm or less, 45 mm or less, 40 mm or less, 35 mm or less, 30 mm or less, 25 mm or less, 20 mm or less, 15 mm or less, 10 mm or less, or 5 mm or less). The average spot size of the plurality of laser beams 162 on the rotatable substrate support surface 150 can range from any of the minimum values described above to any of the maximum values described above. For example, the plurality of laser injectors 110 can be configured such that the average spot size of the plurality of laser beams 162 on the rotatable substrate support surface 150 can be from 1 mm to 100 mm (e.g., from 1 mm to 50 mm, from 50 mm to 100 mm, from 1 mm to 20 mm, from 20 mm to 40 mm, from 40 mm to 60 mm, from 60 mm to 80 mm, from 80 mm to 100 mm, from 5 mm to 100 mm, from 1 mm to 90 mm, from 5 mm to 90 mm, from 1 mm to 80 mm, from 1 mm to 60 mm, or from 5 mm to 50 mm).

Each of the plurality of laser injectors 110 can, for example, include one or more lenses 118 for expanding each of the laser beams 162 onto the rotatable substrate support surface 150, e.g., such that each of the laser beams 162 has the average spot size on the rotatable substrate support surface 150. The one or more lenses 118 can be any type of lens, such as a simple lens, a compound lens, a spherical lens, a toric lens, a biconvex lens, a plano-convex lens, a plano-concave lens, a negative meniscus lens, a positive meniscus lens, a biconcave lens, a converging lens, a diverging lens, a cylindrical lens, a Fresnel lens, a lenticular lens, a gradient index lens, or a combination thereof. The one or more lenses 118 can be selected to control the spot size of each of the laser beams 162 on the rotatable substrate support surface 150, the uniformity of each of the laser beams 162 (e.g., with respect to intensity) on the rotatable substrate support surface 150, or a combination thereof.

Figure 3:
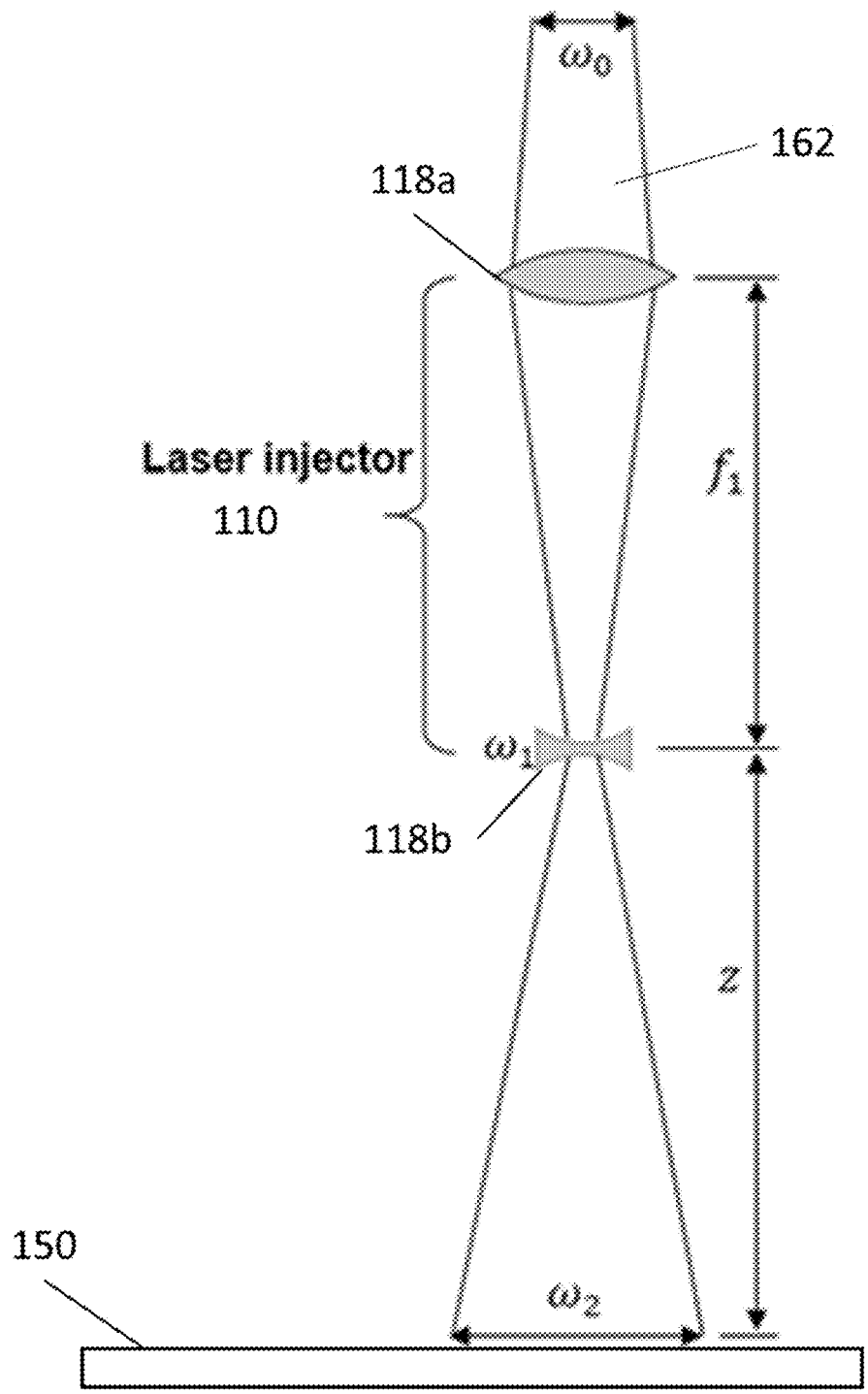
FIG. 3 is a schematic of the structure of a laser injector, which includes a convex lens and a concave lens.

For example, as shown in FIG. 3, each of the plurality of laser injectors 110 can include a convex lens 118a and a concave lens 118b for expanding each of the laser beams 162 onto the rotatable substrate support surface 150. The convex lens 118a can reduce the waist of the incident laser beam 162 from $\omega_0$ to $\omega_1$ and increase the divergence angle of the incident laser beam 162. The concave lens 118b can be located at the focal point of the convex lens 118a, $f_1$, to expand the laser beam 162 size to $\omega_2$ on the rotatable substrate support surface 150, e.g., the spot size. The concave lens 118b can also improve the uniformity of the laser beam 162 inside the Gaussian laser spot on the rotatable substrate support surface 150.

The number of laser injectors 110, the arrangement of the laser injectors 110, the cross-sectional shape of the laser injectors 110, the number and/or types of lenses in the laser injectors 110, the average spot size of the laser beams 162 on the rotatable substrate support surface 150, or a combination thereof can be selected, for example, in view of the wavelength(s) of the laser beams 162, the intensity of the laser beams 162 within the chamber 142, the size of the chamber 142, the size of the rotatable substrate support surface 150, or a combination thereof.

FIG. 4 and FIG. 5 show two orthogonal views of the device 100 shown in FIG. 1 and FIG. 2, where the certain elements omitted from FIG. 1 and FIG. 2 for clarity are shown in FIG. 4 and FIG. 5. FIG. 4 and FIG. 1 show the same view of the device 100, and FIG. 5 and FIG. 2 show the same view of the device 100. Referring now to FIG. 4 and FIG. 5, the devices 100 further comprise a set of first conduits 120, wherein each of the first conduits 120 defines an inlet 124, an outlet 126 opposite and spaced apart from the inlet 124, and a path for fluid flow 122 extending from the inlet 124 to the outlet 126; and a set of second conduits 130, wherein each of the second conduits 130 defines an inlet 134, an outlet 136 opposite and spaced apart from the inlet 134, and a path for fluid flow 132 extending from the inlet 134 to the outlet 136. When the device 100 is assembled together with a wall 140 defining a chamber 142, a rotatable substrate support surface 150 disposed within the chamber 142, and a laser device 160 for producing a plurality of laser beams 162, the outlets 126 of the set of first conduits 120 are configured to introduce a first precursor 170 into the chamber 142 toward the rotatable substrate support surface 150, and the outlets 136 of the set of second conduits 130 are configured to introduce a second precursor 180 into the chamber 142 toward the rotatable substrate support surface 150.

As used herein, "a set of first conduits 120" and "the set of first conduits 120" are meant to include any number of first conduits 120 in any arrangement. Thus, for example "a set of first conduits 120" includes one or more first conduits 120 (e.g., 2 or more, 3 or more, 4 or more, 5 or more, 6 or more, 7 or more, 8 or more, 9 or more, 10 or more, 15 or more, 20 or more, 25 or more, 30 or more, 40 or more, 50 or more, 60 or more, 70 or more, 80 or more, 90 or more, 100 or more, 150 or more, 200 or more, 250 or more, 300 or more, 350 or more, 400 or more, 450 or more, 500 or more, 600 or more, 700 or more, 800 or more, 900 or more, or 1000 or more). In some embodiments, the set of first conduits 120 can comprise a plurality of first conduits 120. In some embodiments, the set of first conduits 120 can comprise a plurality of first conduits 120 arranged in an ordered array.

The cross-sectional shape of each of first conduits 120 in a plane perpendicular to the central longitudinal axis of said first conduit 120 can be any shape, such as a regular shape, an irregular shape, an isotropic shape, or an anisotropic shape. In some examples, the cross-sectional shape of each of first conduits 120 in the set of first conduits 120 can be substantially circular, ovate, ovoid, elliptic, triangular, rectangular, polygonal, etc. In some examples, the cross-sectional shape of each of the first conduits 120 can be substantially circular.

The set of first conduits 120 can have an average characteristic dimension. The term "characteristic dimension," as used herein refers to the largest straight line distance between two points in the plane of the cross-sectional shape of each of the first conduits. "Average characteristic dimension" and "mean characteristic dimension" are used interchangeably herein, and generally refer to the statistical mean characteristic dimension of the conduits in a population of conduits. For example, for a cylindrical set of first conduits, the cross-sectional shape can be substantially circular and the average characteristic dimension can refer to the diameter.

The average characteristic dimension of the set of first conduits 120 can, for example, be 0.1 millimeter (mm) or more (e.g., 0.25 mm or more, 0.5 mm or more, 0.75 mm or more, 1 mm or more, 1.25 mm or more, 1.5 mm or more, 1.75 mm or more, 2 mm or more, 2.5 mm or more, 3 mm or more, 3.5 mm or more, 4 mm or more, or 4.5 mm or more). In some examples, the average characteristic dimension of the set of first conduits 120 can be 5 mm or less (e.g., 4.5 mm or less, 4 mm or less, 3.5 mm or less, 3 mm or less, 2.5 mm or less, 2 mm or less, 1.75 mm or less, 1.5 mm or less, 1.25 mm or less, 1 mm or less, 0.75 mm or less, 0.5 mm or less, or 0.25 mm or less). The average characteristic dimension of the set of first conduits 120 can range from any of the minimum values described above to any of the maximum values described above. For examples, the average characteristic dimension of the set of first conduits 120 can be from 0.1 mm to 5 mm (e.g., from 0.1 mm to 2.5 mm, from 2.5 mm to 5 mm, from 0.1 mm to 1 mm, from 1 mm to 2 mm, from 2 mm to 3 mm, from 3 mm to 4 mm, from 4 mm to 5 mm, from 0.5 mm to 5 mm, from 0.1 mm to 4.5 mm, from 0.5 mm to 4.5 mm, from 0.1 mm to 4 mm, from 0.1 mm to 3 mm, or from 0.5 mm to 2 mm).

The outlets 126 of each of the first conduits 120 can be any shape, such as a regular shape, an irregular shape, an isotropic shape, or an anisotropic shape. In some examples, the outlets 126 of the set of first conduits 120 can have a shape that is substantially circular, ovate, ovoid, elliptic, triangular, rectangular, polygonal, etc. In some examples, the shape of the outlets 126 of the set of first conduits 120 can be substantially circular. The outlet 126 of each of the set of first conduits 120 can, for example, be the cross-section in a plane perpendicular to the central longitudinal axis of said first conduit 120, such that the shape of the outlet 126 of each of the set of first conduits 120 can be the cross-sectional shape of each of the first conduits 120.

The outlets 126 of the set of first conduits 120 can have an average characteristic dimension. The term "characteristic dimension," as used herein refers to the largest straight line distance between two points in the plane of the outlet. "Average characteristic dimension" and "mean characteristic dimension" are used interchangeably herein, and generally refer to the statistical mean characteristic dimension of the outlets in a population of outlets. For example, for a cylindrical set of first conduits 120, the outlets 126 can be substantially circular in shape and the average characteristic dimension can refer to the diameter.

The average characteristic dimension of the outlets 126 of the set of first conduits 120 can, for example, be 0.1 millimeter (mm) or more (e.g., 0.25 mm or more, 0.5 mm or more, 0.75 mm or more, 1 mm or more, 1.25 mm or more, 1.5 mm or more, 1.75 mm or more, 2 mm or more, 2.5 mm or more, 3 mm or more, 3.5 mm or more, 4 mm or more, or 4.5 mm or more). In some examples, the average characteristic dimension of the outlets 126 of the set of first conduits 120 can be 5 mm or less (e.g., 4.5 mm or less, 4 mm or less, 3.5 mm or less, 3 mm or less, 2.5 mm or less, 2 mm or less, 1.75 mm or less, 1.5 mm or less, 1.25 mm or less, 1 mm or less, 0.75 mm or less, 0.5 mm or less, or 0.25 mm or less). The average characteristic dimension of the outlets 126 of the set of first conduits 120 can range from any of the minimum values described above to any of the maximum values described above. For examples, the average characteristic dimension of the outlets 126 of the set of first conduits 120 can be from 0.1 mm to 5 mm (e.g., from 0.1 mm to 2.5 mm, from 2.5 mm to 5 mm, from 0.1 mm to 1 mm, from 1 mm to 2 mm, from 2 mm to 3 mm, from 3 mm to 4 mm, from 4 mm to 5 mm, from 0.5 mm to 5 mm, from 0.1 mm to 4.5 mm, from 0.5 mm to 4.5 mm, from 0.1 mm to 4 mm, from 0.1 mm to 3 mm, or from 0.5 mm to 2 mm).

In some examples, the each of the outlets 126 of the set of first conduits 120 can further comprise a nozzle (not shown) fluidly connected to each of the outlets 126 of the set of first conduits 120. Each nozzle can, for example, have an average characteristic dimension and a cross-sectional shape, wherein the average characteristic dimension of the nozzles, the cross-sectional shape of the nozzles, or a combination thereof can be the same or different than that of the outlets 126 of the set of first conduits 120. In some examples, the average characteristic dimension of the nozzles can be smaller than the average characteristic dimension of the outlets 126 of the set of first conduits 120. In some examples, the cross-sectional shape of the nozzles can be substantially circular. The average characteristic dimension of the nozzles, the cross-sectional shape of the nozzles, the orientation of the nozzles, or a combination thereof can be used to affect and/or control how the first precursor 170 is introduced into the chamber 142 (e.g., speed, direction, volume, etc.).

The number of first conduits 120, the arrangement of the first conduits 120, the cross-sectional shape of the first conduits 120, the shape of the outlets 126 of the first conduits 120, the average characteristic dimension of the outlets 126 of the first conduits 120, the presence or absence of the nozzles fluidly connected to each of the outlets 126 of the set of first conduits 120, the average characteristic dimension of the nozzles fluidly connected to each of the outlets 126 of the set of first conduits 120, the cross-sectional shape of the nozzles fluidly connected to each of the outlets 126 of the set of first conduits 120, or a combination thereof can be selected, for example, in view of the number of laser injectors 110, the location of the laser injectors 110, the size of the laser beams 162, the wavelength(s) of the laser beams 162, the intensity of the laser beams 162 within the chamber 142, the size of the chamber 142, the size of the rotatable substrate support surface 150, the number of second conduits 130, the location of the second conduits 130, the average characteristic dimension of the outlets 136 of the second conduits 130, the shape of the outlets 136 of the second conduits 130, the presence or absence of the nozzles fluidly connected to each of the outlets 136 of the set of second conduits 130, the average characteristic dimension of the nozzles fluidly connected to each of the outlets 136 of the set of second conduits 130, the cross-sectional shape of the nozzles fluidly connected to each of the outlets 136 of the set of second conduits 130, or a combination thereof.

As used herein, "a set of second conduits 130" and "the set of second conduits 130" are meant to include any number of second conduits 130 in any arrangement. Thus, for example "a set of second conduits 130" includes one or more second conduits 130 (e.g., 2 or more, 3 or more, 4 or more, 5 or more, 6 or more, 7 or more, 8 or more, 9 or more, 10 or more, 15 or more, 20 or more, 25 or more, 30 or more, 40 or more, 50 or more, 60 or more, 70 or more, 80 or more, 90 or more, 100 or more, 150 or more, 200 or more, 250 or more, 300 or more, 350 or more, 400 or more, 450 or more, 500 or more, 600 or more, 700 or more, 800 or more, 900 or more, or 1000 or more). In some embodiments, the set of second conduits 130 can comprise a plurality of second conduits 130. In some embodiments, the set of second conduits 130 can comprise a plurality of second conduits 130 arranged in an ordered array.

The cross-sectional shape of each of second conduits 130 in a plane perpendicular to the central longitudinal axis of said second conduit 130 can be any shape, such as a regular shape, an irregular shape, an isotropic shape, or an anisotropic shape. In some examples, the cross-sectional shape of each of the second conduits 130 in the set of second conduits 130 can be substantially circular, ovate, ovoid, elliptic, triangular, rectangular, polygonal, etc. In some examples, the cross-sectional shape of each of the second conduits 130 can be substantially circular. In some examples, the cross-sectional shape of each of the second conduits 130 can be the same as the cross-sectional shape of the set of first conduits 120.

The set of second conduits 130 can have an average characteristic dimension. The average characteristic dimension of the set of second conduits 130 can, for example, be 0.1 millimeter (mm) or more (e.g., 0.25 mm or more, 0.5 mm or more, 0.75 mm or more, 1 mm or more, 1.25 mm or more, 1.5 mm or more, 1.75 mm or more, 2 mm or more, 2.5 mm or more, 3 mm or more, 3.5 mm or more, 4 mm or more, or 4.5 mm or more). In some examples, the average characteristic dimension of the set of second conduits 130 can be 5 mm or less (e.g., 4.5 mm or less, 4 mm or less, 3.5 mm or less, 3 mm or less, 2.5 mm or less, 2 mm or less, 1.75 mm or less, 1.5 mm or less, 1.25 mm or less, 1 mm or less, 0.75 mm or less, 0.5 mm or less, or 0.25 mm or less). The average characteristic dimension of the set of second conduits 130 can range from any of the minimum values described above to any of the maximum values described above. For examples, the average characteristic dimension of the set of second conduits 130 can be from 0.1 mm to 5 mm (e.g., from 0.1 mm to 2.5 mm, from 2.5 mm to 5 mm, from 0.1 mm to 1 mm, from 1 mm to 2 mm, from 2 mm to 3 mm, from 3 mm to 4 mm, from 4 mm to 5 mm, from 0.5 mm to 5 mm, from 0.1 mm to 4.5 mm, from 0.5 mm to 4.5 mm, from 0.1 mm to 4 mm, from 0.1 mm to 3 mm, or from 0.5 mm to 2 mm). In some examples, the average characteristic dimension of the set of second conduits 130 can be the same as the average characteristic dimension of the set of first conduits 120.

The outlets 136 of each of the second conduits 130 can be any shape, such as a regular shape, an irregular shape, an isotropic shape, or an anisotropic shape. In some examples, the outlets 136 of the set of second conduits 130 can have a shape that is substantially circular, ovate, ovoid, elliptic, triangular, rectangular, polygonal, etc. In some examples, the shape of the outlets 136 of the set of second conduits 130 can be substantially circular. The outlet 136 of each of the set of second conduits 130 can, for example, be the cross-section in a plane perpendicular to the central longitudinal axis of said second conduit 130, such that the shape of the outlet 136 of each of the set of second conduits 130 can be the cross-sectional shape of each of the second conduits 130. In some examples, the shape of the outlets 136 of the set of second conduits 130 can be the same as the shape of the outlets 126 of the set of first conduits 120.

The outlets 136 of the set of second conduits 130 can have an average characteristic dimension. The average characteristic dimension of the outlets 136 of the set of second conduits 130 can, for example, be 0.1 millimeter (mm) or more (e.g., 0.25 mm or more, 0.5 mm or more, 0.75 mm or more, 1 mm or more, 1.25 mm or more, 1.5 mm or more, 1.75 mm or more, 2 mm or more, 2.5 mm or more, 3 mm or more, 3.5 mm or more, 4 mm or more, or 4.5 mm or more). In some examples, the average characteristic dimension of the outlets 136 of the set of second conduits 130 can be 5 mm or less (e.g., 4.5 mm or less, 4 mm or less, 3.5 mm or less, 3 mm or less, 2.5 mm or less, 2 mm or less, 1.75 mm or less, 1.5 mm or less, 1.25 mm or less, 1 mm or less, 0.75 mm or less, 0.5 mm or less, or 0.25 mm or less). The average characteristic dimension of the outlets 136 of the set of second conduits 130 can range from any of the minimum values described above to any of the maximum values described above. For examples, the average characteristic dimension of the outlets 136 of the set of second conduits 130 can be from 0.1 mm to 5 mm (e.g., from 0.1 mm to 2.5 mm, from 2.5 mm to 5 mm, from 0.1 mm to 1 mm, from 1 mm to 2 mm, from 2 mm to 3 mm, from 3 mm to 4 mm, from 4 mm to 5 mm, from 0.5 mm to 5 mm, from 0.1 mm to 4.5 mm, from 0.5 mm to 4.5 mm, from 0.1 mm to 4 mm, from 0.1 mm to 3 mm, or from 0.5 mm to 2 mm). In some examples, the average characteristic dimension of the outlets 136 of the set of second conduits 130 can be the same as the average characteristic dimension of the outlets 126 of the set of first conduits 120.

In some examples, the each of the outlets 136 of the set of second conduits 130 can further comprise a nozzle (not shown) fluidly connected to each of outlets 136 of the set of second conduits 130. Each nozzle can, for example, have an average characteristic dimension and a cross-sectional shape, wherein the average characteristic dimension of the nozzles, the cross-sectional shape of the nozzles, or a combination thereof can be the same or different than that of the outlets 136 of the set of second conduits 130. In some examples, the average characteristic dimension of the nozzles can be smaller than the average characteristic dimension of the outlets 136 of the set of second conduits 130. In some examples, the cross-sectional shape of the nozzles can be substantially circular. The average characteristic dimension of the nozzles, the cross-sectional shape of the nozzles, the orientation of the nozzles, or a combination thereof can be used to affect and/or control how the second precursor 180 is introduced into the chamber 142 (e.g., speed, direction, volume, etc.).

The number of second conduits 130, the arrangement of the second conduits 130, the cross-sectional shape of the second conduits 130, the shape of the outlets 136 of the second conduits 130, the average characteristic dimension of the outlets 136 of the second conduits 130, the presence or absence of the nozzles fluidly connected to each of the outlets 136 of the set of second conduits 130, the average characteristic dimension of the nozzles fluidly connected to each of the outlets 136 of the set of second conduits 130, the cross-sectional shape of the nozzles fluidly connected to each of the outlets 136 of the set of second conduits 130, or a combination thereof can be selected, for example, in view of the number of laser injectors 110, the location of the laser injectors 110, the size of the laser beams 162, the wavelength(s) of the laser beams 162, the intensity of the laser beams 162 within the chamber 142, the size of the chamber 142, the size of the rotatable substrate support surface 150, the number of first conduits 120, the location of the first conduits 120, the average characteristic dimension of the outlets 126 of the first conduits 120, the shape of the outlets 126 of the first conduits 120, the presence or absence of the nozzles fluidly connected to each of the outlets 126 of the set of first conduits 120, the average characteristic dimension of the nozzles fluidly connected to each of the outlets 126 of the set of first conduits 120, the cross-sectional shape of the nozzles fluidly connected to each of the outlets 126 of the set of first conduits 120, or a combination thereof.

In some examples, the outlet(s) 126 of one or more first conduits 120 is/are located adjacent the outlet 116 of at least one of the plurality of laser injectors 110. In some examples, the outlet(s) 126 of one or more first conduits 120 is/are located directly adjacent the outlet 116 of at least one of the plurality of laser injectors 110. In some examples, the outlets 126 of three or more (e.g., 4 or more, 5 or more, 6 or more, etc.) of the first conduits 120 are located directly adjacent the outlet 116 of at least one of the plurality of laser injectors 110 and the outlets 126 of the three or more first conduits 120 are evenly spaced around the periphery of the outlet 116 of the at least one of the plurality of laser injectors 110, such that the outlet 116 of the at least one laser injector 110 is surrounded by the evenly spaced outlets 126 of the three or more first conduits 120. In some examples, the outlets 126 of four of the first conduits 120 are located directly adjacent the outlet 116 of each of the plurality of laser injectors 110 and the outlets 126 of the four first conduits 120 are evenly spaced around the periphery of each of the outlets 116 of the plurality of laser injectors 110. In some examples, the outlets 136 of the set of second conduits 130 are located in an ordered array, evenly spaced about the outlets 116 of the plurality of laser injectors 110 and/or the outlets 126 of the set of first conduits 120.

Figure 6:
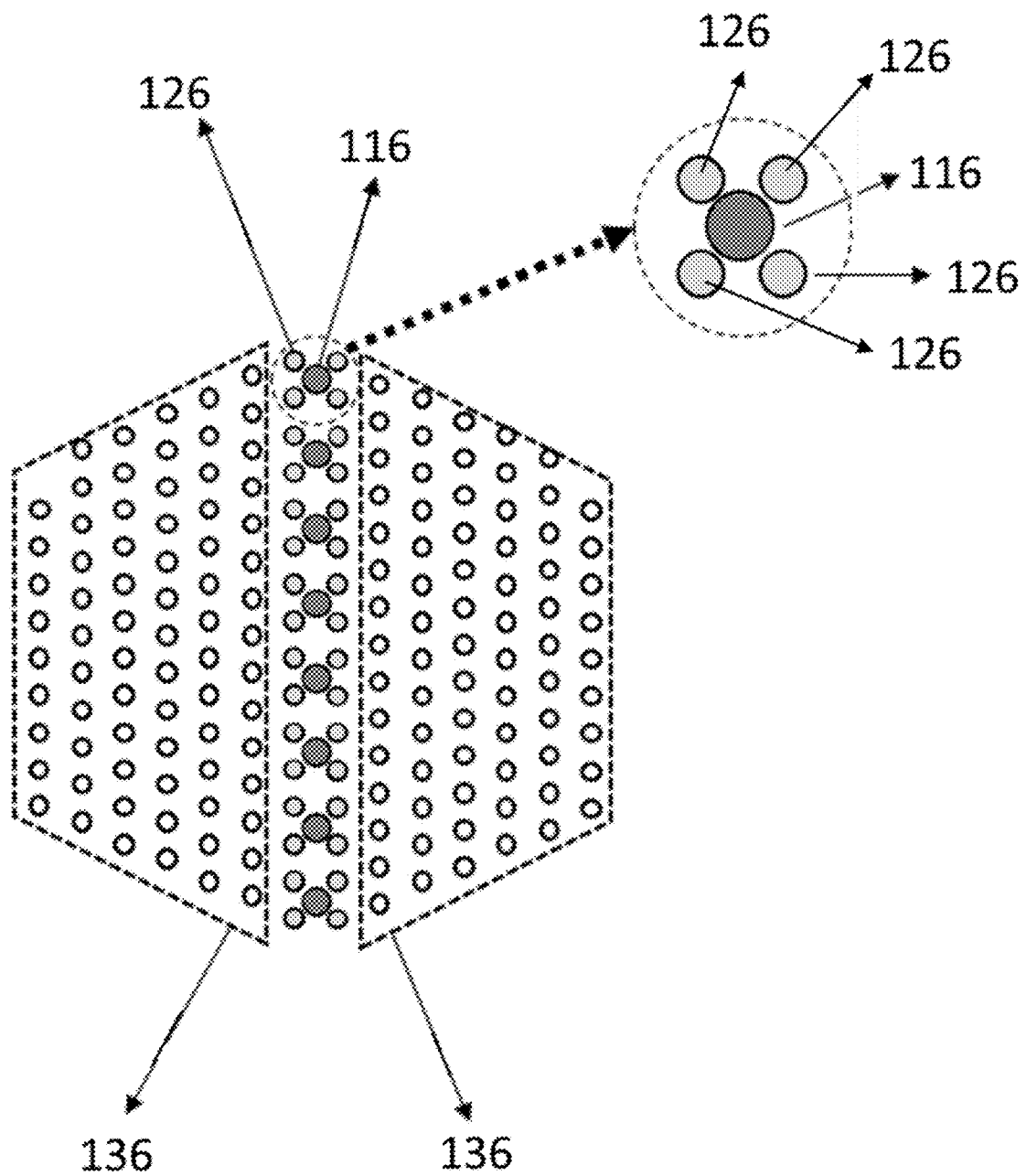
FIG. 6 is a schematic cross-sectional plan view (e.g., bottom up) of the arrangement of the outlets of the set of first conduits, the outlets of the set of second conduits, and the outlets of the plurality of laser injectors in one implementation of the example device shown in FIG. 4 and FIG. 5.

FIG. 6 is a schematic cross-sectional plan view of the example device 100 shown in FIG. 4 and FIG. 5 (e.g., bottom up) showing the arrangement of the outlets 126 of the set of first conduits 120, the outlets 136 of the set of second conduits 130, and the outlets 116 of the plurality of laser injectors 110 in one implementation of the device 100. Referring now to FIG. 6, in some examples, the outlets 116 of the plurality of laser injectors 110 are positioned in a line across the width (e.g., diameter) of the chamber 142, the outlets 126 of four of the first conduits 120 are located directly adjacent the outlet 116 of each of the plurality of laser injectors 110, the outlets 126 of the four first conduits 120 are evenly spaced around the periphery of each of the outlets 116 of the plurality of laser injectors 110, and the outlets 136 of the second conduits 130 are located in an ordered array evenly spaced on either side of the outlets 126 of the set of first conduits 120 and the outlets 116 of the plurality of laser injectors 110.

Figure 7:
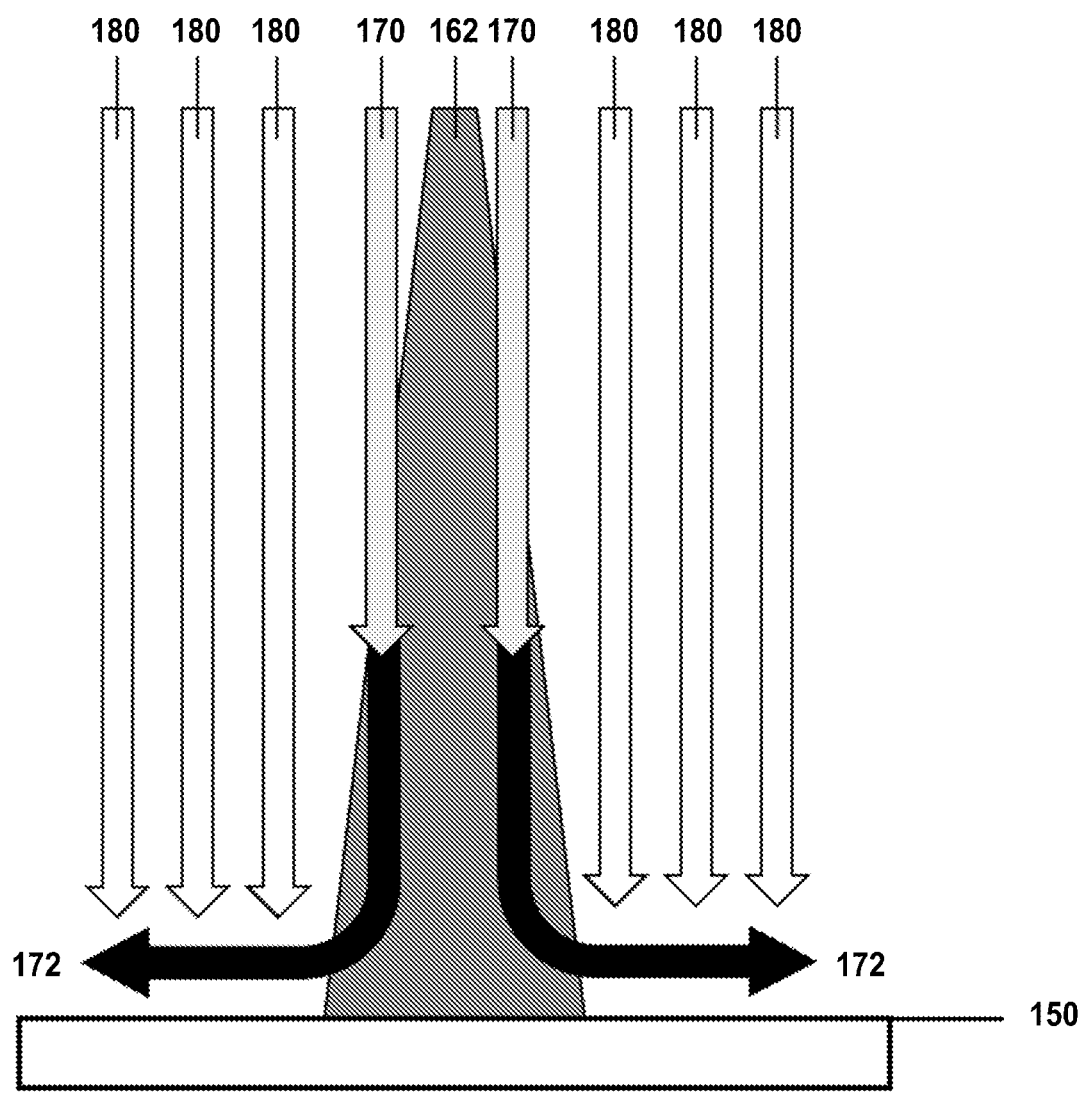
FIG. 7 is a schematic view of the precursor flow pattern and laser beam path in an example device disclosed herein, such as the example device shown in FIG. 4-FIG. 6.

FIG. 7 is a schematic view of the flow pattern of the first precursor 170, the second precursor, 180 and laser beam 162 path in one implementation of a device 100, such as in one implementation of the example device 100 shown in FIG.

4-FIG. 6. Referring now to FIG. 7, the outlets 126 of the set of first conduits 120 are configured to introduce a first precursor 170 into the chamber 142 toward the rotatable substrate support surface 150 such that the first precursor 170 flows through at least one of the plurality of laser beams 162 within the chamber 142, thereby producing an irradiated first precursor 172 in situ within the chamber 142, prior to reaching the rotatable substrate support surface 150. The outlets 136 of the set of second conduits 130 are configured to introduce a second precursor 180 into the chamber 142 toward the rotatable substrate support surface 150. In some examples, the outlets 126 of the set of first conduits 120 are configured to introduce the first precursor 170 substantially parallel to a central axis of each of the plurality of laser beams 162 within the chamber 142.

Each of the plurality of laser beams 162 comprises electromagnetic radiation with at least one wavelength that overlaps with at least a portion of a vibrational mode of the first precursor 170, thereby generating an active species (e.g., the irradiated first precursor 172) in situ. In some examples, the wavelength of the laser beams 162 are selected in view of the identity of the first precursor 170, such that each of the plurality of laser beams 162 comprises electromagnetic radiation with at least one wavelength that overlaps with at least a portion of a vibrational mode of the first precursor 170, such that irradiation of the first precursor 170 with the laser beam(s) 162 can enhance the cracking efficiency of the first precursor 170.

In some examples, the device 100 is configured to deposit a III-V semiconductor, such that the first precursor 170 comprises a V-group precursor and the second precursor 180 comprises a III-group precursor The first precursor 170 can, for example, comprise a V-group precursor, such as a compound, element, or composition comprising N, P, As, Sb, Bi, or a combination thereof. In some examples, the first precursor 170 can comprise a nitrogen species. In some examples, the first precursor 170 can comprise $NH_3$. The first precursor 170 can, for example, comprise a fluid, such as a gas. In some examples, the devices 100 can further comprise a first precursor source (not shown) fluidly coupled to the chamber 142 via the set of first conduits 120.

The second precursor 180 can, for example, comprise a III-group precursor, such as compound, element, or composition comprising B, Al, Ga, In, Tl, or a combination thereof. In some examples, the second precursor 180 can comprise a gallium species. In some examples, the second precursor 180 can comprise trimethylgallium, triethylgallium, or a combination thereof. The second precursor 180 can, for example, comprise a fluid, such as a gas. In some examples, the devices 100 can further comprise a second precursor source (not shown) fluidly coupled to the chamber 142 via the set of second conduits 130.

In some examples, the device 100 is configured to deposit a group III oxide semiconductor, such that the first precursor 170 comprises an oxygen containing precursor and the second precursor 180 comprises a III-group precursor.

In some examples, the device 100 is configured to deposit a group II-VI semiconductor material, such that the first precursor 170 comprises a VI-group precursor (e.g., a compound/composition/element comprising O, S, Se, Te, or a combination thereof) and the second precursor 180 comprises a II-group precursor (e.g., a compound/composition/element comprising Be, Mg, Ca, Sr, Ba, Zn, Cd, Hg, or a combination thereof).

In some examples, the device 100 is configured to deposit a group $II-IV-V_2$ semiconductor, such that the first precursor 170 comprises a V-group precursor (e.g., a compound, element, or composition comprising N, P, As, Sb, Bi, or a combination thereof) and the second precursor 180 comprises a mixture of a II-group precursor (e.g., a compound/composition/element comprising Be, Mg, Ca, Sr, Ba, Zn, Cd, Hg, or a combination thereof) and a IV-group precursor (e.g., a compound/composition/element comprising C, Si, Ge, Sn, Pb, or a combination thereof).

In some examples, the device 100 is configured to introduce the first precursor 170 into the chamber 142 continuously or intermittently. In some examples, the device 100 is configured to introduce the second precursor 180 continuously or intermittently.

In some examples, the device 100 is configured to introduce the first precursor 170 and the second precursor 180 into the chamber 142 alternately. In some examples, the device 100 is configured to introduce the first precursor 170 and the second precursor 180, wherein at least a portion of the introduction of the second precursor 180 is concurrent with at least a portion of the introduction of the first precursor 170, or vice versa. In some examples, the device 100 is configured to introduce the first precursor 170 and the second precursor 180 to the chamber simultaneously.

In some examples, the outlets 126 of the set of first conduits 120, the outlets 136 of the set of second conduits 130, or a combination thereof are further configured to introduce a dopant (e.g., one or more dopants) into the chamber 142 toward the rotatable substrate support surface 150. The one or more dopants can be selected in view of the first precursor 170 and/or the second precursor 180. The one or more dopants can be, for example, a fluid, such as a gas. In some examples, the one or more dopants can comprise an n-type dopant (e.g., silane ($SiH_4$), germane ($GeH_4$), disilane ($Si_2H_6$)), a p-type dopant (e.g., bis(cyclopentadienyl)magnesium ($Cp_2Mg$), bis(methylcyclopentadienyl)magnesium ($(MeCp)_2Mg$)), or a combination thereof. In some examples, the one or more dopants can comprise silane ($SiH_4$), germane ($GeH_4$), disilane($Si_2H_6$), bis(cyclopentadienyl)magnesium ($Cp_2Mg$), bis(methylcyclopentadienyl)magnesium ($(MeCp)_2Mg$), or a combination thereof. The one or more dopants can, for example, be mixed with the first precursor 170 and/or the second precursor 180 prior to introduction into the chamber 142. In some examples, the device 100 is configured to introduce the first precursor 170, the second precursor 180, and the one or more dopants into the chamber 142 consecutively in turn. In some examples, the device 100 is configured to introduce the first precursor 170 and the one or more dopants, wherein at least a portion of the introduction of the one or more dopants is concurrent with at least a portion of the introduction of the first precursor 170, or vice versa. In some examples, the device 100 is configured to introduce the second precursor 180 and the one or more dopants, wherein at least a portion of the introduction of the one or more dopants is concurrent with at least a portion of the introduction of the second precursor 180, or vice versa. In some examples, the device is configured to introduce the first precursor 170, the second precursor 180, and the one or more dopants into the chamber 142 simultaneously.

In some examples, the outlets 126 of the set of first conduits 120, the outlets 136 of the set of second conduits 130, or a combination thereof are further configured to introduce a carrier gas (e.g., one or more carrier gases) into the chamber 142 toward the rotatable substrate support surface 150. The one or more carrier gases can be selected in view of the first precursor 170, the second precursor 180, the one or more dopants when present, or a combination thereof. The one or more carrier gases can be, for example, argon, helium, $H_2$, $N_2$, and the like, or combinations thereof. The one or more carrier gases can, for example, be mixed with the first precursor 170, the second precursor 180, the one or more dopants when present, or a combination thereof prior to introduction into the chamber 142. In some examples, the device 100 is configured to introduce the first precursor 170, the second precursor 180, the one or more dopants when present, or a combination thereof concurrently with at least a portion of the introduction of the one or more carrier gases.

The devices 100 described herein can further comprise or be assembled with a variety of additional components. For example, the devices 100 can be assembled together with, or in some examples can further comprise, the wall 140 defining the chamber 142. The wall 140 can, in some examples be hollow such that a cooling medium can be included within the wall 140, for example to dissipate heat (e.g., from the heater, from the laser energy, or a combination thereof). In some examples, the cooling medium can comprise water.

The devices 100 can, for example, be assembled together with, or in some examples can further comprise, the rotatable substrate support surface 150. The size and shape of the rotatable substrate support surface 150 can be selected in view of the size and shape of the chamber 142. The rotatable substrate support surface 150 can support one or more substrates (not shown) (e.g., 2 or more, 3 or more, 4 or more, 5 or more, 6 or more, 7 or more, 8 or more, 9 or more, 10 or more, 15 or more, 20 or more, 25 or more, 30 or more, 35 or more, 40 or more, 45 or more, 50 or more, 60 or more, 70 or more, 80 or more, 90 or more, 100 or more, 150 or more, 200 or more, 250 or more, 300 or more, 350 or more, 400 or more, 450 or more, 500 or more, 600 or more, 700 or more, 800 or more, 900 or more, 1000 or more, 1500 or more, or 2000 or more) to be coated with a material via laser-assisted metal-organic vapor deposition from the first precursor 170 and the second precursor 180 (and one or more dopants, if present) within the chamber 142. The number of substrates disposed on the rotatable substrate support surface 150 can be selected, for example, in view of the size of the one or more substrates and/or the size of the rotatable substrate support surface 150. The devices 100 can, for example, be configured to rotate the rotatable substrate support 150 surface to thereby provide a more uniform coating of the material on the one or more substrates via laser-assisted metal-organic vapor deposition.

The one or more substrates can have an average characteristic dimension. The average characteristic dimension of the one or more substrates can, for example, be 1 inch or more (e.g., 2 inches or more, 3 inches or more, 4 inches or more, 5 inches or more, 6 inches or more, 7 inches or more, 8 inches or more, 9 inches or more, 10 inches or more, 11 inches or more, 12 inches or more, 13 inches or more, 14 inches or more, 15 inches or more, 16 inches or more, 17 inches or more, 18 inches or more, 19 inches or more, 20 inches or more, 25 inches or more, 30 inches or more, or 35 inches or more). In some examples, the average characteristic dimension of the one or more substrates can be 36 inches or less (e.g., 35 inches or less, 30 inches or less, 25 inches or less, 20 inches or less, 19 inches or less, 18 inches or less, 17 inches or less, 16 inches or less, 15 inches or less, 14 inches or less, 13 inches or less, 12 inches or less, 11 inches or less, 10 inches or less, 9 inches or less, 8 inches or less, 7 inches or less, 6 inches or less, 5 inches or less, 4 inches or less, 3 inches or less, or 2 inches or less). The average characteristic dimension of the one or more substrates can range from any of the minimum values described above to any of the maximum values described above. For example, the average characteristic dimension of the one or more substrates can be from 1 inch to 36 inches (e.g., from 1 inch to 18 inches, from 18 inches to 36 inches, from 1 inch to 6 inches, from 6 inches to 12 inches, from 12 inches to 18 inches, from 18 inches to 24 inches, from 24 inches to 30 inches, from 30 inches to 36 inches, from 2 inches to 36 inches, from 1 inch to 30 inches, from 2 inches to 30 inches, from 1 inch to 18 inches, from 1 inch to 12 inches, or from 2 inches to 8 inches).

The one or more substrates can be any shape, such as a regular shape, an irregular shape, an isotropic shape, or an anisotropic shape. In some examples, the shape of the one or more substrates can be substantially circular, ovate, ovoid, elliptic, triangular, rectangular, polygonal, etc. In some examples, the shape of the one or more substrates can be substantially circular, such that the average characteristic dimension is the diameter.

The one or more substrates can comprise any suitable material. Examples of suitable substrates include, but are not limited to, bulk GaN, GaN template, sapphire, $Al_2O_3$, $LiAlO_2$, Si, SiC, zinc oxide, bulk AlN, AlN on sapphire template, and combinations thereof.

The devices 100 can, for example, be assembled together with, or in some examples can further comprise, the laser device 160 for producing a plurality of laser beams 162. The laser device 160 can, for example, comprise one or more lasers. In some examples, the laser device 160 can further comprise a laser distributor for splitting each of the one or more lasers into a plurality of laser beams 162. The wavelength(s) of the one or more lasers can be selected, for example, in view of the identity of the first precursor 170. In some examples, the one or more lasers can comprise an infrared laser. In some examples, the one or more lasers can comprise a $CO_2$ laser, such as a tunable $CO_2$ laser. In some examples, the laser device 160 and/or the plurality of laser injectors 110 can further comprise one or more windows, wherein the plurality of laser beams 162 traverse the one or more windows before entering the chamber 142. The one or more windows can comprise any suitable material, such as, for example, ZnSe, ZnS, NaCl, KBr, and combinations thereof.

Figure 8:
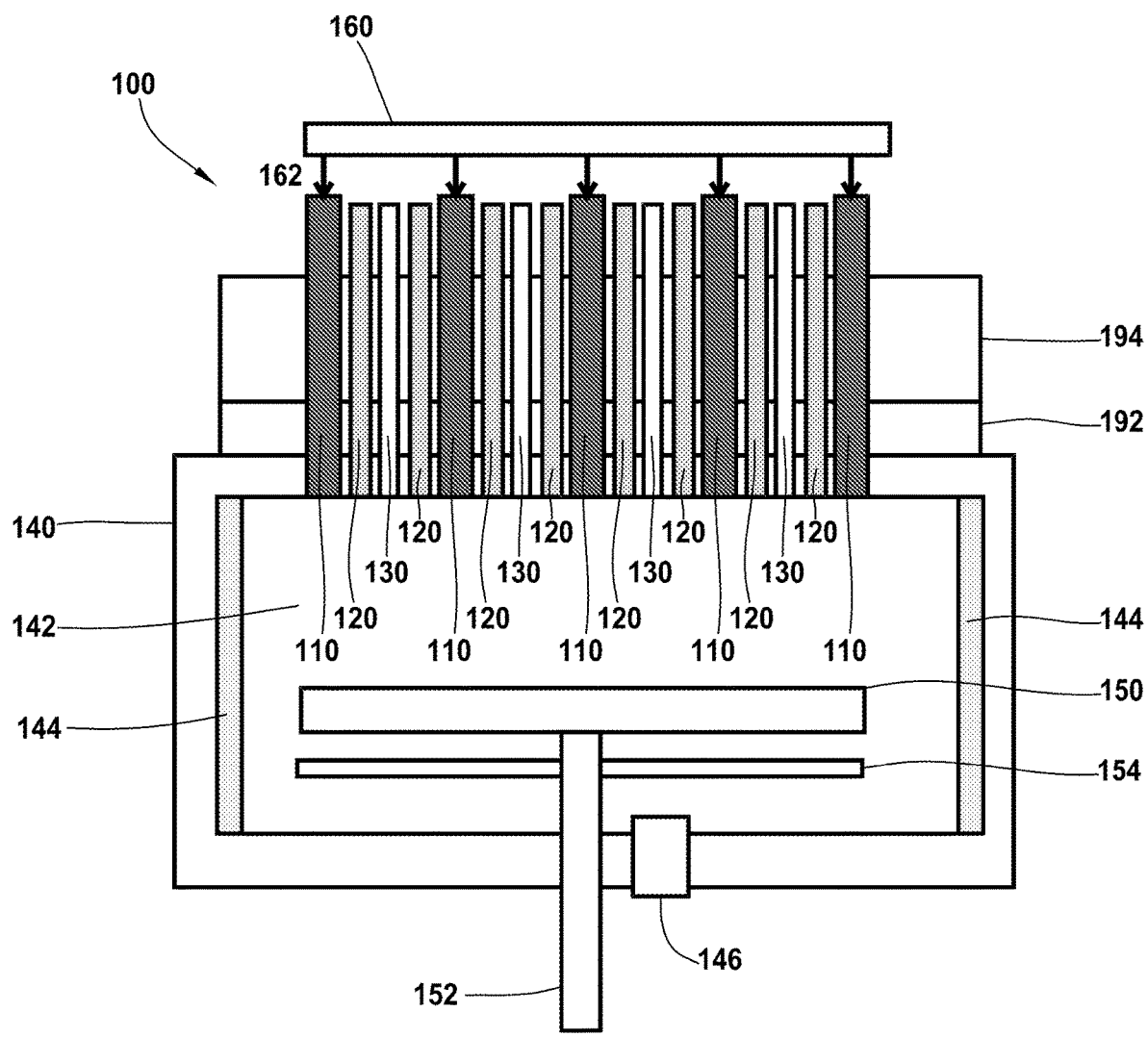
FIG. 8 is a schematic cross-sectional plan view of an example device as disclosed herein according to one implementation.
Figure 9:
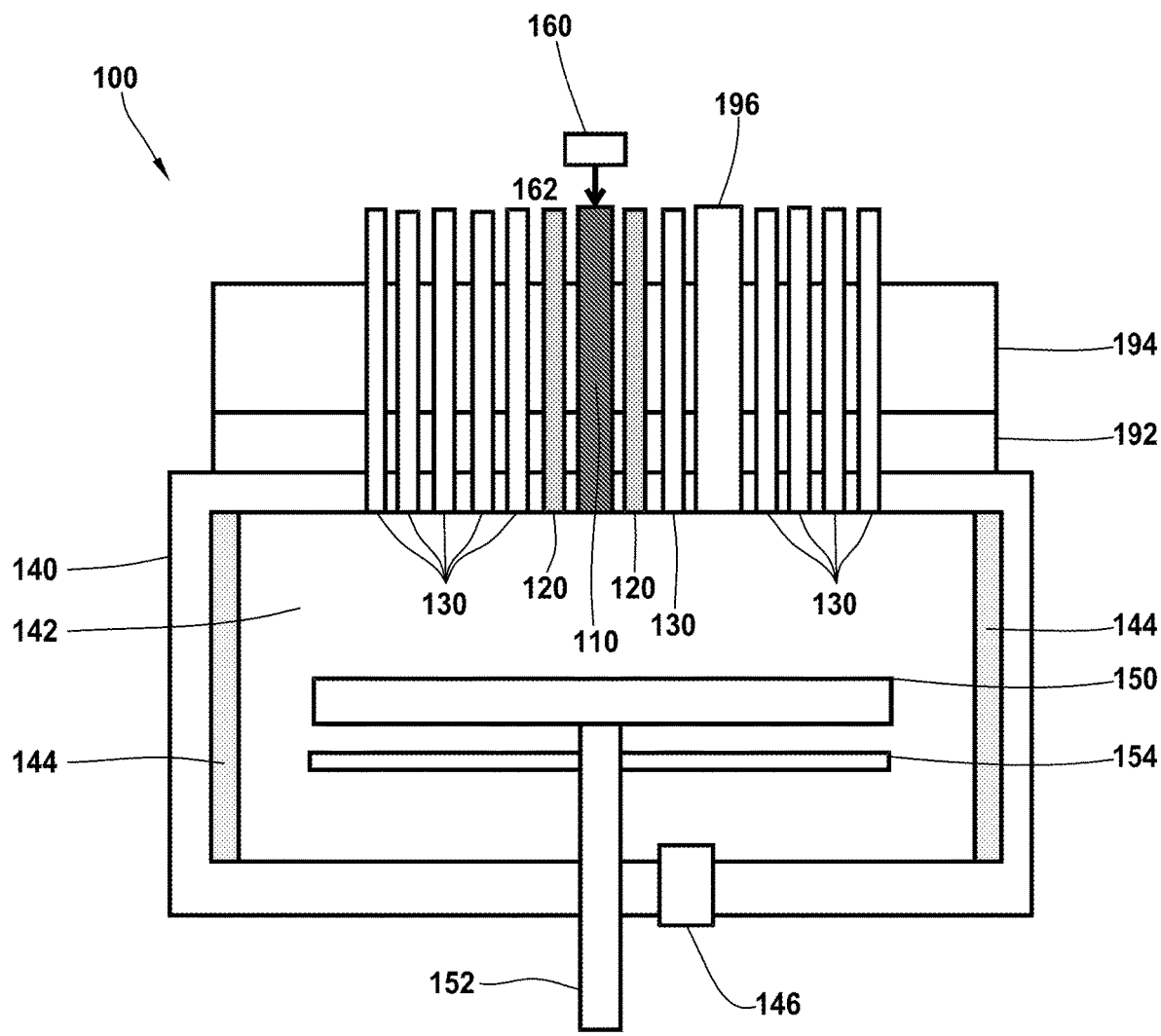
FIG. 9 is a schematic cross-sectional plan view, orthogonal to that of FIG. 8, of the example device shown in FIG. 8.

The devices 100 described herein can further comprise or be assembled with a variety of additional components, for example as shown in FIG. 8 and FIG. 9. Though the some of the elements are only shown in FIG. 8 and FIG. 9, any of the one or more additional elements or any combination of the one or more additional elements shown in FIG. 8 and FIG. 9 can be present in any of the other embodiments of the devices 100 described herein.

Referring now to FIG. 8 and FIG. 9, in some examples, the interior surface of wall 140 (e.g., the surface of the wall 140 within the chamber 142) can further comprise a coating 144, wherein the coating 144 can comprise a material that can absorb at least a portion of the laser beam energy. Though the coating 144 is only shown in FIG. 8 and FIG. 9, the coating 144 can be present in any of the other embodiments of the devices 100 described herein.

In some examples, the wall 140 can further comprise an exhaust port 146 which fluidly couples the chamber 142 with an external environment. Though the exhaust port 146 is only shown in FIG. 8 and FIG. 9, the exhaust port 146 can be present in any of the other embodiments of the devices 100 described herein.

In some examples, the rotatable substrate support surface 150 can be coupled to or further comprise a rotary spindle 152. For example, the rotatable substrate support surface 150 can be centrally mounted on the rotary spindle 152, and the rotary spindle 152 can be rotated to rotate the rotatable substrate support surface 150. In some examples, the rotary spindle 152 can further be coupled to a means for rotating the rotary spindle 152. The devices 100 can, for example, be configured to rotate the rotary spindle 152 and thus rotate the rotatable substrate support surface 150 to thereby provide a more uniform coating of the material on the one or more substrates via laser-assisted metal-organic vapor deposition. Though the rotary spindle 152 is only shown in FIG. 8 and FIG. 9, the rotary spindle 152 can be present in any of the other embodiments of the devices 100 described herein.

In some examples, the devices 100 can further be assembled with, or in some examples can further comprise, a heater 154 thermally coupled to the rotatable substrate support surface 150 within the chamber 142. The heater 154 can, for example, be located below the rotatable substrate support surface 150, and optionally spaced apart from the rotatable substrate support surface 150, relative to the position of the outlets 126 of the set of first conduits 120, the outlets 136 of the set of second conduits 130, and the outlets 116 of the plurality of laser injectors 110. In some examples, the devices 100 can further comprise a means for controlling the temperature of (e.g., heating) the heater 154. In some examples, the heater 154 can be heated such that the one or more substrates is at a temperature of 100° C. or more (e.g., 150° C. or more, 200° C. or more, 250° C. or more, 300° C. or more, 350° C. or more, 400° C. or more, 450° C. or more, 500° C. or more, 550° C. or more, 600° C. or more, 650° C. or more, 700° C. or more, 750° C. or more, 800° C. or more, 850° C. or more, 900° C. or more, 950° C. or more, 1000° C. or more, 1100° C. or more, 1200° C. or more, 1300° C. or more, 1400° C. or more, 1500° C. or more, 1600° C. or more, 1700° C. or more, 1800° C. or more, or 1900° C. or more). In some examples, the heater 154 can be heated such that the one or more substrates is at a temperature of 2000° C. or less (e.g., 1900° C. or less, 1800° C. or less, 1700° C. or less, 1600° C. or less, 1500° C. or less, 1400° C. or less, 1300° C. or less, 1200° C. or less, 1100° C. or less, 1000° C. or less, 950° C. or less, 900° C. or less, 850° C. or less, 800° C. or less, 750° C. or less, 700° C. or less, 650° C. or less, 600° C. or less, 550° C. or less, 500° C. or less, 450° C. or less, 400° C. or less, 350° C. or less, 300° C. or less, 250° C. or less, 200° C. or less, or 150° C. or less). The temperature at which the one or more substrates are heated by the heater 154 can range from any of the minimum values described above to any of the maximum values described above. For example, the heater 154 can be heated such that the one or more substrates is at a temperature of from 100° C. to 2000° C. (e.g., from 100° C. to 1000° C., from 1000° C. to 2000° C., from 100° C. to 500° C., from 500° C. to 900° C., from 900° C. to 1300° C., from 1300° C. to 1700° C., from 1700° C. to 2000° C., from 400° C. to 2000° C., from 100° C. to 1500° C., or from 400° C. to 1500° C.). Though the heater 154 is only shown in FIG. 8 and FIG. 9, the heater 154 can be present in any of the other embodiments of the devices 100 described herein.

The devices 100 can, for example, be assembled together with, or in some examples can further comprise, a cooling plate 192 disposed outside the chamber 142 adjacent and thermally coupled to the portion of the wall 140 substantially parallel with and spaced apart from the rotatable substrate support surface 150. The cooling plate can 192, in some examples, be in contact with the portion of the wall 140 substantially parallel with and spaced apart from the rotatable substrate support surface 150 outside of the chamber 142. The cooling plate 192 can be configured to cool the portion of the wall 140 substantially parallel with and spaced apart from the rotatable substrate support surface 150 outside of the chamber 142. In some examples, the devices 100 can further comprise a means for controlling the temperature of (e.g., cooling) the cooling plate 192. The cooling plate 192 can, in some examples, be hollow such that a cooling medium can be included within the cooling plate 192, for example to dissipate heat (e.g., from the heater, from the laser energy, or a combination thereof). In some examples, the cooling medium can comprise water. When present, the cooling plate 192 can further define the plurality of laser injectors 110, the set of first conduits 120, the set of second conduits 130, or a combination thereof. Though the cooling plate 192 is only shown in FIG. 8 and FIG. 9, the cooling plate 192 can be present in any of the other embodiments of the devices 100 described herein.

The devices 100 can, for example, further be assembled together with, or in some examples can further comprise, a top cover 194, disposed outside of the chamber 142 adjacent the portion of the wall 140 substantially parallel with and spaced apart from the rotatable substrate support surface 150. The top cover 194 can, in some examples, be in contact with the portion of the wall 140 substantially parallel with and spaced apart from the rotatable substrate support surface 150 outside of the chamber 142. When present, the cooling plate 192 can be sandwiched between the portion of the wall 140 substantially parallel with and spaced apart from the rotatable substrate support surface 150 outside of the chamber 142 and the top cover 194, such that the top cover 194 is located above and in contact with the cooling plate 192. When present, the cooling plate 192 and/or the top cover 194 can further define the plurality of laser injectors 110, the set of first conduits 120, the set of second conduits 130, or a combination thereof. Though the top cover 194 is only shown in FIG. 8 and FIG. 9, the top cover 194 can be present in any of the other embodiments of the devices 100 described herein.

The devices 100 can, for example, be assembled together with, or in some examples can further comprise, an in-situ monitor, such as a camera and/or a window. In some examples, the in-situ monitor can comprise a window or viewport 196 defined by the cooling plate 192 and/or top cover 194, when present. The in-situ monitor can allow for visual inspection inside the chamber 142 when the device 100 is assembled. Though the viewport 196 is only shown in FIG. 8 and FIG. 9, the viewport 196 can be present in any of the other embodiments of the devices 100 described herein.

Figure 10:
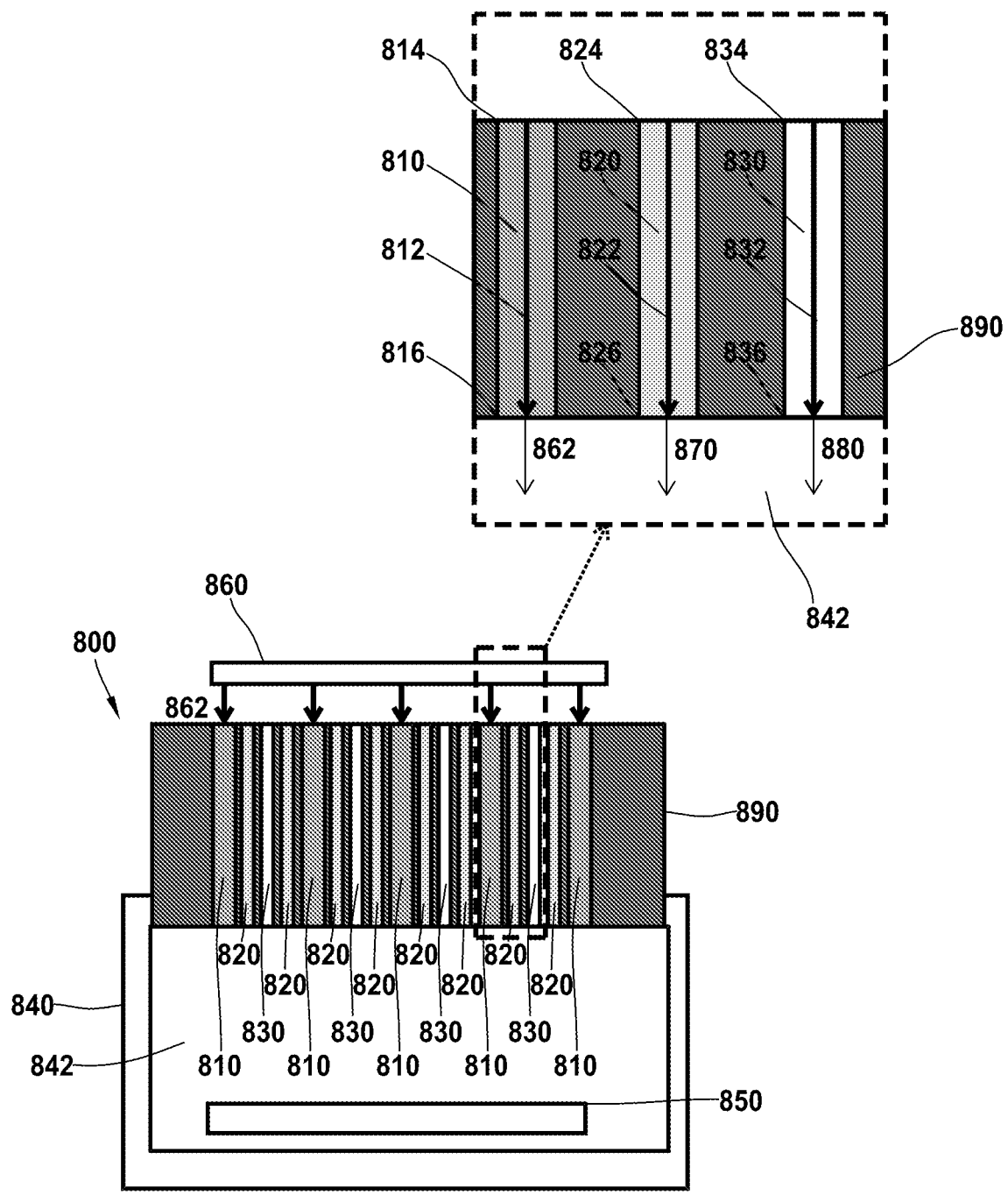
FIG. 10 is a cross-sectional plan view of a schematic of an example device as disclosed herein according to one implementation.
Figure 11:
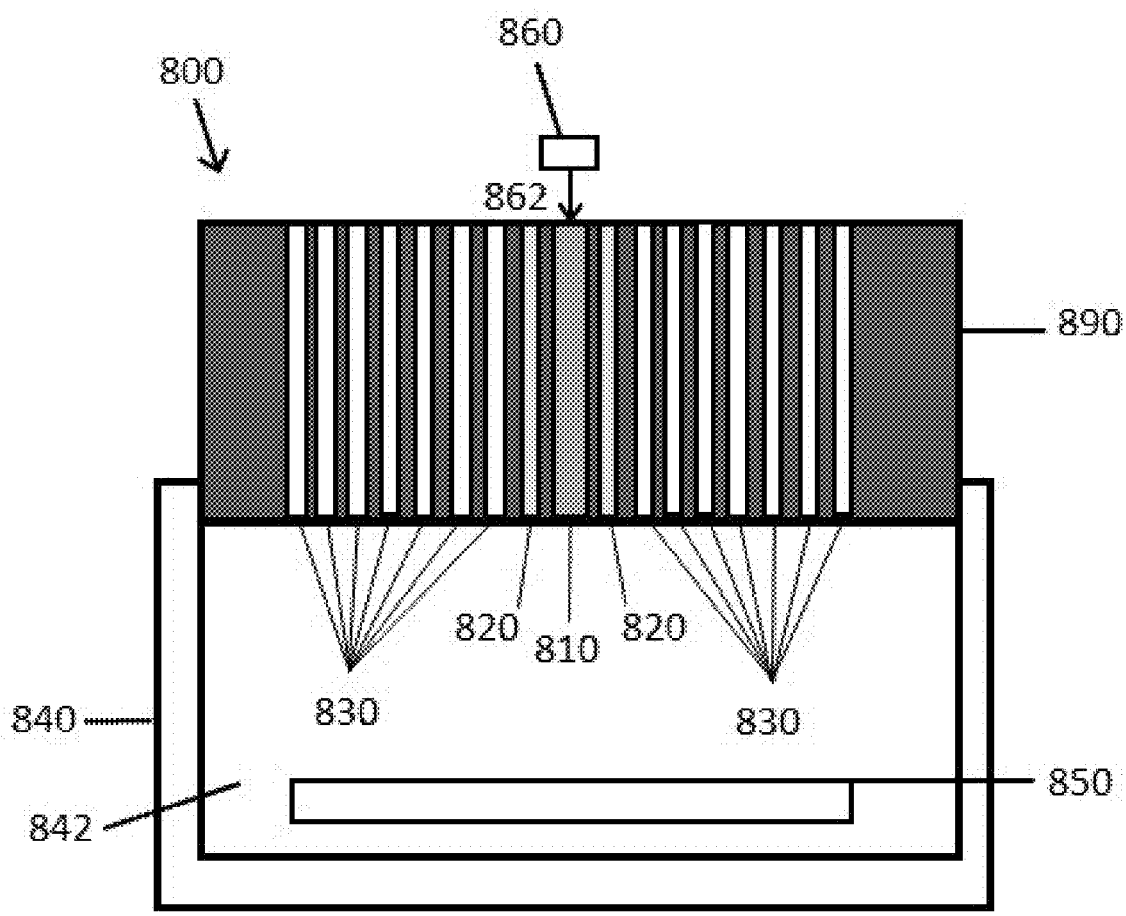
FIG. 11 is a schematic cross-sectional plan view, orthogonal to that of FIG. 10, of the example device shown in FIG. 10.

FIG. 10 and FIG. 11 show two orthogonal views of a laser-assisted metal-organic chemical vapor deposition (MOCVD) device 800 according to one implementation described herein. Referring now to FIG. 10 and FIG. 11, the devices 800 comprise: a plurality of laser injectors 810, wherein each of the plurality of laser injectors 810 defines an inlet 814, an outlet 816 opposite and spaced apart from the inlet 814, and an optical path 812 extending from the inlet 814 to the outlet 816; a set of first conduits 820, wherein each of the first conduits 820 defines an inlet 824, an outlet 826 opposite and spaced apart from the inlet 824, and a path for fluid flow 822 extending from the inlet 824 to the outlet 826; a set of second conduits 830, wherein each of the second conduits 830 defines an inlet 834, an outlet 836 opposite and spaced apart from the inlet 834, and a path for fluid flow 832 extending from the inlet 834 to the outlet 836; and a source distributor 890. The plurality of laser injectors 810, the set of first conduits 820, the set of second conduits 830, or a combination thereof can, for example, be defined by the source distributor 890. Referring now to FIG. 10 and FIG. 11, the plurality of laser injectors 810, the set of first conduits 820, and the set of second conduits 830 are defined by the source distributor 890. When the device 800 is assembled together with a wall 840 defining a chamber 842, a rotatable substrate support surface 850 disposed within the chamber 842, and a laser device 860 for producing a plurality of laser beams 862, the plurality of laser injectors 810 are configured such that the outlet 816 of each of the plurality of laser injectors 810 directs one of the plurality of laser beams 862 onto the rotatable substrate support surface 850 disposed within the chamber 842, the outlets 826 of the set of first conduits 820 are configured to introduce a first precursor 870 into the chamber 842 toward the rotatable substrate support surface 850, and the outlets 836 of the set of second conduits 830 are configured to introduce a second precursor 880 into the chamber 842 toward the rotatable substrate support surface 850.

The plurality of laser injectors 810 can include two or more laser injectors 810 (e.g., 3 or more, 4 or more, 5 or more, 6 or more, 7 or more, 8 or more, 9 or more, 10 or more, 15 or more, 20 or more, 25 or more, 30 or more, 40 or more, 50 or more, 60 or more, 70 or more, 80 or more, 90 or more, 100 or more, 150 or more, 200 or more, 250 or more, 300 or more, 350 or more, 400 or more, 450 or more, 500 or more, 600 or more, 700 or more, 800 or more, 900 or more, or 1000 or more). The number of laser injectors 810 can be selected in view of the size of the chamber 842, the size of the rotatable substrate support surface 850, or a combination thereof.

The plurality of laser injectors 810 can be positioned in an ordered array. The ordered array can be designed, for example, in view of the number of laser injectors 810, the size of the chamber 842, the size of the rotatable substrate support surface 850, and the like, or a combination thereof. In some examples, the plurality of laser injectors 810 are positioned in a line. In some examples, the ordered array can be designed so as to provide a uniform distribution of lasers over the rotatable substrate support surface as the rotatable substrate support surface is rotated.

The cross-sectional shape of each of the plurality of laser injectors 810 in a plane perpendicular to the central longitudinal axis of said laser injector 810 can be any shape, such as a regular shape, an irregular shape, an isotropic shape, or an anisotropic shape. In some examples, the cross-sectional shape of the plurality of laser injectors 810 can be substantially circular, ovate, ovoid, elliptic, triangular, rectangular, polygonal, etc. In some examples, the cross-sectional shape of the plurality of laser injectors 810 can be substantially circular.

The outlets 816 of each of the plurality of laser injectors 810 can be any shape, such as a regular shape, an irregular shape, an isotropic shape, or an anisotropic shape. In some examples, the outlets 816 of the plurality of laser injectors 810 can have a shape that is substantially circular, ovate, ovoid, elliptic, triangular, rectangular, polygonal, etc. In some examples, the shape of the outlets 816 of the plurality of laser injectors 810 can be substantially circular. The outlets 816 of each of the plurality of laser injectors 810 can, for example, be the cross-section in a plane perpendicular to the longitudinal axis of said laser injector 810, such that the shape of the outlet 816 of each of the plurality of laser injectors 810 can be the cross-sectional shape of each of the plurality of laser injectors 810.

The plurality of laser injectors 810 can be configured such that each of the laser beams 862 has an average spot size on the rotatable substrate support surface 850. The plurality of laser injectors 810 can, for example, be configured such that the average spot size of the plurality of laser beams 862 on the rotatable substrate support surface can be 1 millimeters (mm) or more (e.g., 5 mm or more, 10 mm or more, 15 mm or more, 20 mm or more, 25 mm or more, 30 mm or more, 35 mm or more, 40 mm or more, 45 mm or more, 50 mm or more, 60 mm or more, 70 mm or more, 80 mm or more, or 90 mm or more). In some examples, the plurality of laser injectors 810 can be configured such that the average spot size of the plurality of laser beams 862 on the rotatable substrate support surface 850 can be 100 mm or less (e.g., 90 mm or less, 80 mm or less, 70 mm or less, 60 mm or less, 50 mm or less, 45 mm or less, 40 mm or less, 35 mm or less, 30 mm or less, 25 mm or less, 20 mm or less, 15 mm or less, 10 mm or less, or 5 mm or less). The average spot size of the plurality of laser beams 862 on the rotatable substrate support surface 850 can range from any of the minimum values described above to any of the maximum values described above. For example, the plurality of laser injectors 810 can be configured such that the average spot size of the plurality of laser beams 862 on the rotatable substrate support surface 850 can be from 1 mm to 100 mm (e.g., from 1 mm to 50 mm, from 50 mm to 100 mm, from 1 mm to 20 mm, from 20 mm to 40 mm, from 40 mm to 60 mm, from 60 mm to 80 mm, from 80 mm to 100 mm, from 5 mm to 100 mm, from 1 mm to 90 mm, from 5 mm to 90 mm, from 1 mm to 80 mm, from 1 mm to 60 mm, or from 5 mm to 50 mm).

Each of the plurality of laser injectors 810 can, for example, include one or more lenses 818 for expanding each of the laser beams 862 onto the rotatable substrate support surface 850, e.g., such that each of the laser beams 862 has the average spot size on the rotatable substrate support surface 850. The one or more lenses 818 can be any type of lens, such as a simple lens, a compound lens, a spherical lens, a toric lens, a biconvex lens, a plano-convex lens, a plano-concave lens, a negative meniscus lens, a positive meniscus lens, a biconcave lens, a converging lens, a diverging lens, a cylindrical lens, a Fresnel lens, a lenticular lens, a gradient index lens, or a combination thereof. The one or more lenses 818 can be selected to control the spot size of each of the laser beams 862 on the rotatable substrate support surface 850, the uniformity of each of the laser beams 862 (e.g., with respect to intensity) on the rotatable substrate support surface 850, or a combination thereof.

For example, each of the plurality of laser injectors 810 can include a convex lens 818a and a concave lens 818b for expanding each of the laser beams 862 onto the rotatable substrate support surface 850. The convex lens 818a can reduce the waist of the incident laser beam 862 from $\omega_0$ to $\omega_1$ and increase the divergence angle of the incident laser beam 862. The concave lens 818b can be located at the focal point of the convex lens 818a, $f_1$, to expand the laser beam 862 size to $\omega_2$ on the rotatable substrate support surface 850, e.g., the spot size. The concave lens 818b can also improve the uniformity of the laser beam 862 inside the Gaussian laser spot on the rotatable substrate support surface 850.

The number of laser injectors 810, the arrangement of the laser injectors 810, the cross-sectional shape of the laser injectors 810, the number and/or types of lenses in the laser injectors 810, the average spot size of the laser beams 862 on the rotatable substrate support surface 850, or a combination thereof can be selected, for example, in view of the wavelength(s) of the laser beams 862, the intensity of the laser beams 862 within the chamber 842, the size of the chamber 842, the size of the rotatable substrate support surface 850, or a combination thereof.

As used herein, "a set of first conduits 820" and "the set of first conduits 820" are meant to include any number of first conduits 820 in any arrangement. Thus, for example "a set of first conduits 820" includes one or more first conduits 820 (e.g., 2 or more, 3 or more, 4 or more, 5 or more, 6 or more, 7 or more, 8 or more, 9 or more, 10 or more, 15 or more, 20 or more, 25 or more, 30 or more, 40 or more, 50 or more, 60 or more, 70 or more, 80 or more, 90 or more, 100 or more, 150 or more, 200 or more, 250 or more, 300 or more, 350 or more, 400 or more, 450 or more, 500 or more, 600 or more, 700 or more, 800 or more, 900 or more, or 1000 or more). In some embodiments, the set of first conduits 820 can comprise a plurality of first conduits 820. In some embodiments, the set of first conduits 820 can comprise a plurality of first conduits 820 arranged in an ordered array.

The cross-sectional shape of each of first conduits 820 in a plane perpendicular to the central longitudinal axis of said first conduit 820 can be any shape, such as a regular shape, an irregular shape, an isotropic shape, or an anisotropic shape. In some examples, the cross-sectional shape of each of first conduits 820 in the set of first conduits 820 can be substantially circular, ovate, ovoid, elliptic, triangular, rectangular, polygonal, etc. In some examples, the cross-sectional shape of each of the first conduits 820 can be substantially circular.

The set of first conduits 820 can have an average characteristic dimension. The average characteristic dimension of the set of first conduits 820 can, for example, be 0.1 millimeter (mm) or more (e.g., 0.25 mm or more, 0.5 mm or more, 0.75 mm or more, 1 mm or more, 1.25 mm or more, 1.5 mm or more, 1.75 mm or more, 2 mm or more, 2.5 mm or more, 3 mm or more, 3.5 mm or more, 4 mm or more, or 4.5 mm or more). In some examples, the average characteristic dimension of the set of first conduits 820 can be 5 mm or less (e.g., 4.5 mm or less, 4 mm or less, 3.5 mm or less, 3 mm or less, 2.5 mm or less, 2 mm or less, 1.75 mm or less, 1.5 mm or less, 1.25 mm or less, 1 mm or less, 0.75 mm or less, 0.5 mm or less, or 0.25 mm or less). The average characteristic dimension of the set of first conduits 820 can range from any of the minimum values described above to any of the maximum values described above. For examples, the average characteristic dimension of the set of first conduits 820 can be from 0.1 mm to 5 mm (e.g., from 0.1 mm to 2.5 mm, from 2.5 mm to 5 mm, from 0.1 mm to 1 mm, from 1 mm to 2 mm, from 2 mm to 3 mm, from 3 mm to 4 mm, from 4 mm to 5 mm, from 0.5 mm to 5 mm, from 0.1 mm to 4.5 mm, from 0.5 mm to 4.5 mm, from 0.1 mm to 4 mm, from 0.1 mm to 3 mm, or from 0.5 mm to 2 mm).

The outlets 826 of each of the first conduits 820 can be any shape, such as a regular shape, an irregular shape, an isotropic shape, or an anisotropic shape. In some examples, the outlets 826 of the set of first conduits 820 can have a shape that is substantially circular, ovate, ovoid, elliptic, triangular, rectangular, polygonal, etc. In some examples, the shape of the outlets 826 of the set of first conduits 820 can be substantially circular. The outlet 826 of each of the set of first conduits 820 can, for example, be the cross-section in a plane perpendicular to the central longitudinal axis of said first conduit 820, such that the shape of the outlet 826 of each of the set of first conduits 820 can be the cross-sectional shape of each of the first conduits 820.

The outlets 826 of the set of first conduits 820 can have an average characteristic dimension. The average characteristic dimension of the outlets 826 of the set of first conduits 820 can, for example, be 0.1 millimeter (mm) or more (e.g., 0.25 mm or more, 0.5 mm or more, 0.75 mm or more, 1 mm or more, 1.25 mm or more, 1.5 mm or more, 1.75 mm or more, 2 mm or more, 2.5 mm or more, 3 mm or more, 3.5 mm or more, 4 mm or more, or 4.5 mm or more). In some examples, the average characteristic dimension of the outlets 826 of the set of first conduits 820 can be 5 mm or less (e.g., 4.5 mm or less, 4 mm or less, 3.5 mm or less, 3 mm or less, 2.5 mm or less, 2 mm or less, 1.75 mm or less, 1.5 mm or less, 1.25 mm or less, 1 mm or less, 0.75 mm or less, 0.5 mm or less, or 0.25 mm or less). The average characteristic dimension of the outlets 826 set of first conduits 820 can range from any of the minimum values described above to any of the maximum values described above. For examples, the average characteristic dimension of the outlets 826 of the set of first conduits 820 can be from 0.1 mm to 5 mm (e.g., from 0.1 mm to 2.5 mm, from 2.5 mm to 5 mm, from 0.1 mm to 1 mm, from 1 mm to 2 mm, from 2 mm to 3 mm, from 3 mm to 4 mm, from 4 mm to 5 mm, from 0.5 mm to 5 mm, from 0.1 mm to 4.5 mm, from 0.5 mm to 4.5 mm, from 0.1 mm to 4 mm, from 0.1 mm to 3 mm, or from 0.5 mm to 2 mm).

In some examples, the each of the outlets 826 of the set of first conduits 820 can further comprise a nozzle (not shown) fluidly connected to each of the outlets 826 of the set of first conduits 820. Each nozzle can, for example, have an average characteristic dimension and a cross-sectional shape, wherein the average characteristic dimension of the nozzles, the cross-sectional shape of the nozzles, or a combination thereof can be the same or different than that of the outlets 826 of the set of first conduits 820. In some examples, the average characteristic dimension of the nozzles can be smaller than the average characteristic dimension of the outlets 826 of the set of first conduits 820. In some examples, the cross-sectional shape of the nozzles can be substantially circular. The average characteristic dimension of the nozzles, the cross-sectional shape of the nozzles, the orientation of the nozzles, or a combination thereof can be used to affect and/or control how the first precursor 870 is introduced into the chamber 842 (e.g., speed, direction, volume, etc.).

The number of first conduits 820, the arrangement of the first conduits 820, the cross-sectional shape of the first conduits 820, the shape of the outlets 826 of the first conduits 820, the average characteristic dimension of the outlets 826 of the first conduits 820, the presence or absence of the nozzles fluidly connected to each of the outlets 826 of the set of first conduits 820, the average characteristic dimension of the nozzles fluidly connected to each of the outlets 826 of the set of first conduits 820, the cross-sectional shape of the nozzles fluidly connected to each of the outlets 826 of the set of first conduits 820, or a combination thereof can be selected, for example, in view of the number of laser injectors 810, the location of the laser injectors 810, the size of the laser beams 862, the wavelength(s) of the laser beams 862, the intensity of the laser beams 862 within the chamber 842, the size of the chamber 842, the size of the rotatable substrate support surface 850, the number of second conduits 830, the location of the second conduits 830, the average characteristic dimension of the outlets 836 of the second conduits 830, the shape of the outlets 836 of the second conduits 830, the presence or absence of the nozzles fluidly connected to each of the outlets 836 of the set of second conduits 830, the average characteristic dimension of the nozzles fluidly connected to each of the outlets 836 of the set of second conduits 830, the cross-sectional shape of the nozzles fluidly connected to each of the outlets 836 of the set of second conduits 830, or a combination thereof.

As used herein, "a set of second conduits 830" and "the set of second conduits 830" are meant to include any number of second conduits 830 in any arrangement. Thus, for example "a set of second conduits 830" includes one or more second conduits 830 (e.g., 2 or more, 3 or more, 4 or more, 5 or more, 6 or more, 7 or more, 8 or more, 9 or more, 10 or more, 15 or more, 20 or more, 25 or more, 30 or more, 40 or more, 50 or more, 60 or more, 70 or more, 80 or more, 90 or more, 100 or more, 150 or more, 200 or more, 250 or more, 300 or more, 350 or more, 400 or more, 450 or more, 500 or more, 600 or more, 700 or more, 800 or more, 900 or more, or 1000 or more). In some embodiments, the set of second conduits 830 can comprise a plurality of second conduits 830. In some embodiments, the set of second conduits 830 can comprise a plurality of second conduits 830 arranged in an ordered array.

The cross-sectional shape of each of second conduits 830 in a plane perpendicular to the central longitudinal axis of said second conduit 830 can be any shape, such as a regular shape, an irregular shape, an isotropic shape, or an anisotropic shape. In some examples, the cross-sectional shape of each of the second conduits 830 in the set of second conduits 830 can be substantially circular, ovate, ovoid, elliptic, triangular, rectangular, polygonal, etc. In some examples, the cross-sectional shape of each of the second conduits 830 can be substantially circular. In some examples, the cross-sectional shape of each of the second conduits 830 can be the same as the cross-sectional shape of the set of first conduits 820.

The set of second conduits 830 can have an average characteristic dimension. The average characteristic dimension of the set of second conduits 830 can, for example, be 0.1 millimeter (mm) or more (e.g., 0.25 mm or more, 0.5 mm or more, 0.75 mm or more, 1 mm or more, 1.25 mm or more, 1.5 mm or more, 1.75 mm or more, 2 mm or more, 2.5 mm or more, 3 mm or more, 3.5 mm or more, 4 mm or more, or 4.5 mm or more). In some examples, the average characteristic dimension of the set of second conduits 830 can be 5 mm or less (e.g., 4.5 mm or less, 4 mm or less, 3.5 mm or less, 3 mm or less, 2.5 mm or less, 2 mm or less, 1.75 mm or less, 1.5 mm or less, 1.25 mm or less, 1 mm or less, 0.75 mm or less, 0.5 mm or less, or 0.25 mm or less). The average characteristic dimension of the set of second conduits 830 can range from any of the minimum values described above to any of the maximum values described above. For examples, the average characteristic dimension of the set of second conduits 830 can be from 0.1 mm to 5 mm (e.g., from 0.1 mm to 2.5 mm, from 2.5 mm to 5 mm, from 0.1 mm to 1 mm, from 1 mm to 2 mm, from 2 mm to 3 mm, from 3 mm to 4 mm, from 4 mm to 5 mm, from 0.5 mm to 5 mm, from 0.1 mm to 4.5 mm, from 0.5 mm to 4.5 mm, from 0.1 mm to 4 mm, from 0.1 mm to 3 mm, or from 0.5 mm to 2 mm). In some examples, the average characteristic dimension of the set of second conduits 830 can be the same as the average characteristic dimension of the set of first conduits 820.

The outlets 836 of each of the second conduits 830 can be any shape, such as a regular shape, an irregular shape, an isotropic shape, or an anisotropic shape. In some examples, the outlets 836 of the set of second conduits 830 can have a shape that is substantially circular, ovate, ovoid, elliptic, triangular, rectangular, polygonal, etc. In some examples, the shape of the outlets 836 of the set of second conduits 830 can be substantially circular. The outlet 836 of each of the set of second conduits 830 can, for example, be the cross-section in a plane perpendicular to the central longitudinal axis of said second conduit 830, such that the shape of the outlet 836 of each of the set of second conduits 830 can be the cross-sectional shape of each of the second conduits 830. In some examples, the shape of the outlets 836 of the set of second conduits 830 can be the same as the shape of the outlets 826 of the set of first conduits 820.

The outlets 836 of the set of second conduits 830 can have an average characteristic dimension. The average characteristic dimension of the outlets 836 of the set of second conduits 830 can, for example, be 0.1 millimeter (mm) or more (e.g., 0.25 mm or more, 0.5 mm or more, 0.75 mm or more, 1 mm or more, 1.25 mm or more, 1.5 mm or more, 1.75 mm or more, 2 mm or more, 2.5 mm or more, 3 mm or more, 3.5 mm or more, 4 mm or more, or 4.5 mm or more). In some examples, the average characteristic dimension of the outlets 836 of the set of second conduits 830 can be 5 mm or less (e.g., 4.5 mm or less, 4 mm or less, 3.5 mm or less, 3 mm or less, 2.5 mm or less, 2 mm or less, 1.75 mm or less, 1.5 mm or less, 1.25 mm or less, 1 mm or less, 0.75 mm or less, 0.5 mm or less, or 0.25 mm or less). The average characteristic dimension of the outlets 836 of the set of second conduits 830 can range from any of the minimum values described above to any of the maximum values described above. For examples, the average characteristic dimension of the outlets 836 of the set of second conduits 830 can be from 0.1 mm to 5 mm (e.g., from 0.1 mm to 2.5 mm, from 2.5 mm to 5 mm, from 0.1 mm to 1 mm, from 1 mm to 2 mm, from 2 mm to 3 mm, from 3 mm to 4 mm, from 4 mm to 5 mm, from 0.5 mm to 5 mm, from 0.1 mm to 4.5 mm, from 0.5 mm to 4.5 mm, from 0.1 mm to 4 mm, from 0.1 mm to 3 mm, or from 0.5 mm to 2 mm). In some examples, the average characteristic dimension of the outlets 836 of the set of second conduits 830 can be the same as the average characteristic dimension of the outlets 826 of the set of first conduits 820.

In some examples, the each of the outlets 836 of the set of second conduits 830 can further comprise a nozzle (not shown) fluidly connected to each of outlets 836 of the set of second conduits 830. Each nozzle can, for example, have an average characteristic dimension and a cross-sectional shape, wherein the average characteristic dimension of the nozzles, the cross-sectional shape of the nozzles, or a combination thereof can be the same or different than that of the outlets 836 of the set of second conduits 830. In some examples, the average characteristic dimension of the nozzles can be smaller than the average characteristic dimension of the outlets 836 of the set of second conduits 830. In some examples, the cross-sectional shape of the nozzles can be substantially circular. The average characteristic dimension of the nozzles, the cross-sectional shape of the nozzles, the orientation of the nozzles, or a combination thereof can be used to affect and/or control how the second precursor 880 is introduced into the chamber 842 (e.g., speed, direction, volume, etc.).

The number of second conduits 830, the arrangement of the second conduits 830, the cross-sectional shape of the second conduits 830, the shape of the outlets 836 of the second conduits 830, the average characteristic dimension of the outlets 836 of the second conduits 830, the presence or absence of the nozzles fluidly connected to each of the outlets 836 of the set of second conduits 830, the average characteristic dimension of the nozzles fluidly connected to each of the outlets 836 of the set of second conduits 830, the cross-sectional shape of the nozzles fluidly connected to each of the outlets 836 of the set of second conduits 830, or a combination thereof can be selected, for example, in view of the number of laser injectors 810, the location of the laser injectors 810, the size of the laser beams 862, the wavelength(s) of the laser beams 862, the intensity of the laser beams 862 within the chamber 842, the size of the chamber 842, the size of the rotatable substrate support surface 850, the number of first conduits 820, the location of the first conduits 820, the average characteristic dimension of the outlets 826 of the first conduits 820, the shape of the outlets 826 of the first conduits 820, the presence or absence of the nozzles fluidly connected to each of the outlets 826 of the set of first conduits 820, the average characteristic dimension of the nozzles fluidly connected to each of the outlets 826 of the set of first conduits 820, the cross-sectional shape of the nozzles fluidly connected to each of the outlets 826 of the set of first conduits 820, or a combination thereof.

The source distributor 890 can have a first surface and a second surface opposite and spaced apart from the first surface, wherein the set of first conduits 820 and the set of second conduits 830 traverse the source distributor 890 from the first surface to the second surface, and wherein the second surface of the source distributor 890 is substantially parallel and spaced apart from the rotatable substrate support surface 850. The source distributor 890 can, for example, form a lid to the chamber 842.

The source distributor 890 can, in some examples, be hollow such that a cooling medium can be included within the source distributor 890, for example to dissipate heat (e.g., from the heater, from the laser energy, or a combination thereof). The source distributor 890 can, in some examples, comprise inside space (not shown), which have an inlet fluidly connected to an outlet, wherein the inlet and the outlet are configured to provide a path for flowing the cooling medium through the inside space within the source distributor. In some examples, the cooling medium can comprise water.

The source distributor 890 can, for example, define the plurality of laser injectors 810, the set of first conduits 820, the set of second conduits 830, or a combination. In some examples, such as shown in FIG. 10 and FIG. 11, the plurality of laser injectors 810, the set of first conduits 820, and the set of second conduits 830 are defined by the source distributor 890.

In some examples, the outlets 816 of all of the plurality of laser injectors 810 are positioned in an ordered array within a quadrant of the source distributor 890. In some examples, the plurality of laser injectors 810 are positioned in the ordered array within a quadrant of the source distributor 890 so as to provide a uniform distribution of lasers 862 over the rotatable substrate support surface 850 as the rotatable substrate support surface 850 is rotated. In some examples, the outlet(s) 826 of one or more first conduits 820 is/are located adjacent the outlet 816 of at least one of the plurality of laser injectors 810. In some examples, the outlet 826 of each of the set of first conduits 820 are positioned in an ordered array within the same quadrant of the source distributor 890 as the outlets 816 of the plurality of laser injectors 810, and the outlets 826 of the set of first conduits 820 are interspersed between the outlets 816 of the plurality of laser injectors 810. In some examples, the outlets 836 of the set of second conduits 830 are located in an ordered array, evenly spaced about the outlets 816 of the plurality of laser injectors 810 and/or the outlets 826 of the set of first conduits 820.

In some examples, the outlet(s) 826 of one or more first conduits 820 is/are located adjacent the outlet 816 of at least one of the plurality of laser injectors 810. In some examples, the outlet(s) 826 of one or more first conduits 820 is/are located directly adjacent the outlet 816 of at least one of the plurality of laser injectors 810. In some examples, the outlets 826 of three or more (e.g., 4 or more, 5 or more, 6 or more, etc.) of the first conduits 820 are located directly adjacent the outlet 816 of at least one of the plurality of laser injectors 810 and the outlets 826 of the three or more first conduits 820 are evenly spaced around the periphery of the outlet 816 of the at least one of the plurality of laser injectors 810, such that the outlet 816 of the at least one laser injector 810 is surrounded by the evenly spaced outlets 826 of the three or more first conduits 820. In some examples, the outlets 826 of four of the first conduits 820 are located directly adjacent the outlet 816 of each of the plurality of laser injectors 810 and the outlets 826 of the four first conduits 820 are evenly spaced around the periphery of each of the outlets 816 of the plurality of laser injectors 810. In some examples, the outlets 836 of the set of second conduits 830 are located in an ordered array, evenly spaced throughout at least a portion of the source distributor 890 about the outlets 816 of the plurality of laser injectors 810 and/or the outlets 826 of the set of first conduits 820.

Figure 12:
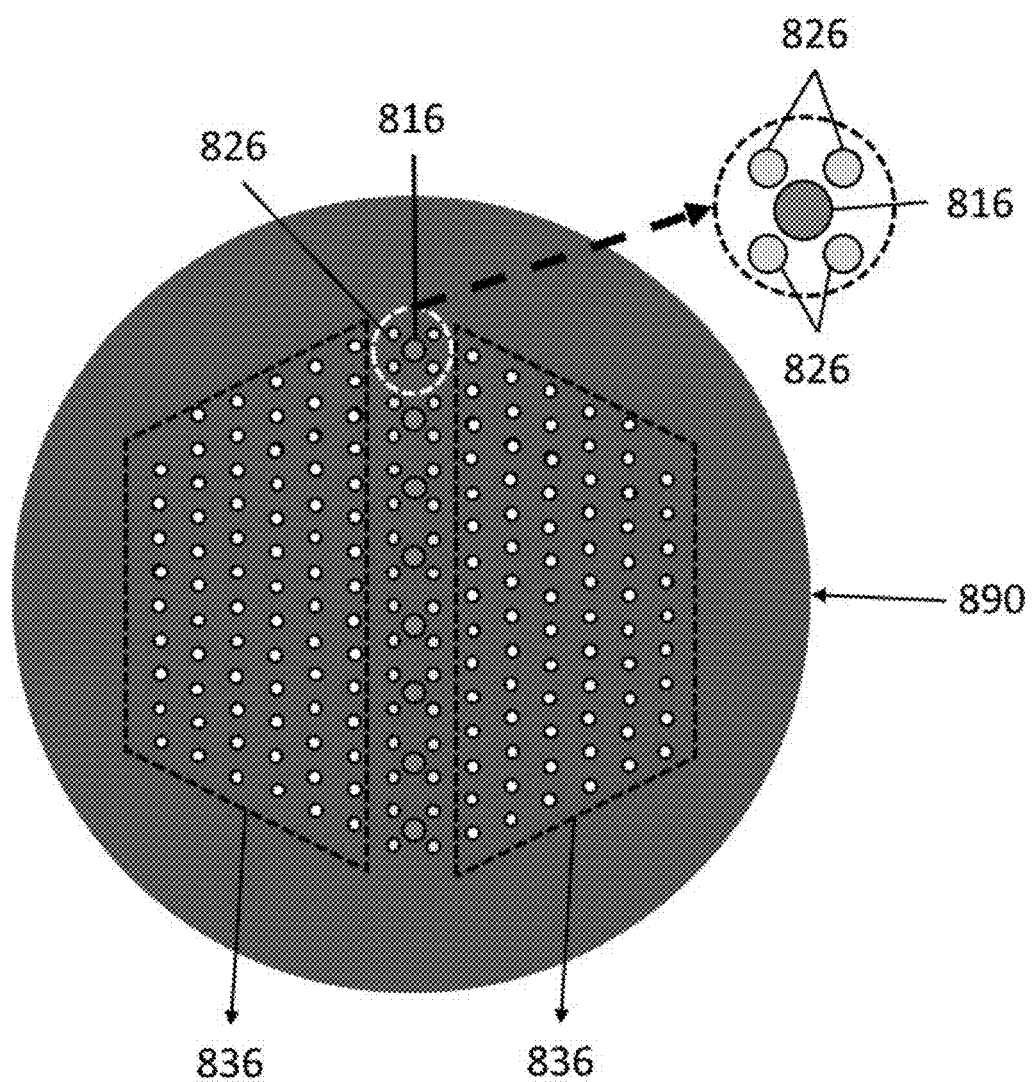
FIG. 12 is a schematic cross-sectional plan view of the second (e.g., bottom) surface of the source distributor showing the arrangement of the outlets of the set of first conduits, the outlets of the second conduits, and the outlets of the plurality of laser injectors in one implementation of the example device shown in FIG. 10 and FIG. 11.

FIG. 12 is a schematic cross-sectional plan view of one implementation of the example device 800 shown in FIG. 10 and FIG. 11, showing the second surface (e.g., bottom surface) of the source distributor 890 and the arrangement of the outlets 826 of the set of first conduits 820, the outlets 836 of the set of second conduits 830, and the outlets 816 of the plurality of laser injectors 810 in one implementation of the device 800. Referring now to FIG. 12, in some examples, the device 800 comprises a source distributor 890, wherein the plurality of laser injectors 810, the set of first conduits 820, and the set of second conduits 830 are defined by the source distributor 890, and the outlets 816 of the plurality of laser injectors 810 are positioned in a line across the width (e.g., diameter) of the second surface of the source distributor 890, the outlets 826 of four of the first conduits 820 are located directly adjacent the outlet 816 of each of the plurality of laser injectors 810 and the outlets 826 of the four first conduits 820 are evenly spaced around the periphery of each of the outlets 816 of the plurality of laser injectors 810, and the outlets 836 of the second conduits 830 are located in an ordered array evenly spaced throughout at least a portion of the source distributor 890 on either side of the outlets 826 of the set of first conduits 820 and the outlets 816 of the plurality of laser injectors 810.

The outlets 826 of the set of first conduits 820 can, for example, be configured to introduce a first precursor 870 into the chamber 842 toward the rotatable substrate support surface 850 such that the first precursor 870 flows through at least one of the plurality of laser beams 862 within the chamber 842, thereby producing an irradiated first precursor 872 in situ within the chamber 842, prior to reaching the rotatable substrate support surface 850. The outlets 836 of the set of second conduits 830 can be configured to introduce a second precursor 880 into the chamber 842 toward the rotatable substrate support surface 850. In some examples, the outlets 826 of the set of first conduits 820 are configured to introduce the first precursor 870 substantially parallel to a central axis of each of the plurality of laser beams 862 within the chamber 842.

Each of the plurality of laser beams 862 comprises electromagnetic radiation with at least one wavelength that overlaps with at least a portion of a vibrational mode of the first precursor 870, thereby generating an active species (e.g., the irradiated first precursor 872) in situ. In some examples, the wavelength of the laser beams 862 are selected in view of the identity of the first precursor 870, such that each of the plurality of laser beams 862 comprises electromagnetic radiation with at least one wavelength that overlaps with at least a portion of a vibrational mode of the first precursor 870, such that irradiation of the first precursor 870 with the laser beam(s) 862 can enhance the cracking efficiency of the first precursor 870.

In some examples, the device 800 is configured to deposit a III-V semiconductor, such that the first precursor 870 comprises a V-group precursor and the second precursor 880 comprises a III-group precursor The first precursor 870 can, for example, comprise a V-group precursor, such as a compound, element, or composition comprising N, P, As, Sb, Bi, or a combination thereof. In some examples, the first precursor 870 can comprise a nitrogen species. In some examples, the first precursor 870 can comprise $NH_3$. The first precursor 870 can, for example, comprise a fluid, such as a gas. In some examples, the devices 800 can further comprise a first precursor source (not shown) fluidly coupled to the chamber 842 via the set of first conduits 820.

The second precursor 880 can, for example, comprise a III-group precursor, such as compound, element, or composition comprising B, Al, Ga, In, Tl, or a combination thereof. In some examples, the second precursor 880 can comprise a gallium species. In some examples, the second precursor 880 can comprise trimethylgallium, triethylgallium, or a combination thereof. The second precursor 880 can, for example, comprise a fluid, such as a gas. In some examples, the devices 800 can further comprise a second precursor source (not shown) fluidly coupled to the chamber 842 via the set of second conduits 830.

In some examples, the device 800 is configured to deposit a group III oxide semiconductor, such that the first precursor 870 comprises an oxygen containing precursor and the second precursor 880 comprises a III-group precursor.

In some examples, the device 800 is configured to deposit a group II-VI semiconductor material, such that the first precursor 870 comprises a VI-group precursor (e.g., a compound/composition/element comprising O, S, Se, Te, or a combination thereof) and the second precursor 880 comprises a II-group precursor (e.g., a compound/composition/element comprising Be, Mg, Ca, Sr, Ba, Zn, Cd, Hg, or a combination thereof).

In some examples, the device 800 is configured to deposit a group II-IV-$V_2$ semiconductor, such that the first precursor 870 comprises a V-group precursor (e.g., a compound, element, or composition comprising N, P, As, Sb, Bi, or a combination thereof) and the second precursor 880 comprises a mixture of a II-group precursor (e.g., a compound/composition/element comprising Be, Mg, Ca, Sr, Ba, Zn, Cd, Hg, or a combination thereof) and a IV-group precursor (e.g., a compound/composition/element comprising C, Si, Ge, Sn, Pb, or a combination thereof).

In some examples, the device 800 is configured to introduce the first precursor 870 into the chamber 842 continuously or intermittently. In some examples, the device 800 is configured to introduce the second precursor 880 continuously or intermittently.

In some examples, the device 800 is configured to introduce the first precursor 870 and the second precursor 880 into the chamber 842 alternately. In some examples, the device 800 is configured to introduce the first precursor 870 and the second precursor 880, wherein at least a portion of the introduction of the second precursor 880 is concurrent with at least a portion of the introduction of the first precursor 870, or vice versa. In some examples, the device 800 is configured to introduce the first precursor 870 and the second precursor 880 to the chamber simultaneously.

In some examples, the outlets 826 of the set of first conduits 820, the outlets 836 of the set of second conduits 830, or a combination thereof are further configured to introduce a dopant (e.g., one or more dopants) into the chamber 842 toward the rotatable substrate support surface 850. The one or more dopants can be selected in view of the first precursor 870 and/or the second precursor 880. The one or more dopants can be, for example, a fluid, such as a gas. In some examples, the one or more dopants can comprise an n-type dopant (e.g., silane ($SiH_4$), germane ($GeH_4$), disilane ($Si_2H_6$)), a p-type dopant (e.g., bis(cyclopentadienyl)magnesium ($Cp_2Mg$), bis(methylcyclopentadienyl)magnesium (($MeCp)_2Mg$)), or a combination thereof. In some examples, the one or more dopants can comprise silane ($SiH_4$), germane ($GeH_4$), disilane($Si_2H_6$), bis(cyclopentadienyl)magnesium ($Cp_2Mg$), bis(methylcyclopentadienyl)magnesium (($MeCp)_2Mg$), or a combination thereof. The one or more dopants can, for example, be mixed with the first precursor 870 and/or the second precursor 880 prior to introduction into the chamber 842. In some examples, the device 800 is configured to introduce the first precursor 870, the second precursor 880, and the one or more dopants into the chamber 842 consecutively in turn. In some examples, the device 800 is configured to introduce the first precursor 870 and the one or more dopants, wherein at least a portion of the introduction of the one or more dopants is concurrent with at least a portion of the introduction of the first precursor 870, or vice versa. In some examples, the device 800 is configured to introduce the second precursor 880 and the one or more dopants, wherein at least a portion of the introduction of the one or more dopants is concurrent with at least a portion of the introduction of the second precursor 880, or vice versa. In some examples, the device is configured to introduce the first precursor 870, the second precursor 880, and the one or more dopants into the chamber 842 simultaneously.

In some examples, the outlets 826 of the set of first conduits 820, the outlets 836 of the set of second conduits 830, or a combination thereof are further configured to introduce a carrier gas (e.g., one or more carrier gases) into the chamber 842 toward the rotatable substrate support surface 850. The one or more carrier gases can be selected in view of the first precursor 870, the second precursor 880, the one or more dopants when present, or a combination thereof. The one or more carrier gases can be, for example, argon, helium, $H_2$, $N_2$, and the like, or combinations thereof. The one or more carrier gases can, for example, be mixed with the first precursor 870, the second precursor 880, the one or more dopants when present, or a combination thereof prior to introduction into the chamber 842. In some examples, the device 800 is configured to introduce the first precursor 870, the second precursor 880, the one or more dopants when present, or a combination thereof concurrently with at least a portion of the introduction of the one or more carrier gases.

The devices 800 described herein can further comprise or be assembled with a variety of additional components. For example, the devices 800 can be assembled together with, or in some examples can further comprise, the wall 840 defining the chamber 842. The wall 840 can, in some examples be hollow such that a cooling medium can be included within the wall 840, for example to dissipate heat (e.g., from the heater, from the laser energy, or a combination thereof)). In some examples, the cooling medium can comprise water.

The devices 800 can, for example, be assembled together with, or in some examples can further comprise, the rotatable substrate support surface 850. The size and shape of the rotatable substrate support surface 850 can be selected in view of the size and shape of the chamber 842. The rotatable substrate support surface 850 can support one or more substrates (e.g., 2 or more, 3 or more, 4 or more, 5 or more, 6 or more, 7 or more, 8 or more, 9 or more, 10 or more, 15 or more, 20 or more, 25 or more, 30 or more, 35 or more, 40 or more, 45 or more, 50 or more, 60 or more, 70 or more, 80 or more, 90 or more, 100 or more, 150 or more, 200 or more, 250 or more, 300 or more, 350 or more, 400 or more, 450 or more, 500 or more, 600 or more, 700 or more, 800 or more, 900 or more, 1000 or more, 1500 or more, or 2000 or more) to be coated with a material via laser-assisted metal-organic vapor deposition from the first precursor 870 and the second precursor 880 (and one or more dopants, if present) within the chamber 842. The number of substrates disposed on the rotatable substrate support surface 850 can be selected, for example, in view of the size of the one or more substrates and/or the size of the rotatable substrate support surface 850. The devices 800 can, for example, be configured to rotate the rotatable substrate support 850 surface to thereby provide a more uniform coating of the material on the one or more substrates via laser-assisted metal-organic vapor deposition.

The one or more substrates can have an average characteristic dimension. The average characteristic dimension of the one or more substrates can, for example, be 1 inch or more (e.g., 2 inches or more, 3 inches or more, 4 inches or more, 5 inches or more, 6 inches or more, 7 inches or more, 8 inches or more, 9 inches or more, 10 inches or more, 11 inches or more, 12 inches or more, 13 inches or more, 14 inches or more, 15 inches or more, 16 inches or more, 17 inches or more, 18 inches or more, 19 inches or more, 20 inches or more, 25 inches or more, 30 inches or more, or 35 inches or more). In some examples, the average characteristic dimension of the one or more substrates can be 36 inches or less (e.g., 35 inches or less, 30 inches or less, 25 inches or less, 20 inches or less, 19 inches or less, 18 inches or less, 17 inches or less, 16 inches or less, 15 inches or less, 14 inches or less, 13 inches or less, 12 inches or less, 11 inches or less, 10 inches or less, 9 inches or less, 8 inches or less, 7 inches or less, 6 inches or less, 5 inches or less, 4 inches or less, 3 inches or less, or 2 inches or less). The average characteristic dimension of the one or more substrates can range from any of the minimum values described above to any of the maximum values described above. For example, the average characteristic dimension of the one or more substrates can be from 1 inch to 36 inches (e.g., from 1 inch to 18 inches, from 18 inches to 36 inches, from 1 inch to 6 inches, from 6 inches to 12 inches, from 12 inches to 18 inches, from 18 inches to 24 inches, from 24 inches to 30 inches, from 30 inches to 36 inches, from 2 inches to 36 inches, from 1 inch to 30 inches, from 2 inches to 30 inches, from 1 inch to 18 inches, from 1 inch to 12 inches, or from 2 inches to 8 inches).

The one or more substrates can be any shape, such as a regular shape, an irregular shape, an isotropic shape, or an anisotropic shape. In some examples, the shape of the one or more substrates can be substantially circular, ovate, ovoid, elliptic, triangular, rectangular, polygonal, etc. In some examples, the shape of the one or more substrates can be substantially circular, such that the average characteristic dimension is the diameter.

The one or more substrates can comprise any suitable material. Examples of suitable substrates include, but are not limited to, bulk GaN, GaN template, sapphire, $Al_2O_3$, $LiAlO_2$, Si, SiC, zinc oxide, bulk AlN, AlN on sapphire template, and combinations thereof.

The devices 800 can, for example, be assembled together with, or in some examples can further comprise, the laser device 860 for producing a plurality of laser beams 862. The laser device 860 can, for example, comprise one or more lasers. In some examples, the laser device 860 can further comprise a laser distributor for splitting each of the one or more lasers into a plurality of laser beams 862. The wavelength(s) of the one or more lasers can be selected, for example, in view of the identity of the first precursor 870. In some examples, the one or more lasers can comprise an infrared laser. In some examples, the one or more lasers can comprise a $CO_2$ laser, such as a tunable $CO_2$ laser. In some examples, the laser device 860 and/or the plurality of laser injectors 810 can further comprise one or more windows, wherein the plurality of laser beams 862 traverse the one or more windows before entering the chamber 842. The one or more windows can comprise any suitable material, such as, for example, ZnSe, ZnS, NaCl, KBr, and combinations thereof.

Figure 13:
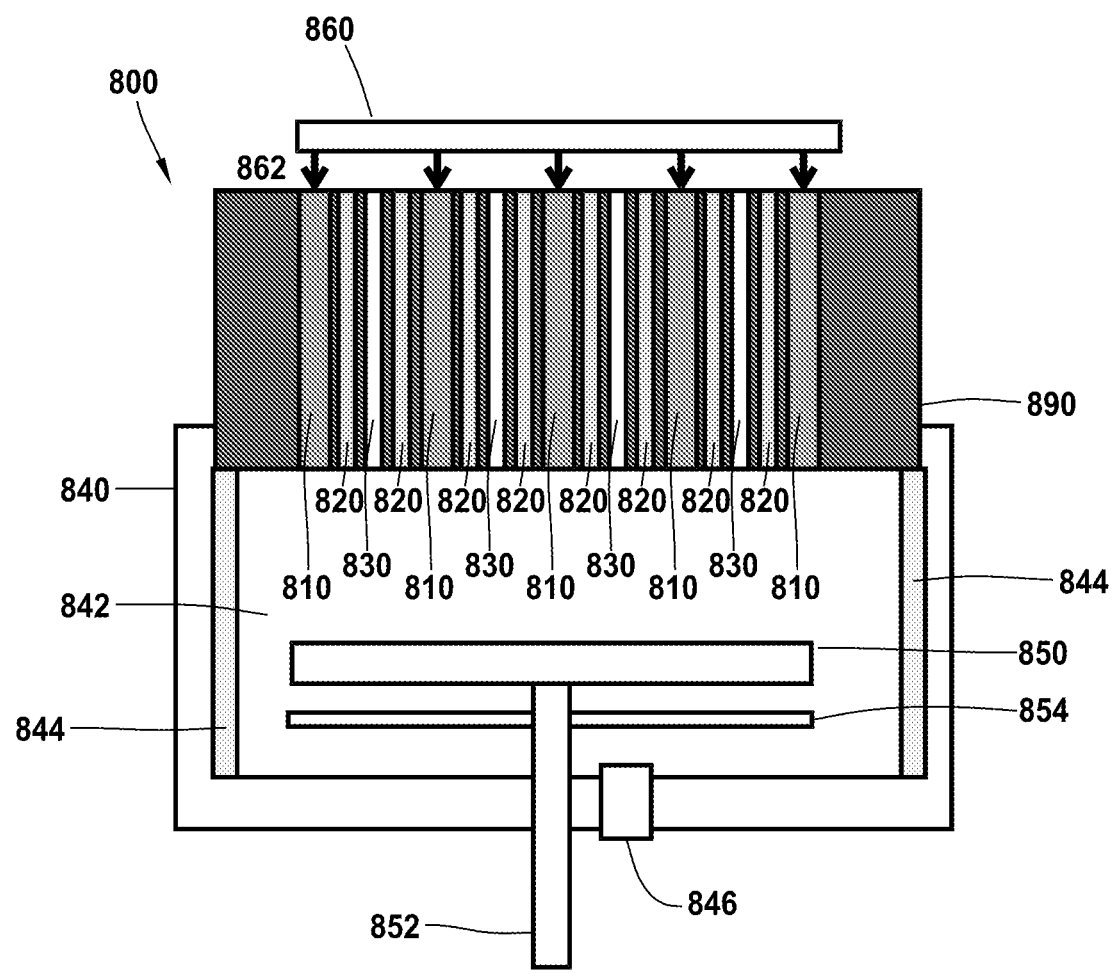
FIG. 13 is a schematic cross-sectional plan view of an example device as disclosed herein according to one implementation.
Figure 14:
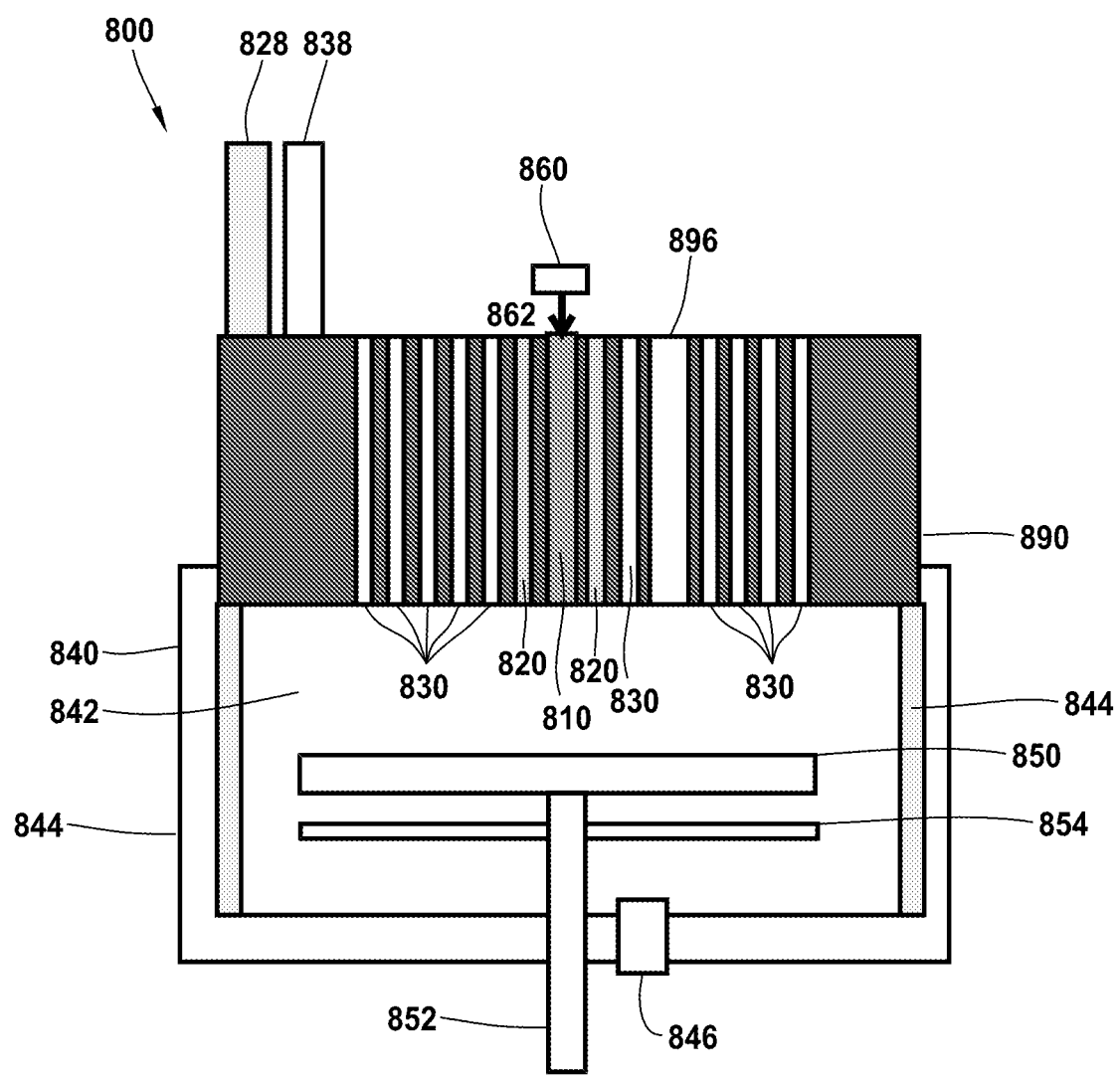
FIG. 14 is a schematic cross-sectional plan view, orthogonal to that of FIG. 13, of the example device shown in FIG. 13.

The devices 800 described herein can further comprise or be assembled with a variety of additional components, for example as shown in FIG. 13 and FIG. 14. Though some of the elements are only shown in FIG. 13 and FIG. 14, any of the one or more additional elements or any combination of the one or more additional elements shown in FIG. 13 and FIG. 14 can be present in any of the other embodiments of the devices 800 described herein.

Referring now to FIG. 13 and FIG. 14, in some examples, the interior surface of wall 840 (e.g., the surface of the wall 840 within the chamber 842) can further comprise a coating 844, wherein the coating 844 can comprise a material that can absorb at least a portion of the laser beam energy. Though the coating 844 is only shown in FIG. 13 and FIG. 14, the coating 844 can be present in any of the other embodiments of the devices 800 described herein.

In some examples, the wall 840 can further comprise an exhaust port 846 which fluidly couples the chamber 842 with an external environment. Though the exhaust port 846 is only shown in FIG. 13 and FIG. 14, the exhaust port 846 can be present in any of the other embodiments of the devices 800 described herein.

In some examples, the rotatable substrate support surface 850 can be coupled to or further comprise a rotary spindle 852. For example, the rotatable substrate support surface 850 can be centrally mounted on the rotary spindle 852, and the rotary spindle 852 can be rotated to rotate the rotatable substrate support surface 850. In some examples, the rotary spindle 852 can further be coupled to a means for rotating the rotary spindle 852. The devices 800 can, for example, be configured to rotate the rotary spindle 852 and thus rotate the rotatable substrate support surface 850 to thereby provide a more uniform coating of the material on the one or more substrates via laser-assisted metal-organic vapor deposition. Though the rotary spindle 852 is only shown in FIG. 13 and FIG. 14, the rotary spindle 852 can be present in any of the other embodiments of the devices 800 described herein.

In some examples, the devices 800 can further be assembled with, or in some examples can further comprise, a heater 854 thermally coupled to the rotatable substrate support surface 850 within the chamber 842. The heater 854 can, for example, be located below the rotatable substrate support surface 850, and optionally spaced apart from the rotatable substrate support surface 850, relative to the position of the outlets 826 of the set of first conduits 820, the outlets 836 of the set of second conduits 830, and the outlets 816 of the plurality of laser injectors 810.

In some examples, the devices 800 can further comprise a means for controlling the temperature of (e.g., heating) the heater 854. In some examples, the heater 854 can be heated such that the one or more substrates is at a temperature of 100° C. or more (e.g., 150° C. or more, 200° C. or more, 250° C. or more, 300° C. or more, 350° C. or more, 400° C. or more, 450° C. or more, 500° C. or more, 550° C. or more, 600° C. or more, 650° C. or more, 700° C. or more, 750° C. or more, 800° C. or more, 850° C. or more, 900° C. or more, 950° C. or more, 1000° C. or more, 1100° C. or more, 1200° C. or more, 1300° C. or more, 1400° C. or more, 1500° C. or more, 1600° C. or more, 1700° C. or more, 1800° C. or more, or 1900° C. or more). In some examples, the heater 854 can be heated such that the one or more substrates is at a temperature of 2000° C. or less (e.g., 1900° C. or less, 1800° C. or less, 1700° C. or less, 1600° C. or less, 1500° C. or less, 1400° C. or less, 1300° C. or less, 1200° C. or less, 1100° C. or less, 1000° C. or less, 950° C. or less, 900° C. or less, 850° C. or less, 800° C. or less, 750° C. or less, 700° C. or less, 650° C. or less, 600° C. or less, 550° C. or less, 500° C. or less, 450° C. or less, 400° C. or less, 350° C. or less, 300° C. or less, 250° C. or less, 200° C. or less, or 150° C. or less). The temperature at which the one or more substrates are heated by the heater 854 can range from any of the minimum values described above to any of the maximum values described above. For example, the heater 854 can be heated such that the one or more substrates is at a temperature of from 100° C. to 2000° C. (e.g., from 100° C. to 1000° C., from 1000° C. to 2000° C., from 100° C. to 500° C., from 500° C. to 900° C., from 900° C. to 1300° C., from 1300° C. to 1700° C., from 1700° C. to 2000° C., from 400° C. to 2000° C., from 100° C. to 1500° C., or from 400° C. to 1500° C.). Though the heater 854 is only shown in FIG. 13 and FIG. 14, the heater 854 can be present in any of the other embodiments of the devices 800 described herein.

The devices 800 can, for example, be assembled together with, or in some examples can further comprise, an in-situ monitor, such as a camera and/or a window. In some examples, the in-situ monitor can comprise a window or viewport 896 defined by the source distributor 890. The in-situ monitor can allow for visual inspection inside the chamber 842 when the device 800 is assembled. Though the viewport 896 is only shown in FIG. 13 and FIG. 14, the viewport 896 can be present in any of the other embodiments of the devices 800 described herein.

The devices 800 can, for example, be assembled together with, or in some examples can further comprise, a first precursor conduit 828 fluidly connected to the chamber 842 via the set of first conduits 820. For example, the first precursor conduit 828 can be fluidly connected to each of the inlets 824 of the set of first conduits 820, for example via the source distributor 890. The first precursor conduit 828 can, for example, fluidly connect a first precursor source (not shown) to the chamber 842 via the set of first conduits 820. The first precursor conduit 828 can define an inlet, an outlet opposite and spaced apart from the inlet, and a path for fluid flow extending from the inlet to the outlet, wherein the inlet of the first precursor conduit 828 can be fluidly coupled to the first precursor source and the outlet of the first precursor conduit 828 can be fluidly connected to each of the inlets 826 of the set of first conduits 820, for example via the source distributor 890. Though the first precursor conduit 828 is only shown in FIG. 13 and FIG. 14, the first precursor conduit 828 can be present in any of the other embodiments of the devices 800 described herein.

The devices 800 can, for example, be assembled together with, or in some examples can further comprise, a second precursor conduit 838 fluidly connected to the chamber 842 via the set of second conduits 830. For example, the second precursor conduit 838 can be fluidly connected to each of the inlets 834 of the set of second conduits 830, for example via the source distributor 890. The second precursor conduit 838 can, for example, fluidly connect a second precursor source (not shown) to the chamber 842 via the set of second conduits 830. The second precursor conduit 838 can define an inlet, an outlet opposite and spaced apart from the inlet, and a path for fluid flow extending from the inlet to the outlet, wherein the inlet of the second precursor conduit 838 can be fluidly coupled to the second precursor source and the outlet of the second precursor conduit 838 can be fluidly connected to each of the inlets 834 of the set of second conduits 830, for example via the source distributor 890. Though the second precursor conduit 838 is only shown in FIG. 13 and FIG. 14, the second precursor conduit 838 can be present in any of the other embodiments of the devices 800 described herein.

Figure 15:
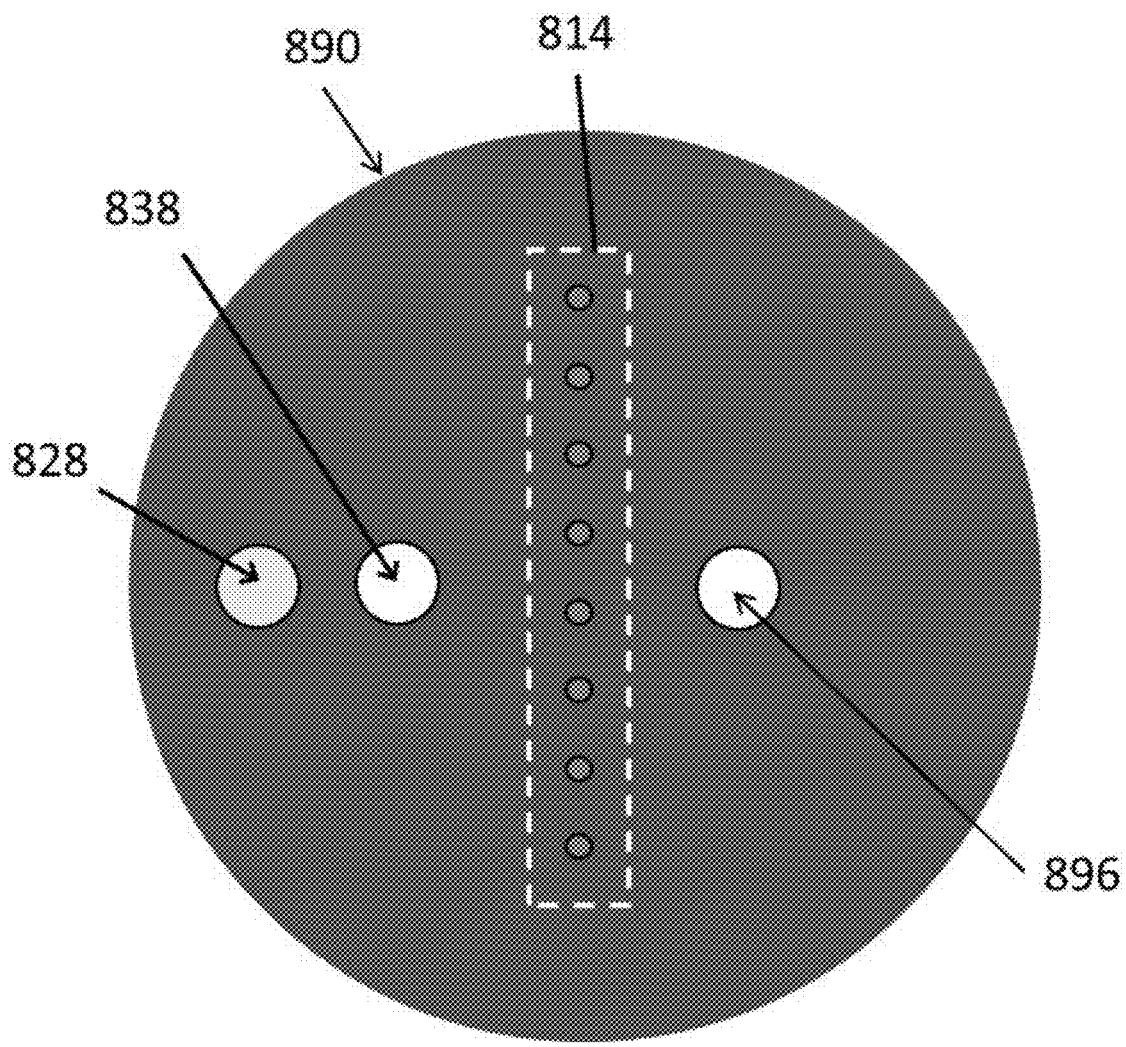
FIG. 15 is a schematic cross-sectional plan view of the first (e.g., top) surface of the source distributor showing the arrangement of the first precursor conduit, the second precursor conduit, the viewport, and the inlets of the plurality of laser injectors in one implementation of the example device shown in FIG. 13 and FIG. 14.
Figure 16:
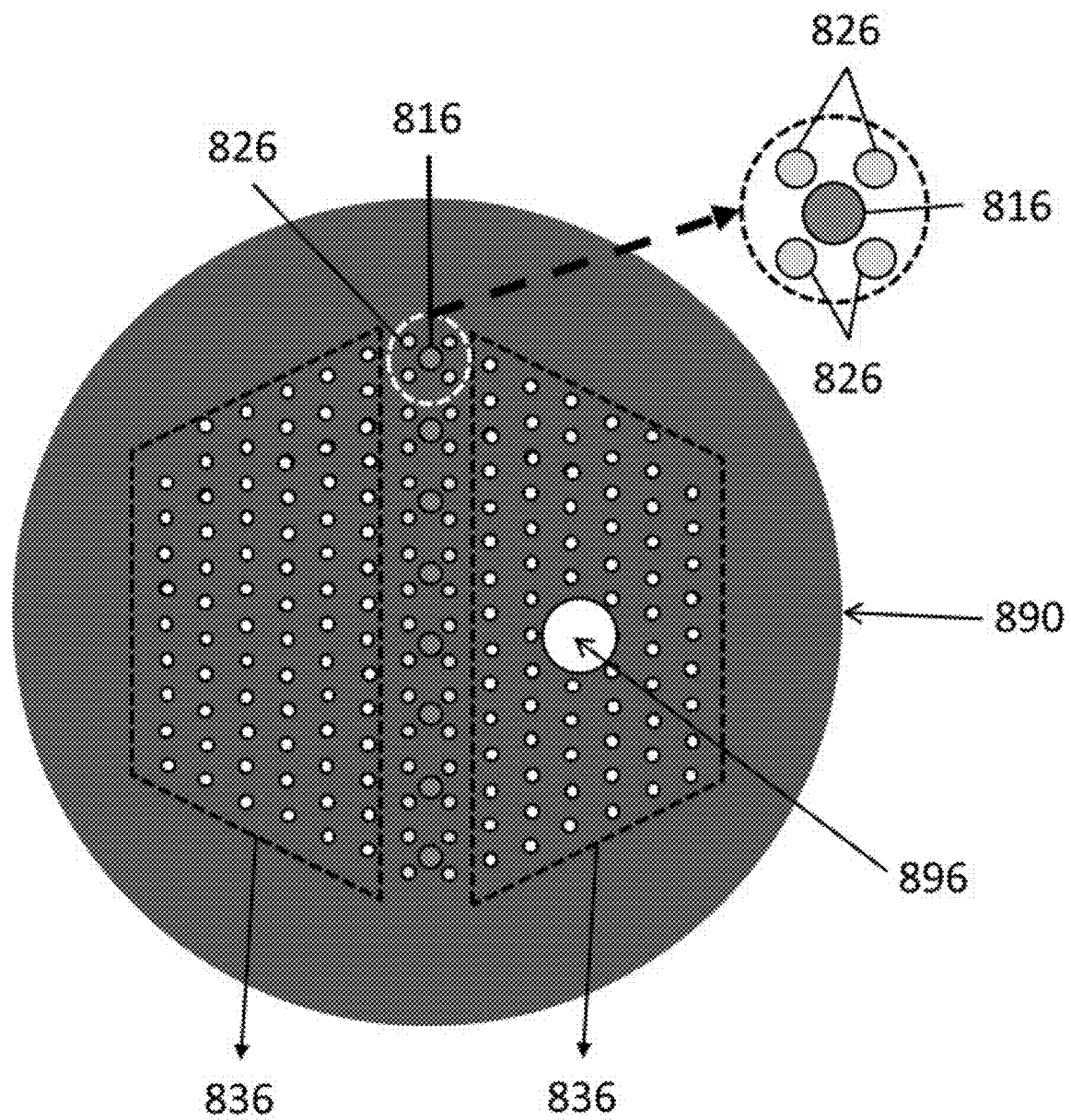
FIG. 16 is a schematic cross-sectional plan view of the second (e.g., bottom) surface of the source distributor (a view of the opposite surface of the source distributor shown in FIG. 15) showing the arrangement of the outlets of the set of first conduits, the outlets of the set of second conduits, the outlets of the plurality of laser injectors, and the viewport in one implementation of the example device shown in FIG. 13-FIG. 15.

FIG. 15 is a schematic cross-sectional plan view of the example device 800 shown in FIG. 13 and FIG. 14, showing the first surface (e.g., top surface) of the source distributor 890 and the arrangement of the inlet 814 of the plurality of laser injectors 810, the first precursor conduit 828, the second precursor conduit 838, and the viewport 896 in one implementation of the device 800. FIG. 16 is a schematic cross-sectional plan view of the example device 800 shown in FIG. 13 and FIG. 14, showing the second surface (e.g., bottom surface) of the source distributor 890 (e.g., the opposite surface as shown in FIG. 15) and the arrangement of the outlets 826 of the set of first conduits 820, the outlets 836 of the set of second conduits 830, the outlets 816 of the plurality of laser injectors 810, and the viewport 896 in one implementation of the device 800.

Figure 17:
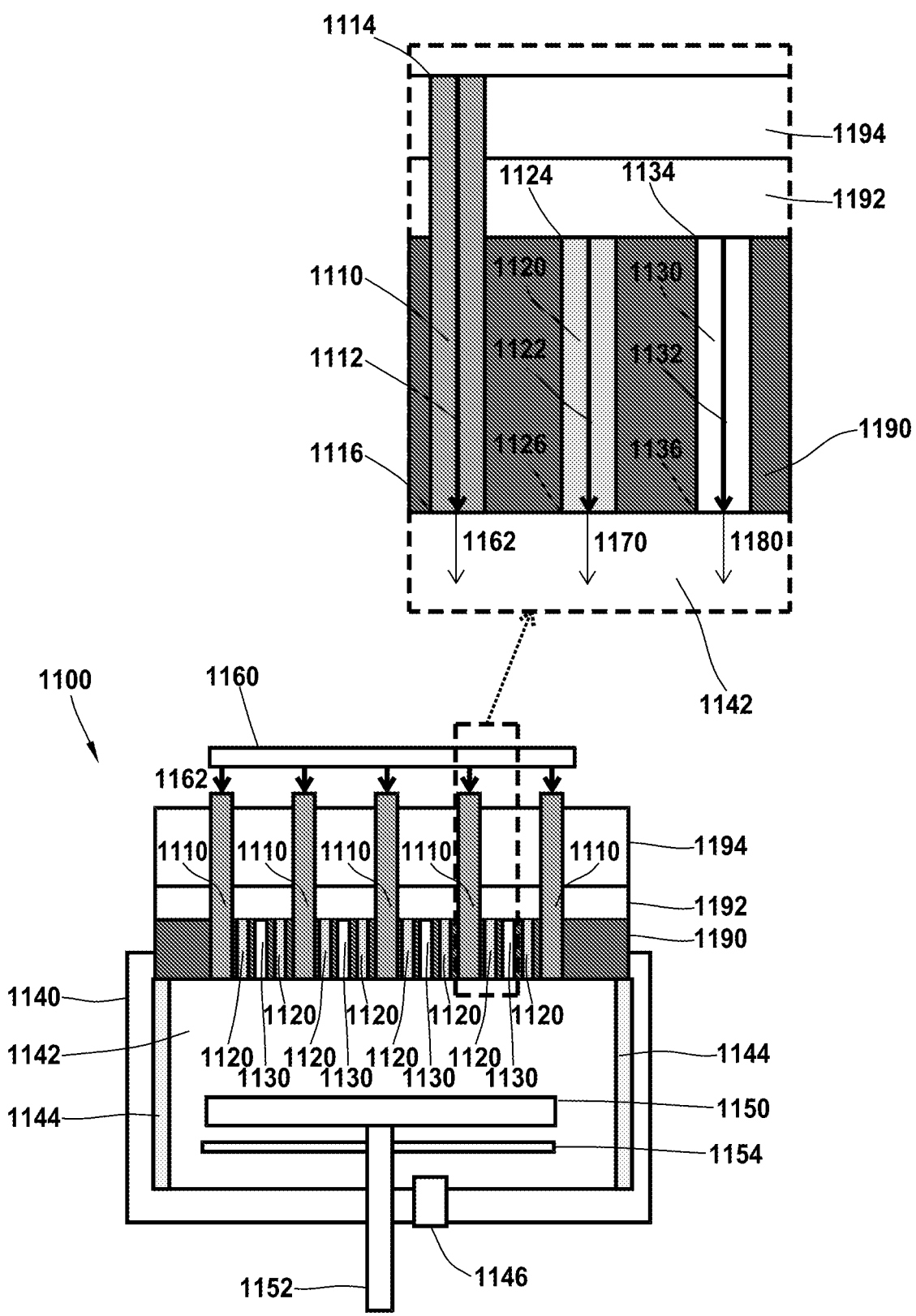
FIG. 17 is a cross-sectional plan view of a schematic of an example device as disclosed herein according to one implementation.
Figure 18:
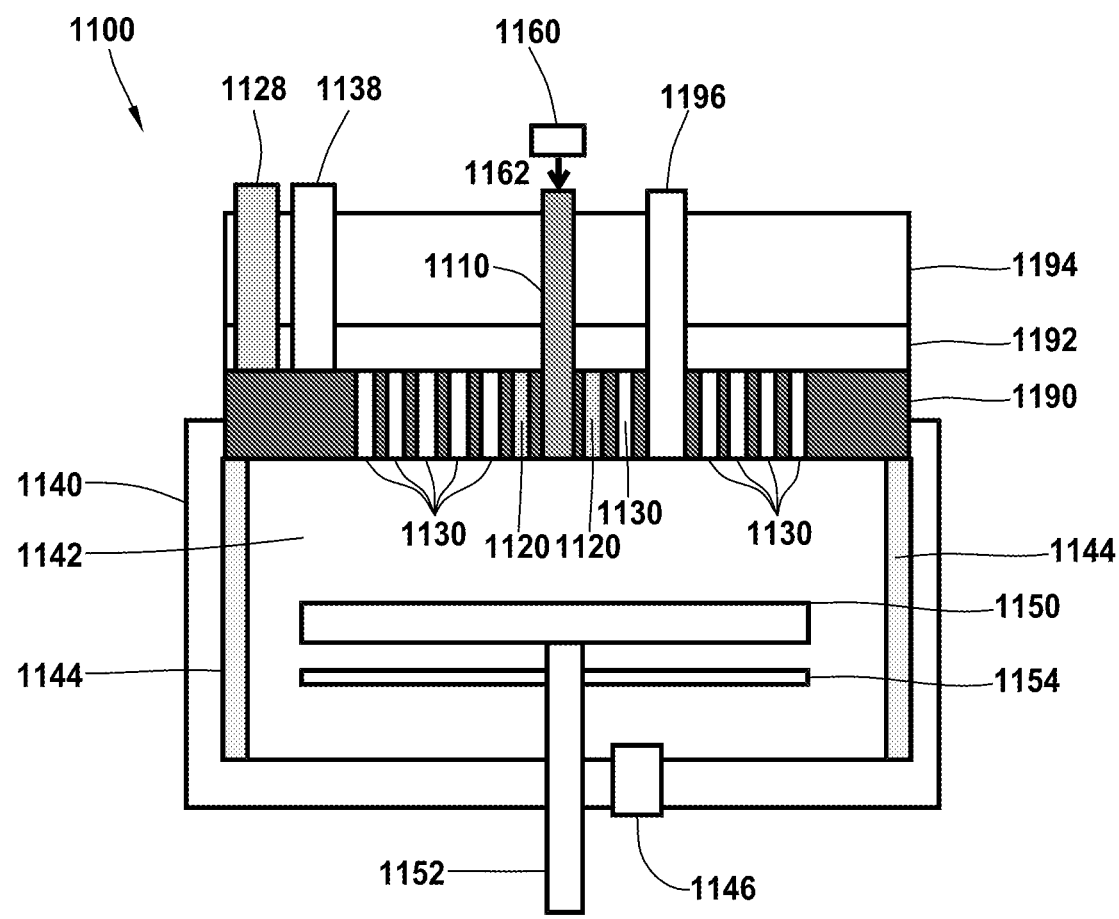
FIG. 18 is a schematic cross-sectional plan view, orthogonal to that of FIG. 17, of the example device shown in FIG. 17.

FIG. 17 and FIG. 18 show two orthogonal views of a laser-assisted metal-organic chemical vapor deposition (MOCVD) device 1100 according to one implementation described herein. Referring now to FIG. 17 and FIG. 18, the devices 1100 comprise: a wall 1140 defining a chamber 1142, a rotatable substrate support surface 1150 disposed within the chamber 1142, and a laser device 1160 for producing a plurality of laser beams 1162.

The wall 1140 can, in some examples be hollow such that a cooling medium can be included within the wall 1140, for example to dissipate heat (e.g., from the heater, from the laser energy, or a combination thereof)). In some examples, the cooling medium can comprise water. The devices 1100 further comprise, in some examples, a coating 1144 on the interior surface of the wall 1140 (e.g., the surface of the wall 1140 within the chamber 1142). The coating 1144 can comprise a material that can absorb at least a portion of the laser beam energy. The devices 1100 further comprise, in some examples, an exhaust port 1146 in the wall 1140 which fluidly couples the chamber 1142 with an external environment.

The size and shape of the rotatable substrate support surface 1150 can be selected in view of the size and shape of the chamber 1142. The rotatable substrate support surface 1150 can support one or more substrates (e.g., 2 or more, 3 or more, 4 or more, 5 or more, 6 or more, 7 or more, 8 or more, 9 or more, 10 or more, 15 or more, 20 or more, 25 or more, 30 or more, 35 or more, 40 or more, 45 or more, 50 or more, 60 or more, 70 or more, 80 or more, 90 or more, 100 or more, 150 or more, 200 or more, 250 or more, 300 or more, 350 or more, 400 or more, 450 or more, 500 or more, 600 or more, 700 or more, 800 or more, 900 or more, 1000 or more, 1500 or more, or 2000 or more) to be coated with a material via laser-assisted metal-organic vapor deposition from a first precursor 1170 and a second precursor 1180 (and one or more dopants, if present) within the chamber 1142. The number of substrates disposed on the rotatable substrate support surface 1150 can be selected, for example, in view of the size of the one or more substrates and/or the size of the rotatable substrate support surface 1150. The devices 1100 can, for example, be configured to rotate the rotatable substrate support 1150 surface to thereby provide a more uniform coating of the material on the one or more substrates via laser-assisted metal-organic vapor deposition.

The one or more substrates can have an average characteristic dimension. The average characteristic dimension of the one or more substrates can, for example, be 1 inch or more (e.g., 2 inches or more, 3 inches or more, 4 inches or more, 5 inches or more, 6 inches or more, 7 inches or more, 8 inches or more, 9 inches or more, 10 inches or more, 11 inches or more, 12 inches or more, 13 inches or more, 14 inches or more, 15 inches or more, 16 inches or more, 17 inches or more, 18 inches or more, 19 inches or more, 20 inches or more, 25 inches or more, 30 inches or more, or 35 inches or more). In some examples, the average characteristic dimension of the one or more substrates can be 36 inches or less (e.g., 35 inches or less, 30 inches or less, 25 inches or less, 20 inches or less, 19 inches or less, 18 inches or less, 17 inches or less, 16 inches or less, 15 inches or less, 14 inches or less, 13 inches or less, 12 inches or less, 11 inches or less, 10 inches or less, 9 inches or less, 8 inches or less, 7 inches or less, 6 inches or less, 5 inches or less, 4 inches or less, 3 inches or less, or 2 inches or less). The average characteristic dimension of the one or more substrates can range from any of the minimum values described above to any of the maximum values described above. For example, the average characteristic dimension of the one or more substrates can be from 1 inch to 36 inches (e.g., from 1 inch to 18 inches, from 18 inches to 36 inches, from 1 inch to 6 inches, from 6 inches to 12 inches, from 12 inches to 18 inches, from 18 inches to 24 inches, from 24 inches to 30 inches, from 30 inches to 36 inches, from 2 inches to 36 inches, from 1 inch to 30 inches, from 2 inches to 30 inches, from 1 inch to 18 inches, from 1 inch to 12 inches, or from 2 inches to 8 inches).

The one or more substrates can be any shape, such as a regular shape, an irregular shape, an isotropic shape, or an anisotropic shape. In some examples, the shape of the one or more substrates can be substantially circular, ovate, ovoid, elliptic, triangular, rectangular, polygonal, etc. In some examples, the shape of the one or more substrates can be substantially circular, such that the average characteristic dimension is the diameter.

The one or more substrates can comprise any suitable material. Examples of suitable substrates include, but are not limited to, bulk GaN, GaN template, sapphire, $Al_2O_3$, $LiAlO_2$, Si, SiC, zinc oxide, bulk AlN, AlN on sapphire template, and combinations thereof.

In some examples, the rotatable substrate support surface 1150 can be coupled to or further comprise a rotary spindle 1152. For example, the rotatable substrate support surface 1150 can be centrally mounted on the rotary spindle 1152, and the rotary spindle 1152 can be rotated to rotate the rotatable substrate support surface 1150. In some examples, the rotary spindle 1152 can further be coupled to a means for rotating the rotary spindle 1152. The devices 1100 can, for example, be configured to rotate the rotary spindle 1152 and thus rotate the rotatable substrate support surface 1150 to thereby provide a more uniform coating of the material on the one or more substrates via laser-assisted metal-organic vapor deposition.

The devices 1100 further comprise, in some examples, a heater 1154 thermally coupled to the rotatable substrate support surface 1150 within the chamber 1142. The heater 1154 can, for example, be located below the rotatable substrate support surface 1150, and optionally spaced apart from the rotatable substrate support surface 1150, relative to the position of the outlets 1126 of the set of first conduits 1120, the outlets 1136 of the set of second conduits 1130, and the outlets 1116 of the plurality of laser injectors 1110. In some examples, the devices 1100 can further comprise a means for controlling the temperature of (e.g., heating) the heater 1154. In some examples, the heater 1154 can be heated such that the one or more substrates is at a temperature of 100° C. or more (e.g., 150° C. or more, 200° C. or more, 250° C. or more, 300° C. or more, 350° C. or more, 400° C. or more, 450° C. or more, 500° C. or more, 550° C. or more, 600° C. or more, 650° C. or more, 700° C. or more, 750° C. or more, 800° C. or more, 850° C. or more, 900° C. or more, 950° C. or more, 1000° C. or more, 1100° C. or more, 1200° C. or more, 1300° C. or more, 1400° C. or more, 1500° C. or more, 1600° C. or more, 1700° C. or more, 1800° C. or more, or 1900° C. or more). In some examples, the heater 1154 can be heated such that the one or more substrates is at a temperature of 2000° C. or less (e.g., 1900° C. or less, 1800° C. or less, 1700° C. or less, 1600° C. or less, 1500° C. or less, 1400° C. or less, 1300° C. or less, 1200° C. or less, 1100° C. or less, 1000° C. or less, 950° C. or less, 900° C. or less, 850° C. or less, 800° C. or less, 750° C. or less, 700° C. or less, 650° C. or less, 600° C. or less, 550° C. or less, 500° C. or less, 450° C. or less, 400° C. or less, 350° C. or less, 300° C. or less, 250° C. or less, 200° C. or less, or 150° C. or less). The temperature at which the one or more substrates are heated by the heater 1154 can range from any of the minimum values described above to any of the maximum values described above. For example, the heater 1154 can be heated such that the one or more substrates is at a temperature of from 100° C. to 2000° C. (e.g., from 100° C. to 1000° C., from 1000° C. to 2000° C., from 100° C. to 500° C., from 500° C. to 900° C., from 900° C. to 1300° C., from 1300° C. to 1700° C., from 1700° C. to 2000° C., from 400° C. to 2000° C., from 100° C. to 1500° C., or from 400° C. to 1500° C.).

The laser device 1160 can, for example, comprise one or more lasers. In some examples, the laser device 1160 can further comprise a laser distributor for splitting each of the one or more lasers into a plurality of laser beams 1162. The wavelength(s) of the one or more lasers can be selected, for example, in view of the identity of the first precursor 1170. In some examples, the one or more lasers can comprise an infrared laser. In some examples, the one or more lasers can comprise a $CO_2$ laser, such as a tunable $CO_2$ laser. In some examples, the laser device 1160 and/or the plurality of laser injectors 1110 can further comprise one or more windows, wherein the plurality of laser beams 1162 traverse the one or more windows before entering the chamber 1142. The one or more windows can comprise any suitable material, such as, for example, ZnSe, ZnS, NaCl, KBr, and combinations thereof.

The devices 1100 further comprise a plurality of laser injectors 1110, wherein each of the plurality of laser injectors 1110 defines an inlet 1114, an outlet 1116 opposite and spaced apart from the inlet 1114, and an optical path 1112 extending from the inlet 1114 to the outlet 1116. The plurality of laser injectors 1110 are configured such that the outlet 1116 of each of the plurality of laser injectors 1110 directs one of the plurality of laser beams 1162 onto the rotatable substrate support surface 1150 disposed within the chamber 1142.

The plurality of laser injectors 1110 can include two or more laser injectors 1110 (e.g., 3 or more, 4 or more, 5 or more, 6 or more, 7 or more, 8 or more, 9 or more, 10 or more, 15 or more, 20 or more, 25 or more, 30 or more, 40 or more, 50 or more, 60 or more, 70 or more, 80 or more, 90 or more, 100 or more, 150 or more, 200 or more, 250 or more, 300 or more, 350 or more, 400 or more, 450 or more, 500 or more, 600 or more, 700 or more, 800 or more, 900 or more, or 1000 or more). The number of laser injectors 1110 can be selected in view of the size of the chamber 1142, the size of the rotatable substrate support surface 1150, or a combination thereof.

The plurality of laser injectors 1110 can be positioned in an ordered array. The ordered array can be designed, for example, in view of the number of laser injectors 1110, the size of the chamber 1142, the size of the rotatable substrate support surface 1150, and the like, or a combination thereof. In some examples, the plurality of laser injectors 1110 are positioned in a line. In some examples, the ordered array can be designed so as to provide a uniform distribution of lasers over the rotatable substrate support surface as the rotatable substrate support surface is rotated.

The cross-sectional shape of each of the plurality of laser injectors 1110 in a plane perpendicular to the central longitudinal axis of said laser injector 1110 can be any shape, such as a regular shape, an irregular shape, an isotropic shape, or an anisotropic shape. In some examples, the cross-sectional shape of the plurality of laser injectors 1110 can be substantially circular, ovate, ovoid, elliptic, triangular, rectangular, polygonal, etc. In some examples, the cross-sectional shape of the plurality of laser injectors 1110 can be substantially circular.

The outlets 1116 of each of the plurality of laser injectors 1110 can be any shape, such as a regular shape, an irregular shape, an isotropic shape, or an anisotropic shape. In some examples, the outlets 1116 of the plurality of laser injectors 1110 can have a shape that is substantially circular, ovate, ovoid, elliptic, triangular, rectangular, polygonal, etc. In some examples, the shape of the outlets 1116 of the plurality of laser injectors 1110 can be substantially circular. The outlets 1116 of each of the plurality of laser injectors 1110 can, for example, be the cross-section in a plane perpendicular to the longitudinal axis of said laser injector 1110, such that the shape of the outlet 1116 of each of the plurality of laser injectors 1110 can be the cross-sectional shape of each of the plurality of laser injectors 1110.

The plurality of laser injectors 1110 can be configured such that each of the laser beams 1162 has an average spot size on the rotatable substrate support surface 1150. The plurality of laser injectors 1110 can, for example, be configured such that the average spot size of the plurality of laser beams 1162 on the rotatable substrate support surface 1150 can be 1 millimeters (mm) or more (e.g., 5 mm or more, 10 mm or more, 15 mm or more, 20 mm or more, 25 mm or more, 30 mm or more, 35 mm or more, 40 mm or more, 45 mm or more, 50 mm or more, 60 mm or more, 70 mm or more, 80 mm or more, or 90 mm or more). In some examples, the plurality of laser injectors 1110 can be configured such that the average spot size of the plurality of laser beams 1162 on the rotatable substrate support surface 1150 can be 100 mm or less (e.g., 90 mm or less, 80 mm or less, 70 mm or less, 60 mm or less, 50 mm or less, 45 mm or less, 40 mm or less, 35 mm or less, 30 mm or less, 25 mm or less, 20 mm or less, 15 mm or less, 10 mm or less, or 5 mm or less). The average spot size of the plurality of laser beams 1162 on the rotatable substrate support surface 1150 can range from any of the minimum values described above to any of the maximum values described above. For example, the plurality of laser injectors 1110 can be configured such that the average spot size of the plurality of laser beams 1162 on the rotatable substrate support surface 1150 can be from 1 mm to 100 mm (e.g., from 1 mm to 50 mm, from 50 mm to 100 mm, from 1 mm to 20 mm, from 20 mm to 40 mm, from 40 mm to 60 mm, from 60 mm to 80 mm, from 80 mm to 100 mm, from 5 mm to 100 mm, from 1 mm to 90 mm, from 5 mm to 90 mm, from 1 mm to 80 mm, from 1 mm to 60 mm, or from 5 mm to 50 mm).

Each of the plurality of laser injectors 1110 can, for example, include one or more lenses 1118 for expanding each of the laser beams 1162 onto the rotatable substrate support surface 1150, e.g., such that each of the laser beams 1162 has the average spot size on the rotatable substrate support surface 1150. The one or more lenses 1118 can be any type of lens, such as a simple lens, a compound lens, a spherical lens, a toric lens, a biconvex lens, a plano-convex lens, a plano-concave lens, a negative meniscus lens, a positive meniscus lens, a biconcave lens, a converging lens, a diverging lens, a cylindrical lens, a Fresnel lens, a lenticular lens, a gradient index lens, or a combination thereof. The one or more lenses 1118 can be selected to control the spot size of each of the laser beams 1162 on the rotatable substrate support surface 1150, the uniformity of each of the laser beams 1162 (e.g., with respect to intensity) on the rotatable substrate support surface 1150, or a combination thereof.

For example, each of the plurality of laser injectors 1110 can include a convex lens 1118a and a concave lens 1118b for expanding each of the laser beams 1162 onto the rotatable substrate support surface 1150. The convex lens 1118a can reduce the waist of the incident laser beam 1162 from $\omega_0$ to $\omega_1$ and increase the divergence angle of the incident laser beam 1162. The concave lens 1118b can be located at the focal point of the convex lens 1118a, $f_1$, to expand the laser beam 1162 size to $\omega_2$ on the rotatable substrate support surface 1150, e.g., the spot size. The concave lens 1118b can also improve the uniformity of the laser beam 1162 inside the Gaussian laser spot on the rotatable substrate support surface 1150.

The number of laser injectors 1110, the arrangement of the laser injectors 1110, the cross-sectional shape of the laser injectors 1110, the number and/or types of lenses in the laser injectors 1110, the average spot size of the laser beams 1162 on the rotatable substrate support surface 1150, or a combination thereof can be selected, for example, in view of the wavelength(s) of the laser beams 1162, the intensity of the laser beams 1162 within the chamber 1142, the size of the chamber 1142, the size of the rotatable substrate support surface 1150, or a combination thereof.

The devices 1100 further comprise a set of first conduits 1120, wherein each of the first conduits 1120 defines an inlet 1124, an outlet 1126 opposite and spaced apart from the inlet 1124, and a path for fluid flow 1122 extending from the inlet 1124 to the outlet 1126. The outlets 1126 of the set of first conduits 1120 are configured to introduce a first precursor 1170 into the chamber 1142 toward the rotatable substrate support surface 1150.

As used herein, "a set of first conduits 1120" and "the set of first conduits 1120" are meant to include any number of first conduits 1120 in any arrangement. Thus, for example "a set of first conduits 1120" includes one or more first conduits 1120 (e.g., 2 or more, 3 or more, 4 or more, 5 or more, 6 or more, 7 or more, 8 or more, 9 or more, 10 or more, 15 or more, 20 or more, 25 or more, 30 or more, 40 or more, 50 or more, 60 or more, 70 or more, 80 or more, 90 or more, 100 or more, 150 or more, 200 or more, 250 or more, 300 or more, 350 or more, 400 or more, 450 or more, 500 or more, 600 or more, 700 or more, 800 or more, 900 or more, or 1000 or more). In some embodiments, the set of first conduits 1120 can comprise a plurality of first conduits 1120. In some embodiments, the set of first conduits 1120 can comprise a plurality of first conduits 1120 arranged in an ordered array.

The cross-sectional shape of each of first conduits 1120 in a plane perpendicular to the central longitudinal axis of said first conduit 1120 can be any shape, such as a regular shape, an irregular shape, an isotropic shape, or an anisotropic shape. In some examples, the cross-sectional shape of each of first conduits 1120 in the set of first conduits 1120 can be substantially circular, ovate, ovoid, elliptic, triangular, rectangular, polygonal, etc. In some examples, the cross-sectional shape of each of the first conduits 1120 can be substantially circular.

The set of first conduits 1120 can have an average characteristic dimension. The average characteristic dimension of the set of first conduits 1120 can, for example, be 0.1 millimeter (mm) or more (e.g., 0.25 mm or more, 0.5 mm or more, 0.75 mm or more, 1 mm or more, 1.25 mm or more, 1.5 mm or more, 1.75 mm or more, 2 mm or more, 2.5 mm or more, 3 mm or more, 3.5 mm or more, 4 mm or more, or 4.5 mm or more). In some examples, the average characteristic dimension of the set of first conduits 1120 can be 5 mm or less (e.g., 4.5 mm or less, 4 mm or less, 3.5 mm or less, 3 mm or less, 2.5 mm or less, 2 mm or less, 1.75 mm or less, 1.5 mm or less, 1.25 mm or less, 1 mm or less, 0.75 mm or less, 0.5 mm or less, or 0.25 mm or less). The average characteristic dimension of the set of first conduits 1120 can range from any of the minimum values described above to any of the maximum values described above. For examples, the average characteristic dimension of the set of first conduits 1120 can be from 0.1 mm to 5 mm (e.g., from 0.1 mm to 2.5 mm, from 2.5 mm to 5 mm, from 0.1 mm to 1 mm, from 1 mm to 2 mm, from 2 mm to 3 mm, from 3 mm to 4 mm, from 4 mm to 5 mm, from 0.5 mm to 5 mm, from 0.1 mm to 4.5 mm, from 0.5 mm to 4.5 mm, from 0.1 mm to 4 mm, from 0.1 mm to 3 mm, or from 0.5 mm to 2 mm).

The outlets 1126 of each of the first conduits 1120 can be any shape, such as a regular shape, an irregular shape, an isotropic shape, or an anisotropic shape. In some examples, the outlets 1126 of the set of first conduits 1120 can have a shape that is substantially circular, ovate, ovoid, elliptic, triangular, rectangular, polygonal, etc. In some examples, the shape of the outlets 1126 of the set of first conduits 1120 can be substantially circular. The outlet 1126 of each of the set of first conduits 1120 can, for example, be the cross-section in a plane perpendicular to the central longitudinal axis of said first conduit 1120, such that the shape of the outlet 1126 of each of the set of first conduits 1120 can be the cross-sectional shape of each of the first conduits 1120.

The outlets 1126 of the set of first conduits 1120 can have an average characteristic dimension. The average characteristic dimension of the outlets 1126 of the set of first conduits 1120 can, for example, be 0.1 millimeter (mm) or more (e.g., 0.25 mm or more, 0.5 mm or more, 0.75 mm or more, 1 mm or more, 1.25 mm or more, 1.5 mm or more, 1.75 mm or more, 2 mm or more, 2.5 mm or more, 3 mm or more, 3.5 mm or more, 4 mm or more, or 4.5 mm or more). In some examples, the average characteristic dimension of the outlets 1126 of the set of first conduits 1120 can be 5 mm or less (e.g., 4.5 mm or less, 4 mm or less, 3.5 mm or less, 3 mm or less, 2.5 mm or less, 2 mm or less, 1.75 mm or less, 1.5 mm or less, 1.25 mm or less, 1 mm or less, 0.75 mm or less, 0.5 mm or less, or 0.25 mm or less). The average characteristic dimension of the outlets 1126 of the set of first conduits 1120 can range from any of the minimum values described above to any of the maximum values described above. For examples, the average characteristic dimension of the outlets 1126 of the set of first conduits 1120 can be from 0.1 mm to 5 mm (e.g., from 0.1 mm to 2.5 mm, from 2.5 mm to 5 mm, from 0.1 mm to 1 mm, from 1 mm to 2 mm, from 2 mm to 3 mm, from 3 mm to 4 mm, from 4 mm to 5 mm, from 0.5 mm to 5 mm, from 0.1 mm to 4.5 mm, from 0.5 mm to 4.5 mm, from 0.1 mm to 4 mm, from 0.1 mm to 3 mm, or from 0.5 mm to 2 mm).

In some examples, the each of the outlets 1126 of the set of first conduits 1120 can further comprise a nozzle (not shown) fluidly connected to each of the outlets 1126 of the set of first conduits 1120. Each nozzle can, for example, have an average characteristic dimension and a cross-sectional shape, wherein the average characteristic dimension of the nozzles, the cross-sectional shape of the nozzles, or a combination thereof can be the same or different than that of the outlets 1126 of the set of first conduits 1120. In some examples, the average characteristic dimension of the nozzles can be smaller than the average characteristic dimension of the outlets 1126 of the set of first conduits 1120. In some examples, the cross-sectional shape of the nozzles can be substantially circular. The average characteristic dimension of the nozzles, the cross-sectional shape of the nozzles, the orientation of the nozzles, or a combination thereof can be used to affect and/or control how the first precursor 1170 is introduced into the chamber 1142 (e.g., speed, direction, volume, etc.).

The number of first conduits 1120, the arrangement of the first conduits 1120, the cross-sectional shape of the first conduits 1120, the shape of the outlets 1126 of the first conduits 1120, the average characteristic dimension of the outlets 1126 of the first conduits 1120, the presence or absence of the nozzles fluidly connected to each of the outlets 1126 of the set of first conduits 1120, the average characteristic dimension of the nozzles fluidly connected to each of the outlets 1126 of the set of first conduits 1120, the cross-sectional shape of the nozzles fluidly connected to each of the outlets 1126 of the set of first conduits 1120, or a combination thereof can be selected, for example, in view of the number of laser injectors 1110, the location of the laser injectors 1110, the size of the laser beams 1162, the wavelength(s) of the laser beams 1162, the intensity of the laser beams 1162 within the chamber 1142, the size of the chamber 1142, the size of the rotatable substrate support surface 1150, the number of second conduits 1130, the location of the second conduits 1130, the average characteristic dimension of the outlets 1136 of the second conduits 1130, the shape of the outlets 1136 of the second conduits 1130, the presence or absence of the nozzles fluidly connected to each of the outlets 1136 of the set of second conduits 1130, the average characteristic dimension of the nozzles fluidly connected to each of the outlets 1136 of the set of second conduits 1130, the cross-sectional shape of the nozzles fluidly connected to each of the outlets 1136 of the set of second conduits 1130, or a combination thereof.

The outlets 1126 of the set of first conduits 1120 can, for example, be configured to introduce a first precursor 1170 into the chamber 1142 toward the rotatable substrate support surface 1150 such that the first precursor 1170 flows through at least one of the plurality of laser beams 1162 within the chamber 1142, thereby producing an irradiated first precursor 1172 in situ within the chamber 1142, prior to reaching the rotatable substrate support surface 1150. In some examples, the outlets 1126 of the set of first conduits 1120 are configured to introduce the first precursor 1170 substantially parallel to a central axis of each of the plurality of laser beams 1162 within the chamber 1142.

Each of the plurality of laser beams 1162 comprises electromagnetic radiation with at least one wavelength that overlaps with at least a portion of a vibrational mode of the first precursor 1170, thereby generating an active species (e.g., the irradiated first precursor 1172) in situ. In some examples, the wavelength of the laser beams 1162 are selected in view of the identity of the first precursor 1170, such that each of the plurality of laser beams 1162 comprises electromagnetic radiation with at least one wavelength that overlaps with at least a portion of a vibrational mode of the first precursor 1170, such that irradiation of the first precursor 1170 with the laser beam(s) 1162 can enhance the cracking efficiency of the first precursor 1170.

The devices 1100 further comprise a set of second conduits 1130, wherein each of the second conduits 1130 defines an inlet 1134, an outlet 1136 opposite and spaced apart from the inlet 1134, and a path for fluid flow 1132 extending from the inlet 1134 to the outlet 1136. The outlets 1136 of the set of second conduits 1130 are configured to introduce a second precursor 1180 into the chamber 1142 toward the rotatable substrate support surface 1150.

As used herein, "a set of second conduits 1130" and "the set of second conduits 1130" are meant to include any number of second conduits 1130 in any arrangement. Thus, for example "a set of second conduits 1130" includes one or more second conduits 1130 (e.g., 2 or more, 3 or more, 4 or more, 5 or more, 6 or more, 7 or more, 8 or more, 9 or more, 10 or more, 15 or more, 20 or more, 25 or more, 30 or more, 40 or more, 50 or more, 60 or more, 70 or more, 80 or more, 90 or more, 100 or more, 150 or more, 200 or more, 250 or more, 300 or more, 350 or more, 400 or more, 450 or more, 500 or more, 600 or more, 700 or more, 800 or more, 900 or more, or 1000 or more). In some embodiments, the set of second conduits 1130 can comprise a plurality of second conduits 1130. In some embodiments, the set of second conduits 1130 can comprise a plurality of second conduits 1130 arranged in an ordered array.

The cross-sectional shape of each of second conduits 1130 in a plane perpendicular to the central longitudinal axis of said second conduit 1130 can be any shape, such as a regular shape, an irregular shape, an isotropic shape, or an anisotropic shape. In some examples, the cross-sectional shape of each of the second conduits 1130 in the set of second conduits 1130 can be substantially circular, ovate, ovoid, elliptic, triangular, rectangular, polygonal, etc. In some examples, the cross-sectional shape of each of the second conduits 1130 can be substantially circular. In some examples, the cross-sectional shape of each of the second conduits 1130 can be the same as the cross-sectional shape of the set of first conduits 1120.

The set of second conduits 1130 can have an average characteristic dimension. The average characteristic dimension of the set of second conduits 1130 can, for example, be 0.1 millimeter (mm) or more (e.g., 0.25 mm or more, 0.5 mm or more, 0.75 mm or more, 1 mm or more, 1.25 mm or more, 1.5 mm or more, 1.75 mm or more, 2 mm or more, 2.5 mm or more, 3 mm or more, 3.5 mm or more, 4 mm or more, or 4.5 mm or more). In some examples, the average characteristic dimension of the set of second conduits 1130 can be 5 mm or less (e.g., 4.5 mm or less, 4 mm or less, 3.5 mm or less, 3 mm or less, 2.5 mm or less, 2 mm or less, 1.75 mm or less, 1.5 mm or less, 1.25 mm or less, 1 mm or less, 0.75 mm or less, 0.5 mm or less, or 0.25 mm or less). The average characteristic dimension of the set of second conduits 1130 can range from any of the minimum values described above to any of the maximum values described above. For examples, the average characteristic dimension of the set of second conduits 1130 can be from 0.1 mm to 5 mm (e.g., from 0.1 mm to 2.5 mm, from 2.5 mm to 5 mm, from 0.1 mm to 1 mm, from 1 mm to 2 mm, from 2 mm to 3 mm, from 3 mm to 4 mm, from 4 mm to 5 mm, from 0.5 mm to 5 mm, from 0.1 mm to 4.5 mm, from 0.5 mm to 4.5 mm, from 0.1 mm to 4 mm, from 0.1 mm to 3 mm, or from 0.5 mm to 2 mm). In some examples, the average characteristic dimension of the set of second conduits 1130 can be the same as the average characteristic dimension of the set of first conduits 1120.

The outlets 1136 of each of the second conduits 1130 can be any shape, such as a regular shape, an irregular shape, an isotropic shape, or an anisotropic shape. In some examples, the outlets 1136 of the set of second conduits 1130 can have a shape that is substantially circular, ovate, ovoid, elliptic, triangular, rectangular, polygonal, etc. In some examples, the shape of the outlets 1136 of the set of second conduits 1130 can be substantially circular. The outlet 1136 of each of the set of second conduits 1130 can, for example, be the cross-section in a plane perpendicular to the central longitudinal axis of said second conduit 1130, such that the shape of the outlet 1136 of each of the set of second conduits 1130 can be the cross-sectional shape of each of the second conduits 1130. In some examples, the shape of the outlets 1136 of the set of second conduits 1130 can be the same as the shape of the outlets 1126 of the set of first conduits 1120.

The outlets 1136 of the set of second conduits 1130 can have an average characteristic dimension. The average characteristic dimension of the outlets 1136 of the set of second conduits 1130 can, for example, be 0.1 millimeter (mm) or more (e.g., 0.25 mm or more, 0.5 mm or more, 0.75 mm or more, 1 mm or more, 1.25 mm or more, 1.5 mm or more, 1.75 mm or more, 2 mm or more, 2.5 mm or more, 3 mm or more, 3.5 mm or more, 4 mm or more, or 4.5 mm or more). In some examples, the average characteristic dimension of the outlets 1136 of the set of second conduits 1130 can be 5 mm or less (e.g., 4.5 mm or less, 4 mm or less, 3.5 mm or less, 3 mm or less, 2.5 mm or less, 2 mm or less, 1.75 mm or less, 1.5 mm or less, 1.25 mm or less, 1 mm or less, 0.75 mm or less, 0.5 mm or less, or 0.25 mm or less). The average characteristic dimension of the outlets 1136 of the set of second conduits 1130 can range from any of the minimum values described above to any of the maximum values described above. For examples, the average characteristic dimension of the outlets 1136 of the set of second conduits 1130 can be from 0.1 mm to 5 mm (e.g., from 0.1 mm to 2.5 mm, from 2.5 mm to 5 mm, from 0.1 mm to 1 mm, from 1 mm to 2 mm, from 2 mm to 3 mm, from 3 mm to 4 mm, from 4 mm to 5 mm, from 0.5 mm to 5 mm, from 0.1 mm to 4.5 mm, from 0.5 mm to 4.5 mm, from 0.1 mm to 4 mm, from 0.1 mm to 3 mm, or from 0.5 mm to 2 mm). In some examples, the average characteristic dimension of the outlets 1136 of the set of second conduits 1130 can be the same as the average characteristic dimension of the outlets 1126 of the set of first conduits 1120.

In some examples, the each of the outlets 1136 of the set of second conduits 1130 can further comprise a nozzle (not shown) fluidly connected to each of outlets 1136 of the set of second conduits 1130. Each nozzle can, for example, have an average characteristic dimension and a cross-sectional shape, wherein the average characteristic dimension of the nozzles, the cross-sectional shape of the nozzles, or a combination thereof can be the same or different than that of the outlets 1136 of the set of second conduits 1130. In some examples, the average characteristic dimension of the nozzles can be smaller than the average characteristic dimension of the outlets 1136 of the set of second conduits 1130. In some examples, the cross-sectional shape of the nozzles can be substantially circular. The average characteristic dimension of the nozzles, the cross-sectional shape of the nozzles, the orientation of the nozzles, or a combination thereof can be used to affect and/or control how the second precursor 1180 is introduced into the chamber 1142 (e.g., speed, direction, volume, etc.).

The number of second conduits 1130, the arrangement of the second conduits 1130, the cross-sectional shape of the second conduits 1130, the shape of the outlets 1136 of the second conduits 1130, the average characteristic dimension of the outlets 1136 of the second conduits 1130, the presence or absence of the nozzles fluidly connected to each of the outlets 1136 of the set of second conduits 1130, the average characteristic dimension of the nozzles fluidly connected to each of the outlets 1136 of the set of second conduits 1130, the cross-sectional shape of the nozzles fluidly connected to each of the outlets 1136 of the set of second conduits 1130, or a combination thereof can be selected, for example, in view of the number of laser injectors 1110, the location of the laser injectors 1110, the size of the laser beams 1162, the wavelength(s) of the laser beams 1162, the intensity of the laser beams 1162 within the chamber 1142, the size of the chamber 1142, the size of the rotatable substrate support surface 1150, the number of first conduits 1120, the location of the first conduits 1120, the average characteristic dimension of the outlets 1126 of the first conduits 1120, the shape of the outlets 1126 of the first conduits 1120, the presence or absence of the nozzles fluidly connected to each of the outlets 1126 of the set of first conduits 1120, the average characteristic dimension of the nozzles fluidly connected to each of the outlets 1126 of the set of first conduits 1120, the cross-sectional shape of the nozzles fluidly connected to each of the outlets 1126 of the set of first conduits 1120, or a combination thereof.

In some examples, the device 1100 is configured to deposit a III-V semiconductor, such that the first precursor 1170 comprises a V-group precursor and the second precursor 1180 comprises a III-group precursor The first precursor 1170 can, for example, comprise a V-group precursor, such as a compound, element, or composition comprising N, P, As, Sb, Bi, or a combination thereof. In some examples, the first precursor 1170 can comprise a nitrogen species. In some examples, the first precursor 1170 can comprise $NH_3$. The first precursor 1170 can, for example, comprise a fluid, such as a gas.

The second precursor 1180 can, for example, comprise a III-group precursor, such as compound, element, or composition comprising B, Al, Ga, In, Tl, or a combination thereof. In some examples, the second precursor 1180 can comprise a gallium species. In some examples, the second precursor 1180 can comprise trimethylgallium, triethylgallium, or a combination thereof. The second precursor 1180 can, for example, comprise a fluid, such as a gas.

In some examples, the device 1100 is configured to deposit a group III oxide semiconductor, such that the first precursor 1170 comprises an oxygen containing precursor and the second precursor 1180 comprises a III-group precursor.

In some examples, the device 1100 is configured to deposit a group II-VI semiconductor material, such that the first precursor 1170 comprises a VI-group precursor (e.g., a compound/composition/element comprising O, S, Se, Te, or a combination thereof) and the second precursor 1180 comprises a II-group precursor (e.g., a compound/composition/element comprising Be, Mg, Ca, Sr, Ba, Zn, Cd, Hg, or a combination thereof).

In some examples, the device 1100 is configured to deposit a group II-IV-$V_2$ semiconductor, such that the first precursor 1170 comprises a V-group precursor (e.g., a compound, element, or composition comprising N, P, As, Sb, Bi, or a combination thereof) and the second precursor 1180 comprises a mixture of a II-group precursor (e.g., a compound/composition/element comprising Be, Mg, Ca, Sr, Ba, Zn, Cd, Hg, or a combination thereof) and a IV-group precursor (e.g., a compound/composition/element comprising C, Si, Ge, Sn, Pb, or a combination thereof).

In some examples, the device 1100 is configured to introduce the first precursor 1170 into the chamber 1142 continuously or intermittently. In some examples, the device 1100 is configured to introduce the second precursor 1180 continuously or intermittently.

In some examples, the device 1100 is configured to introduce the first precursor 1170 and the second precursor 1180 into the chamber 1142 alternately. In some examples, the device 1100 is configured to introduce the first precursor 1170 and the second precursor 1180, wherein at least a portion of the introduction of the second precursor 1180 is concurrent with at least a portion of the introduction of the first precursor 1170, or vice versa. In some examples, the device 1100 is configured to introduce the first precursor 1170 and the second precursor 1180 to the chamber simultaneously.

In some examples, the outlets 1126 of the set of first conduits 1120, the outlets 1136 of the set of second conduits 1130, or a combination thereof are further configured to introduce a dopant (e.g., one or more dopants) into the chamber 1142 toward the rotatable substrate support surface 1150. The one or more dopants can be selected in view of the first precursor 1170 and/or the second precursor 1180. The one or more dopants can be, for example, a fluid, such as a gas. In some examples, the one or more dopants can comprise an n-type dopant (e.g., silane ($SiH_4$), germane ($GeH_4$), disilane($Si_2H_6$)), a p-type dopant (e.g., bis(cyclopentadienyl)magnesium ($Cp_2Mg$), bis(methylcyclopentadienyl) magnesium (($MeCp)_2Mg$)), or a combination thereof. In some examples, the one or more dopants can comprise silane ($SiH_4$), germane ($GeH_4$), disilane($Si_2H_6$), bis(cyclopentadienyl)magnesium ($Cp_2Mg$), bis(methylcyclopentadienyl) magnesium (($MeCp)_2Mg$), or a combination thereof. The one or more dopants can, for example, be mixed with the first precursor 1170 and/or the second precursor 1180 prior to introduction into the chamber 1142. In some examples, the device 1100 is configured to introduce the first precursor 1170, the second precursor 1180, and the one or more dopants into the chamber 1142 consecutively in turn. In some examples, the device 1100 is configured to introduce the first precursor 1170 and the one or more dopants, wherein at least a portion of the introduction of the one or more dopants is concurrent with at least a portion of the introduction of the first precursor 1170, or vice versa. In some examples, the device 1100 is configured to introduce the second precursor 1180 and the one or more dopants, wherein at least a portion of the introduction of the one or more dopants is concurrent with at least a portion of the introduction of the second precursor 1180, or vice versa. In some examples, the device is configured to introduce the first precursor 1170, the second precursor 1180, and the one or more dopants into the chamber 1142 simultaneously.

In some examples, the outlets 1126 of the set of first conduits 1120, the outlets 1136 of the set of second conduits 1130, or a combination thereof are further configured to introduce a carrier gas (e.g., one or more carrier gases) into the chamber 1142 toward the rotatable substrate support surface 1150. The one or more carrier gases can be selected in view of the first precursor 1170, the second precursor 1180, the one or more dopants when present, or a combination thereof. The one or more carrier gases can be, for example, argon, helium, $H_2$, $N_2$, and the like, or combinations thereof. The one or more carrier gases can, for example, be mixed with the first precursor 1170, the second precursor 1180, the one or more dopants when present, or a combination thereof prior to introduction into the chamber 1142. In some examples, the device 1100 is configured to introduce the first precursor 1170, the second precursor 1180, the one or more dopants when present, or a combination thereof concurrently with at least a portion of the introduction of the one or more carrier gases.

The devices 1100 further comprise a source distributor 1190, the source distributor 1190 having a first surface and a second surface opposite and spaced apart from the first surface, the second surface being substantially parallel and spaced apart from the rotatable substrate support surface 1150, wherein the set of first conduits 1120 and the set of second conduits 1130 are defined by the source distributor 1190 and traverse the source distributor 1190 from the first surface to the second surface.

In some examples, the outlets 1116 of all of the plurality of laser injectors 1110 are positioned in an ordered array within a quadrant of the source distributor 1190. In some examples, the plurality of laser injectors 1110 are positioned in the ordered array within a quadrant of the source distributor 1190 so as to provide a uniform distribution of lasers 1162 over the rotatable substrate support surface 1150 as the rotatable substrate support surface 1150 is rotated. In some examples, the outlet(s) 1126 of one or more first conduits 1120 is/are located adjacent the outlet 1116 of at least one of the plurality of laser injectors 1110. In some examples, the outlet 1126 of each of the set of first conduits 1120 are positioned in an ordered array within the same quadrant of the source distributor 1190 as the outlets 1116 of the plurality of laser injectors 1110, and the outlets 1126 of the set of first conduits 1120 are interspersed between the outlets 1116 of the plurality of laser injectors 1110. In some examples, the outlets 1136 of the set of second conduits 1130 are located in an ordered array, evenly spaced about the outlets 1116 of the plurality of laser injectors 1110 and/or the outlets 1126 of the set of first conduits 1120.

In some examples, the outlet(s) 1126 of one or more first conduits 1120 is/are located adjacent the outlet 1116 of at least one of the plurality of laser injectors 1110. In some examples, the outlet(s) 1126 of one or more first conduits 1120 is/are located directly adjacent the outlet 1116 of at least one of the plurality of laser injectors 1110. In some examples, the outlets 1126 of three or more (e.g., 4 or more, 5 or more, 6 or more, etc.) of the first conduits 1120 are located directly adjacent the outlet 1116 of at least one of the plurality of laser injectors 1110 and the outlets 1126 of the three or more first conduits 1120 are evenly spaced around the periphery of the outlet 1116 of the at least one of the plurality of laser injectors 1110, such that the outlet 1116 of the at least one laser injector 1110 is surrounded by the evenly spaced outlets 1126 of the three or more first conduits 1120. In some examples, the outlets 1126 of four of the first conduits 1120 are located directly adjacent the outlet 1116 of each of the plurality of laser injectors 1110 and the outlets 1126 of the four first conduits 1120 are evenly spaced around the periphery of each of the outlets 1116 of the plurality of laser injectors 1110. In some examples, the outlets 1136 of the set of second conduits 1130 are located in an ordered array, evenly spaced throughout at least a portion of the source distributor 1190 about the outlets 1116 of the plurality of laser injectors 1110 and/or the outlets 1126 of the set of first conduits 1120.

The devices 1100 further comprise a cooling plate 1192 thermally coupled to the source distributor 1190, wherein the cooling plate 1192 is in contact with the first surface of the source distributor 1190; and a top cover 1194, wherein the top cover 1194 is located above and in contact with the cooling plate 1192, such that the cooling plate 1192 is sandwiched between the source distributor 1190 and the top cover 1194, and wherein the source distributor 1190, the cooling plate 1192, and the top cover 1194 define the plurality of laser injectors 1110. The cooling plate 1192 can be configured to cool the source distributor 1190. In some examples, the devices 1100 can further comprise a means for controlling the temperature of (e.g., cooling) the cooling plate 1192. The cooling plate 1192 can, in some examples, be hollow such that a cooling medium can be included within the cooling plate 1192, for example to dissipate heat (e.g., from the heater, from the laser energy, or a combination thereof). In some examples, the cooling medium can comprise water.

The devices 1100 further comprise an in-situ monitor viewport 1196 defined by the source distributor, the cooling plate, and top cover. The in-situ monitor viewport 1196 can allow for visual inspection inside the chamber 1142 when the device 1100 is assembled.

The devices 1100 further comprise, for example, a first precursor conduit 1128 defining an inlet, an outlet opposite and spaced apart from the inlet, and a path for fluid flow extending from the inlet to the outlet, wherein the outlet of the first precursor 1128 conduit can be fluidly connected to each of the inlets 1124 of the set of first conduits 1120, for example via the source distributor 1190; wherein, the cooling plate 1192 and the top cover 1194 define the first precursor conduit 1128. The first precursor conduit 1128 can be fluidly connected to the chamber 1142 via the set of first conduits 1120. The first precursor conduit 1128 can, for example, fluidly connect a first precursor source (not shown) to the chamber 1142 via the set of first conduits 1120.

The devices 1100 further comprise, for example, a second precursor conduit 1138 defining an inlet, an outlet opposite and spaced apart from the inlet, and a path for fluid flow extending from the inlet to the outlet, wherein the outlet of the second precursor conduit 1138 can be fluidly connected to each of the inlets 1134 of the set of second conduits 1130, for example via the source distributor 1190; wherein, the cooling plate 1192 and the top cover 1194 define the second precursor conduit 1138. The second precursor conduit 1138 can be fluidly connected to the chamber 1142 via the set of second conduits 1130. The second precursor conduit 1138 can, for example, fluidly connect a second precursor source (not shown) to the chamber 1142 via the set of second conduits 1130.

Figure 19:
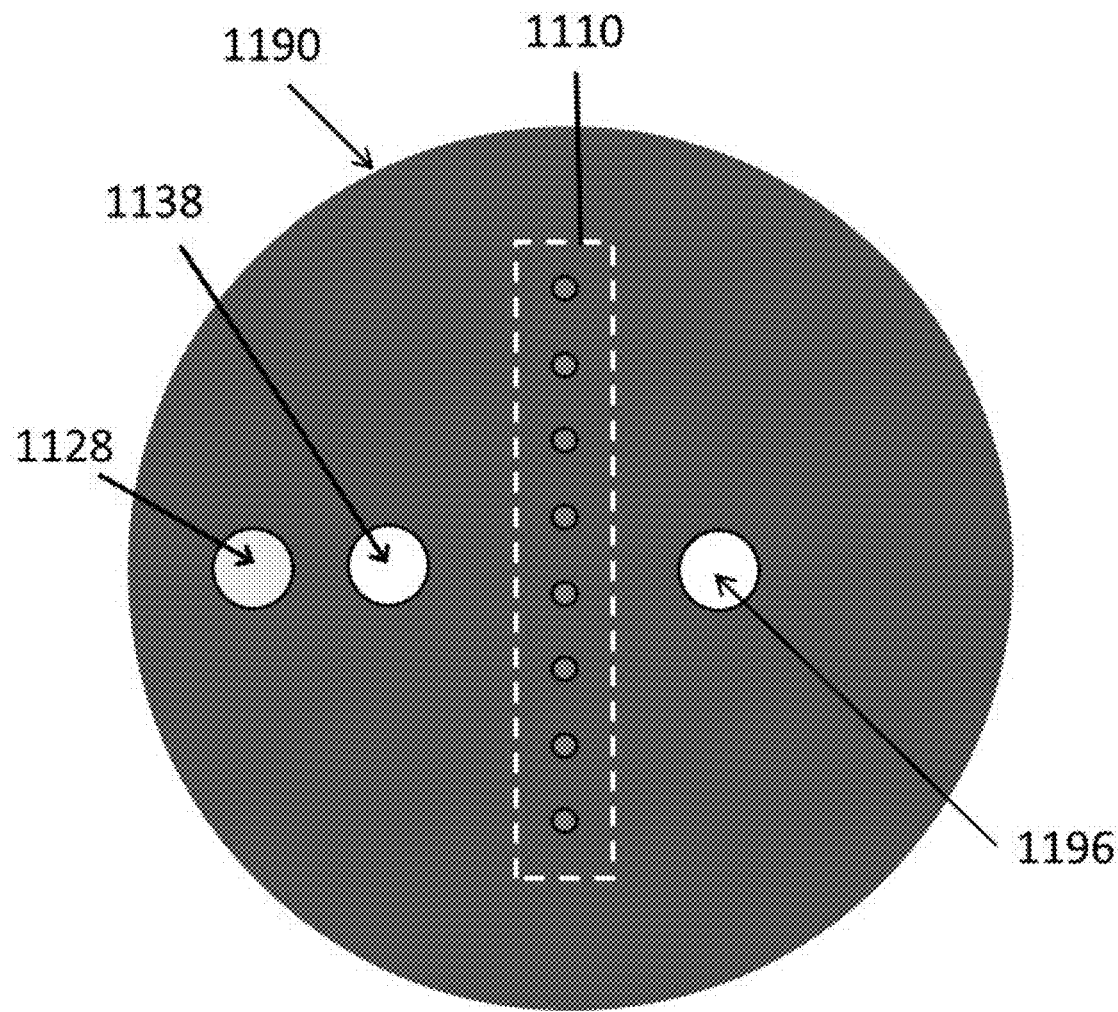
FIG. 19 is a schematic cross-sectional plan view of the first (e.g., top) surface of the source distributor showing the arrangement of the first precursor conduit, the second precursor conduit, the viewport, and the plurality of laser injectors in one implementation of the example device shown in FIG. 17 and FIG. 18.
Figure 20:
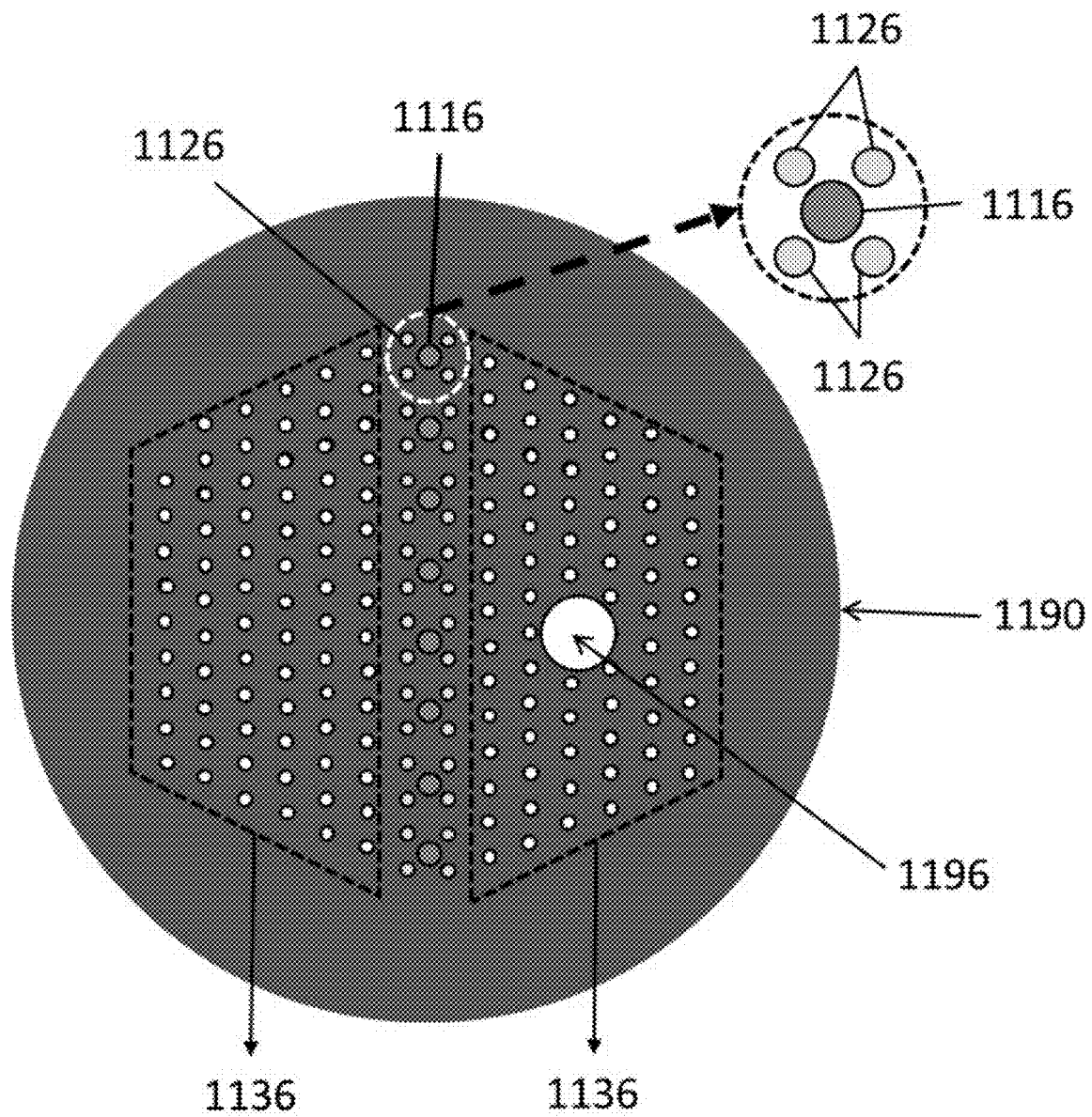
FIG. 20 is a schematic cross-sectional plan view of the second (e.g., bottom) surface of the source distributor (a view of the opposite surface of the source distributor shown in FIG. 19) showing the arrangement of the outlets of the set of first conduits, the outlets of the set of second conduits, the outlets of the plurality of laser injectors, and the viewport in one implementation of the example device shown in FIG. 17-FIG. 19.

FIG. 19 is a schematic cross-sectional plan view of the example device 1100 shown in FIG. 17 and FIG. 18, showing the first surface (e.g., top surface) of the source distributor 1190 and the arrangement of the laser distributors 1110, the first precursor conduit 1128, the second precursor conduit 1138, and the in-situ monitor viewport 1196. FIG. 20 is a schematic cross-sectional plan view of the example device 1100 shown in FIG. 17 and FIG. 18, showing the second surface (e.g., bottom surface) of the source distributor 1190 (e.g., the opposite surface as shown in FIG. 19) and the arrangement of the outlets 1126 of the set of first conduits 1120, the outlets 1136 of the second conduits 1130, the outlets 1116 of the plurality of laser injectors 1110, and the in-situ monitor viewport 1196 in one implementation of the device 1100. Referring now to FIG. 19 and FIG. 20, the plurality of laser injectors 1110 are positioned in a line across the width (e.g., diameter) of the source distributor 1190, the outlets 1126 of four of the first conduits 1120 are located directly adjacent the outlet 1116 of each of the plurality of laser injectors 1110 and the outlets 1126 of the four first conduits 1120 are evenly spaced around the periphery of each of the outlets 1116 of the plurality of laser injectors 1110, and the outlets 1136 of the second conduits 1130 are located in an ordered array evenly spaced throughout at least a portion of the source distributor 1190 on either side of the outlets 1126 of the set of first conduits 1120 and the outlets 1116 of the plurality of laser injectors 1110.

Figure 21:
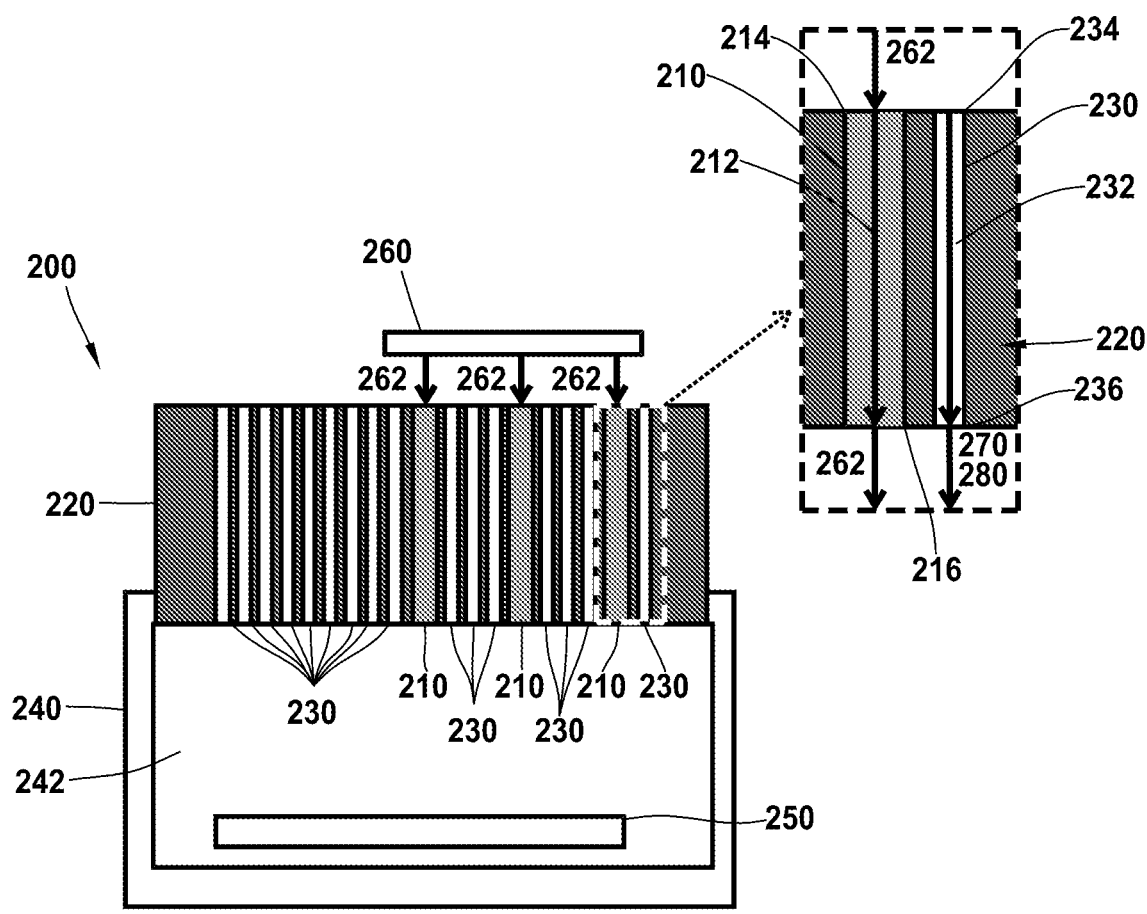
FIG. 21 is a cross-sectional plan view of a schematic of an example device as disclosed herein according to one implementation.
Figure 22:
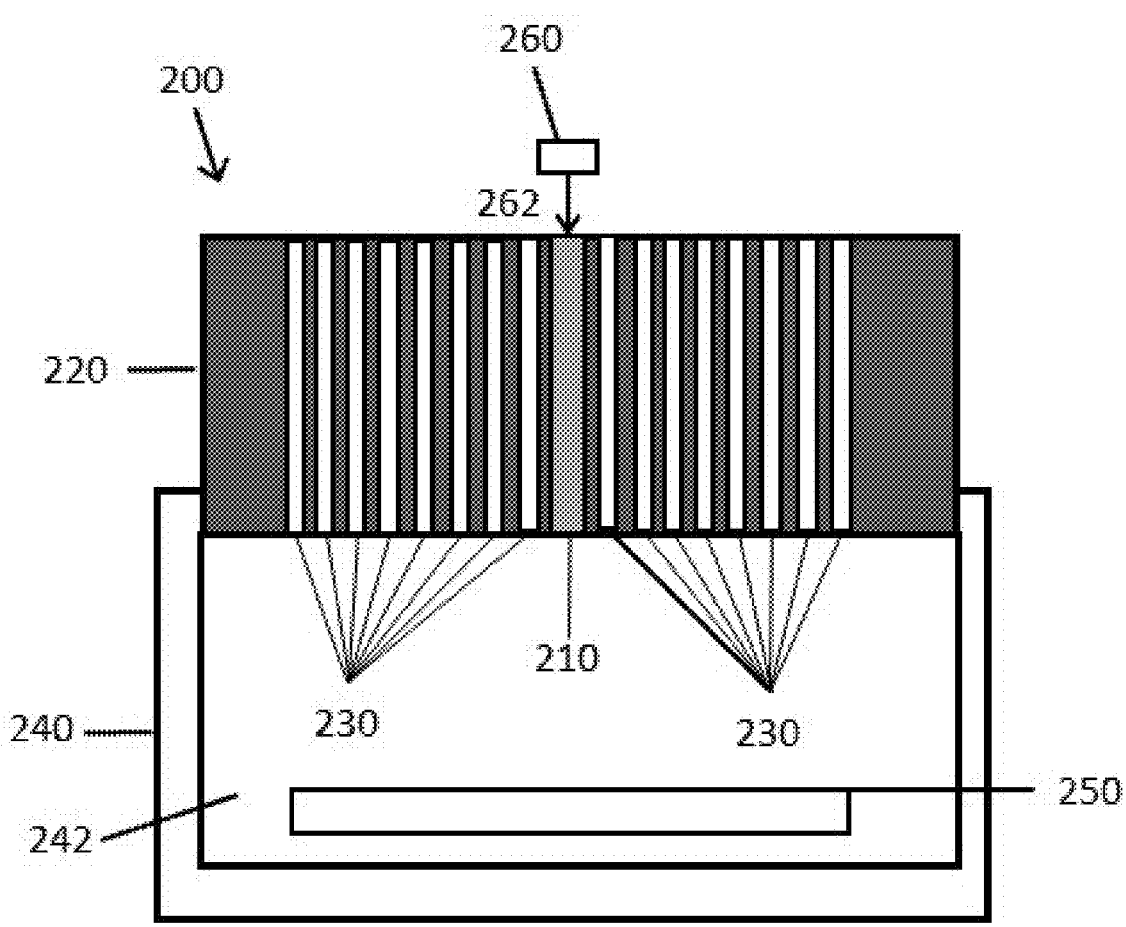
FIG. 22 is a schematic cross-sectional plan view, orthogonal to that of FIG. 21, of the example device shown in FIG. 21.

FIG. 21 and FIG. 22 show two orthogonal views of a laser-assisted metal-organic chemical vapor deposition (MOCVD) device 200 according to one implementation described herein. Referring now to FIG. 21 and FIG. 22, also disclosed herein are laser-assisted metal-organic chemical vapor deposition (MOCVD) device 200, the devices 200 comprising: a plurality of laser injectors 210, wherein each of the plurality of laser injectors 210 defines an inlet 214, an outlet 216 opposite and spaced apart from the inlet 214, and an optical path 212 extending from the inlet 214 to the outlet 216; a source distributor 220 defining the plurality of laser injectors and a plurality of conduits 230, wherein each of the plurality of conduits 230 defines an inlet 234, an outlet 236 opposite and spaced apart from the inlet 234, and a path for fluid flow 232 extending from the inlet 234 to the outlet 236; wherein, when the device 200 is assembled together with a wall 240 defining a chamber 242, a rotatable substrate support surface 250 disposed within the chamber 242, and a laser device 260 for producing a plurality of laser beams 262: the plurality of laser injectors 210 are configured such that the outlet 216 of each of the plurality of laser injectors 210 directs one of the plurality of laser beams 262 onto the rotatable substrate support surface 250 disposed within the chamber 242; the outlets 236 of the plurality of conduits 230 are configured to introduce a first precursor 270 and a second precursor 280 into the chamber 242 toward the rotatable substrate support surface 250.

The plurality of laser injectors 210 can include two or more laser injectors 210 (e.g., 3 or more, 4 or more, 5 or more, 6 or more, 7 or more, 8 or more, 9 or more, 10 or more, 15 or more, 20 or more, 25 or more, 30 or more, 40 or more, 50 or more, 60 or more, 70 or more, 80 or more, 90 or more, 100 or more, 150 or more, 200 or more, 250 or more, 300 or more, 350 or more, 400 or more, 450 or more, 500 or more, 600 or more, 700 or more, 800 or more, 900 or more, or 1000 or more). The number of laser injectors 210 can be selected in view of the size of the chamber 242, the size of the rotatable substrate support surface 250, or a combination thereof.

The plurality of laser injectors 210 can be positioned in an ordered array. The ordered array can be designed, for example, in view of the number of laser injectors 210, the size of the chamber 242, the size of the rotatable substrate support surface 250, and the like, or a combination thereof. In some examples, the ordered array can be designed so as to provide a uniform distribution of lasers over the rotatable substrate support surface as the rotatable substrate support surface is rotated.

The cross-sectional shape of each of the plurality of laser injectors 210 in a plane perpendicular to the central longitudinal axis of said laser injector 210 can be any shape, such as a regular shape, an irregular shape, an isotropic shape, or an anisotropic shape. In some examples, the cross-sectional shape of the plurality of laser injectors 210 can be substantially circular, ovate, ovoid, elliptic, triangular, rectangular, polygonal, etc. In some examples, the cross-sectional shape of the plurality of laser injectors 210 can be substantially circular.

The outlets 216 of each of the plurality of laser injectors 210 can be any shape, such as a regular shape, an irregular shape, an isotropic shape, or an anisotropic shape. In some examples, the outlets 216 of the plurality of laser injectors 210 can have a shape that is substantially circular, ovate, ovoid, elliptic, triangular, rectangular, polygonal, etc. In some examples, the shape of the outlets 216 of the plurality of laser injectors 210 can be substantially circular. The outlets 216 of each of the plurality of laser injectors 210 can, for example, be the cross-section in a plane perpendicular to the longitudinal axis of said laser injector 210, such that the shape of the outlet 216 of each of the plurality of laser injectors 210 can be the cross-sectional shape of each of the plurality of laser injectors 210.

The plurality of laser injectors 210 can be configured such that each of the laser beams 262 has an average spot size on the rotatable substrate support surface 250. The plurality of laser injectors 210 can, for example, be configured such that the average spot size of the plurality of laser beams 262 on the rotatable substrate support surface can be 1 millimeters (mm) or more (e.g., 5 mm or more, 10 mm or more, 15 mm or more, 20 mm or more, 25 mm or more, 30 mm or more, 35 mm or more, 40 mm or more, 45 mm or more, 50 mm or more, 60 mm or more, 70 mm or more, 80 mm or more, or 90 mm or more). In some examples, the plurality of laser injectors 210 can be configured such that the average spot size of the plurality of laser beams 262 on the rotatable substrate support surface 250 can be 100 mm or less (e.g., 90 mm or less, 80 mm or less, 70 mm or less, 60 mm or less, 50 mm or less, 45 mm or less, 40 mm or less, 35 mm or less, 30 mm or less, 25 mm or less, 20 mm or less, 15 mm or less, 10 mm or less, or 5 mm or less). The average spot size of the plurality of laser beams 262 on the rotatable substrate support surface 250 can range from any of the minimum values described above to any of the maximum values described above. For example, the plurality of laser injectors 210 can be configured such that the average spot size of the plurality of laser beams 262 on the rotatable substrate support surface 250 can be from 1 mm to 100 mm (e.g., from 1 mm to 50 mm, from 50 mm to 100 mm, from 1 mm to 20 mm, from 20 mm to 40 mm, from 40 mm to 60 mm, from 60 mm to 80 mm, from 80 mm to 100 mm, from 5 mm to 100 mm, from 1 mm to 90 mm, from 5 mm to 90 mm, from 1 mm to 80 mm, from 1 mm to 60 mm, or from 5 mm to 50 mm).

Each of the plurality of laser injectors 210 can, for example, include one or more lenses 218 for expanding each of the laser beams 262 onto the rotatable substrate support surface 250, e.g., such that each of the laser beams 262 has the average spot size on the rotatable substrate support surface 250. The one or more lenses 218 can be any type of lens, such as a simple lens, a compound lens, a spherical lens, a toric lens, a biconvex lens, a plano-convex lens, a plano-concave lens, a negative meniscus lens, a positive meniscus lens, a biconcave lens, a converging lens, a diverging lens, a cylindrical lens, a Fresnel lens, a lenticular lens, a gradient index lens, or a combination thereof. The one or more lenses 218 can be selected to control the spot size of each of the laser beams 262 on the rotatable substrate support surface 250, the uniformity of each of the laser beams 262 (e.g., with respect to intensity) on the rotatable substrate support surface 250, or a combination thereof.

For example, each of the plurality of laser injectors 210 can include a convex lens 218a and a concave lens 218b for expanding each of the laser beams 262 onto the rotatable substrate support surface 250. The convex lens 218a can reduce the waist of the incident laser beam 262 from $\omega_0$ to $\omega_1$ and increase the divergence angle of the incident laser beam 262. The concave lens 218b can be located at the focal point of the convex lens 218a, $f_1$, to expand the laser beam 262 size to $\omega_2$ on the rotatable substrate support surface 250, e.g., the spot size. The concave lens 218b can also improve the uniformity of the laser beam 262 inside the Gaussian laser spot on the rotatable substrate support surface 250.

The number of laser injectors 210, the arrangement of the laser injectors 210, the cross-sectional shape of the laser injectors 210, the number and/or types of lenses in the laser injectors 210, the average spot size of the laser beams 262 on the rotatable substrate support surface 250, or a combination thereof can be selected, for example, in view of the wavelength(s) of the laser beams 262, the intensity of the laser beams 262 within the chamber 242, the size of the chamber 242, the size of the rotatable substrate support surface 250, or a combination thereof.

The plurality of conduits 230 can include two or more conduits (e.g., 3 or more, 4 or more, 5 or more, 6 or more, 7 or more, 8 or more, 9 or more, 10 or more, 15 or more, 20 or more, 25 or more, 30 or more, 40 or more, 50 or more, 60 or more, 70 or more, 80 or more, 90 or more, 100 or more, 150 or more, 200 or more, 250 or more, 300 or more, 350 or more, 400 or more, 450 or more, 500 or more, 600 or more, 700 or more, 800 or more, 900 or more, or 1000 or more). The number of conduits 230 can be selected in view of the size of the chamber 242, the size of the rotatable substrate support surface 250, or a combination thereof. In some embodiments, the plurality of conduits 230 can be arranged in an ordered array.

The cross-sectional shape of each of the plurality of conduits 230 in a plane perpendicular to the central longitudinal axis of said conduit 230 can be any shape, such as a regular shape, an irregular shape, an isotropic shape, or an anisotropic shape. In some examples, the cross-sectional shape of the plurality of conduits 230 can be substantially circular, ellipsoidal, triangular, rectangular, polygonal, etc. In some examples, the cross-sectional shape of the plurality of conduits 230 can be substantially circular.

The plurality of conduits 230 can have an average characteristic dimension. The average characteristic dimension of the plurality of conduits 230 can, for example, be 0.1 millimeter (mm) or more (e.g., 0.25 mm or more, 0.5 mm or more, 0.75 mm or more, 1 mm or more, 1.25 mm or more, 1.5 mm or more, 1.75 mm or more, 2 mm or more, 2.5 mm or more, 3 mm or more, 3.5 mm or more, 4 mm or more, or 4.5 mm or more). In some examples, the average characteristic dimension of the plurality of conduits 230 can be 5 mm or less (e.g., 4.5 mm or less, 4 mm or less, 3.5 mm or less, 3 mm or less, 2.5 mm or less, 2 mm or less, 1.75 mm or less, 1.5 mm or less, 1.25 mm or less, 1 mm or less, 0.75 mm or less, 0.5 mm or less, or 0.25 mm or less). The average characteristic dimension of the plurality of conduits 230 can range from any of the minimum values described above to any of the maximum values described above. For examples, the average characteristic dimension of the plurality of conduits 230 can be from 0.1 mm to 5 mm (e.g., from 0.1 mm to 2.5 mm, from 2.5 mm to 5 mm, from 0.1 mm to 1 mm, from 1 mm to 2 mm, from 2 mm to 3 mm, from 3 mm to 4 mm, from 4 mm to 5 mm, from 0.5 mm to 5 mm, from 0.1 mm to 4.5 mm, from 0.5 mm to 4.5 mm, from 0.1 mm to 4 mm, from 0.1 mm to 3 mm, or from 0.5 mm to 2 mm).

The outlets 236 of each of the plurality of conduits 230 can be any shape, such as a regular shape, an irregular shape, an isotropic shape, or an anisotropic shape. In some examples, the outlets 236 of the plurality of conduits 230 can have a shape that is substantially circular, ellipsoidal, triangular, rectangular, polygonal, etc. In some examples, the shape of the outlets 236 of the plurality of conduits 230 can be substantially circular. The outlet 236 of each of the plurality of conduits 230 can, for example, be the cross-section in a plane perpendicular to the central longitudinal axis of said conduit 230, such that the shape of the outlet 236 of each of the plurality of conduits 230 can be the cross-sectional shape of each of the plurality of conduits 230.

The outlets 236 of the plurality of conduits 230 can have an average characteristic dimension. The average characteristic dimension of the outlets 236 of the plurality of conduits 230 can, for example, be 0.1 millimeter (mm) or more (e.g., 0.25 mm or more, 0.5 mm or more, 0.75 mm or more, 1 mm or more, 1.25 mm or more, 1.5 mm or more, 1.75 mm or more, 2 mm or more, 2.5 mm or more, 3 mm or more, 3.5 mm or more, 4 mm or more, or 4.5 mm or more). In some examples, the average characteristic dimension of the outlets 236 of the plurality of conduits 230 can be 5 mm or less (e.g., 4.5 mm or less, 4 mm or less, 3.5 mm or less, 3 mm or less, 2.5 mm or less, 2 mm or less, 1.75 mm or less, 1.5 mm or less, 1.25 mm or less, 1 mm or less, 0.75 mm or less, 0.5 mm or less, or 0.25 mm or less). The average characteristic dimension of the outlets 236 of the plurality of conduits 230 can range from any of the minimum values described above to any of the maximum values described above. For examples, the average characteristic dimension of the outlets 236 of the plurality conduits 230 can be from 0.1 mm to 5 mm (e.g., from 0.1 mm to 2.5 mm, from 2.5 mm to 5 mm, from 0.1 mm to 1 mm, from 1 mm to 2 mm, from 2 mm to 3 mm, from 3 mm to 4 mm, from 4 mm to 5 mm, from 0.5 mm to 5 mm, from 0.1 mm to 4.5 mm, from 0.5 mm to 4.5 mm, from 0.1 mm to 4 mm, from 0.1 mm to 3 mm, or from 0.5 mm to 2 mm).

In some examples, the each of the outlets 236 of the plurality of conduits 230 can further comprise a nozzle (not shown) fluidly connected to each of the outlets 236 of the plurality of conduits 230. Each nozzle can, for example, have an average characteristic dimension and a cross-sectional shape, wherein the average characteristic dimension of the nozzles, the cross-sectional shape of the nozzles, or a combination thereof can be the same or different than that of the outlets 236 of the plurality of conduits 230. In some examples, the average characteristic dimension of the nozzles can be smaller than the average characteristic dimension of the outlets 236 of the plurality of conduits 230. In some examples, the cross-sectional shape of the nozzles can be substantially circular. The average characteristic dimension of the nozzles, the cross-sectional shape of the nozzles, the orientation of the nozzles, or a combination thereof can be used to affect and/or control how the first precursor 270 and/or the second precursor 280 is/are introduced into the chamber 242 (e.g., speed, direction, volume, etc.).

The number of conduits 230, the arrangement of the conduits 230, the cross-sectional shape of the conduits 230, the shape of the outlets 236 of the conduits 230, the average characteristic dimension of the outlets 236 of the conduits 230, the presence or absence of the nozzles fluidly connected to each of the outlets 236 of the plurality of conduits 230, the average characteristic dimension of the nozzles fluidly connected to each of the outlets 236 of the plurality of conduits 230, the cross-sectional shape of the nozzles fluidly connected to each of the outlets 236 of the plurality of conduits 230, or a combination thereof can be selected, for example, in view of the number of laser injectors 210, the location of the laser injectors 210, the size of the laser beams 262, the wavelength(s) of the laser beams 262, the intensity of the laser beams 262 within the chamber 242, the size of the chamber 242, the size of the rotatable substrate support surface 250, or a combination thereof.

In some examples, the outlets 236 of the plurality of conduits 230 are configured to introduce the first precursor 270 and the second precursor 280 substantially uniformly throughout the chamber 242. In some examples, the outlets 236 of the plurality of conduits 230 are configured to introduce the first precursor 270 and the second precursor 280 substantially parallel to a central axis of each of the plurality of laser beams 262 within the chamber 242. In some examples, the plurality of conduits 230 can comprise a set of first conduits and a set of second conduits, the outlets of the set of first conduits being configured to introduce the first precursor 270 into the chamber 242 toward the rotatable substrate support surface 250, the outlets of the set of second conduits being configured to introduce the second precursor 280 into the chamber 242 toward the rotatable substrate support surface 250.

The source distributor 220 can, for example, have a first surface and a second surface opposite and spaced apart from the first surface, wherein the plurality of laser injectors 210 and the plurality of conduits 230 traverse the source distributor 220 from the first surface to the second surface, and wherein the second surface of the source distributor 220 is substantially parallel and spaced apart from the rotatable substrate support surface 250. The source distributor 220 can, for example, form a lid to the chamber 242. The source distributor 220 can, in some examples, be hollow such that a cooling medium can be included within the source distributor 220, for example to dissipate heat (e.g., from the heater, from the laser energy, or a combination thereof). The source distributor 220 can, in some examples, comprise inside space (not shown), which have an inlet fluidly connected to an outlet, wherein the inlet and the outlet are configured to provide a path for flowing the cooling medium through the inside space within the source distributor. In some examples, the cooling medium can comprise water.

In some examples, the outlets 216 of the plurality of laser injectors 210 are all positioned in an ordered array within a quadrant of the source distributor 220. In some examples, the plurality of laser injectors 210 are positioned in the ordered array within a quadrant of the source distributor 220 so as to provide a uniform distribution of lasers over the rotatable substrate support surface 250 as the rotatable substrate support surface 250 is rotated. In some examples, the outlets 236 of the plurality of conduits 230 are positioned in an ordered array and evenly spaced throughout the source distributor 220, such that the outlets 236 of the plurality of conduits 230 are configured to introduce the first precursor 270 and the second precursor 280 substantially uniformly throughout the chamber 242. In some examples, the outlet 216 of each of the plurality of laser injectors 210 is located adjacent the outlet 236 of at least one of the plurality of conduits 230 and the outlets 216 of the plurality of laser injectors 210 are regularly interspersed between the outlets 236 of the plurality of conduits 230 within the quadrant of the source distributor 220; the outlets 236 of the plurality of conduits 230 are configured to introduce the first precursor 270 and the second precursor 280 substantially parallel to a central axis of each of the plurality of laser beams 262 within the chamber 242 and the first precursor 270 flows through at least one of the plurality of laser beams 262 within the chamber, thereby producing an irradiated first precursor 272 in situ within the chamber, prior to reaching the rotatable substrate support surface 250.

In some examples, the plurality of conduits 230 can comprise a set of first conduits and a set of second conduits, the outlets of the set of first conduits being configured to introduce the first precursor 270 into the chamber 242 toward the rotatable substrate support surface 250, the outlets of the set of second conduits being configured to introduce the second precursor 280 into the chamber 242 toward the rotatable substrate support surface 250, wherein the outlets of the first set of conduits are all located within the same quadrant of the source distributor 220 as the plurality of laser injectors 210.

Figure 23:
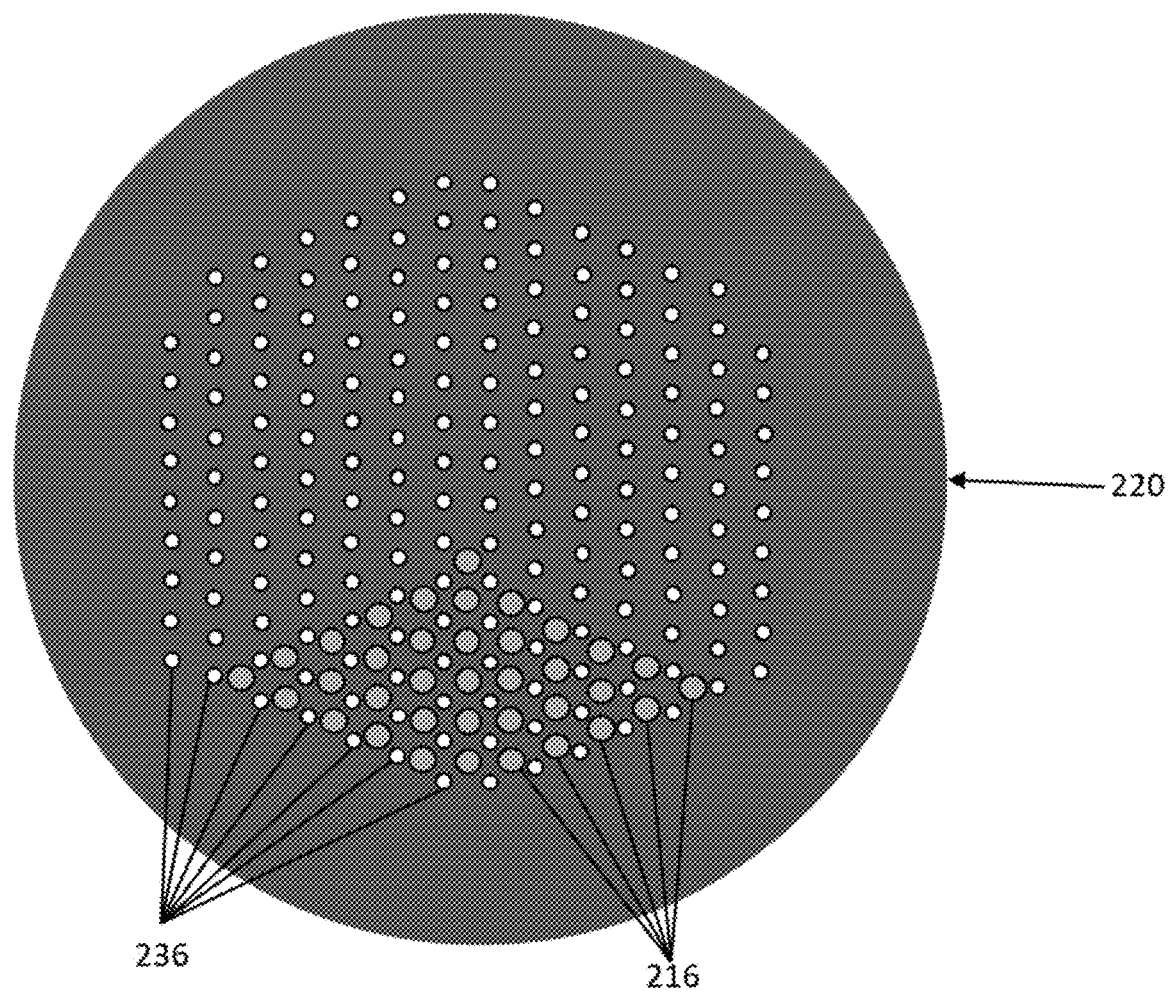
FIG. 23 is a schematic cross-sectional plan view of the second (e.g., bottom) surface of the source distributor showing the arrangement of the outlets of the plurality of conduits and the outlets of the plurality of laser injectors in one implementation of the example device shown in FIG. 21 and FIG. 22.

FIG. 23 is a schematic cross-sectional plan view of one implementation of the example device 200 shown in FIG. 21 and FIG. 22, showing the second surface (e.g., bottom surface) of the source distributor 220 and the arrangement of the outlets 216 of the plurality of laser injectors 210 and the outlets 236 of the plurality of conduits 230 in one implementation of the device 200. Referring now to FIG. 23, in some examples, the outlets 216 of the plurality of laser injectors 210 are all positioned in an ordered array within a quadrant of the source distributor 220; the outlets 236 of the plurality of conduits 230 are positioned in an ordered array and evenly spaced throughout the source distributor 220; the outlets 216 of each of the plurality of laser injectors 210 is located adjacent the outlet 236 of at least one of the plurality of conduits 230; and the outlets 216 of the plurality of laser injectors 210 are regularly interspersed between the outlets 236 of the plurality of conduits 230 within the quadrant of the source distributor 220. In some examples, the plurality of laser injectors 210 are positioned in the ordered array within a quadrant of the source distributor 220 so as to provide a uniform distribution of lasers over the rotatable substrate support surface 250 as the rotatable substrate support surface 250 is rotated, such that the first precursor 270 flows through at least one of the plurality of laser beams 262 within the chamber, thereby producing an irradiated first precursor 272 in situ within the chamber, prior to reaching the rotatable substrate support surface 250.

Each of the plurality of laser beams 262 comprises electromagnetic radiation with at least one wavelength that overlaps with at least a portion of a vibrational mode of the first precursor 270, thereby generating an active species (e.g., the irradiated first precursor 272) in situ. In some examples, the wavelength of the laser beams 262 are selected in view of the identity of the first precursor 270, such that each of the plurality of laser beams 262 comprises electromagnetic radiation with at least one wavelength that overlaps with at least a portion of a vibrational mode of the first precursor 270, such that irradiation of the first precursor 270 with the laser beam(s) 262 can enhance the cracking efficiency of the first precursor 270.

In some examples, the device 200 is configured to deposit a III-V semiconductor, such that the first precursor 270 comprises a V-group precursor and the second precursor 280 comprises a III-group precursor The first precursor 270 can, for example, comprise a V-group precursor, such as a compound, element, or composition comprising N, P, As, Sb, Bi, or a combination thereof. In some examples, the first precursor 270 can comprise a nitrogen species. In some examples, the first precursor 270 can comprise $NH_3$. The first precursor 270 can, for example, comprise a fluid, such as a gas. In some examples, the devices 200 can further comprise a first precursor source (not shown) fluidly coupled to the chamber 242 via the plurality of conduits 230.

The second precursor 280 can, for example, comprise a III-group precursor, such as compound, element, or composition comprising B, Al, Ga, In, Tl, or a combination thereof. In some examples, the second precursor 280 can comprise a gallium species. In some examples, the second precursor 280 can comprise trimethylgallium, triethylgallium, or a combination thereof. The second precursor 280 can, for example, comprise a fluid, such as a gas. In some examples, the devices 200 can further comprise a second precursor source (not shown) fluidly coupled to the chamber 242 via the plurality of conduits 230.

In some examples, the device 200 is configured to deposit a group III oxide semiconductor, such that the first precursor 270 comprises an oxygen containing precursor and the second precursor 280 comprises a III-group precursor.

In some examples, the device 200 is configured to deposit a group II-VI semiconductor material, such that the first precursor 270 comprises a VI-group precursor (e.g., a compound/composition/element comprising O, S, Se, Te, or a combination thereof) and the second precursor 280 comprises a II-group precursor (e.g., a compound/composition/element comprising Be, Mg, Ca, Sr, Ba, Zn, Cd, Hg, or a combination thereof).

In some examples, the device 200 is configured to deposit a group II-IV-$V_2$ semiconductor, such that the first precursor 270 comprises a V-group precursor (e.g., a compound, element, or composition comprising N, P, As, Sb, Bi, or a combination thereof) and the second precursor 280 comprises a mixture of a II-group precursor (e.g., a compound/composition/element comprising Be, Mg, Ca, Sr, Ba, Zn, Cd, Hg, or a combination thereof) and a IV-group precursor (e.g., a compound/composition/element comprising C, Si, Ge, Sn, Pb, or a combination thereof).

In some examples, the device 200 is configured to introduce the first precursor 270 into the chamber 242 continuously or intermittently. In some examples, the device 200 is configured to introduce the second precursor 280 continuously or intermittently.

In some examples, the device 200 is configured to introduce the first precursor 270 and the second precursor 280 into the chamber 242 alternately. In some examples, the device 200 is configured to introduce the first precursor 270 and the second precursor 280, wherein at least a portion of the introduction of the second precursor 280 is concurrent with at least a portion of the introduction of the first precursor 270, or vice versa. In some examples, the device 200 is configured to introduce the first precursor 270 and the second precursor 280 to the chamber simultaneously.

In some examples, the outlets 236 of the plurality of conduits 230 are further configured to introduce a dopant (e.g., one or more dopants) into the chamber 242 toward the rotatable substrate support surface 250. The one or more dopants can be selected in view of the first precursor 270 and/or the second precursor 280. The one or more dopants can be, for example, a fluid, such as a gas. In some examples, the one or more dopants can comprise an n-type dopant (e.g., silane ($SiH_4$), germane ($GeH_4$), disilane($Si_2H_6$)), a p-type dopant (e.g., bis(cyclopentadienyl)magnesium ($Cp_2Mg$), bis (methylcyclopentadienyl)magnesium (($MeCp)_2Mg$)), or a combination thereof. In some examples, the one or more dopants can comprise silane ($SiH_4$), germane ($GeH_4$), disilane($Si_2H_6$), bis(cyclopentadienyl)magnesium ($Cp_2Mg$), bis (methylcyclopentadienyl)magnesium (($MeCp)_2Mg$), or a combination thereof. The one or more dopants can, for example, be mixed with the first precursor 270 and/or the second precursor 280 prior to introduction into the chamber 242. In some examples, the device 200 is configured to introduce the first precursor 270, the second precursor 280, and the one or more dopants into the chamber 242 consecutively in turn. In some examples, the device 200 is configured to introduce the first precursor 270 and the one or more dopants, wherein at least a portion of the introduction of the one or more dopants is concurrent with at least a portion of the introduction of the first precursor 270, or vice versa. In some examples, the device 200 is configured to introduce the second precursor 280 and the one or more dopants, wherein at least a portion of the introduction of the one or more dopants is concurrent with at least a portion of the introduction of the second precursor 280, or vice versa. In some examples, the device 200 is configured to introduce the first precursor 270, the second precursor 180, and the one or more dopants into the chamber 242 simultaneously.

In some examples, the outlets 236 of the plurality of conduits 230 are further configured to introduce a carrier gas (e.g., one or more carrier gases) into the chamber 242 toward the rotatable substrate support surface 250. The one or more carrier gases can be selected in view of the first precursor 270, the second precursor 280, the one or more dopants when present, or a combination thereof. The one or more carrier gases can be, for example, argon, helium, $H_2$, $N_2$, and the like, or combinations thereof. The one or more carrier gases can, for example, be mixed with the first precursor 270, the second precursor 280, the one or more dopants when present, or a combination thereof prior to introduction into the chamber 242. In some examples, the device 200 is configured to introduce the first precursor 270, the second precursor 280, the one or more dopants when present, or a combination thereof concurrently with at least a portion of the introduction of the one or more carrier gases.

The devices 200 described herein can further comprise or be assembled with a variety of additional components. For example, the devices 200 can be assembled together with, or in some examples can further comprise, the wall 240 defining the chamber 242. The wall 240 can, in some examples be hollow such that a cooling medium can be included within the wall 240, for example to dissipate heat (e.g., from the heater, from the laser energy, or a combination thereof)). In some examples, the cooling medium can comprise water.

The devices 200 can, for example, be assembled together with, or in some examples can further comprise, the rotatable substrate support surface 250. The size and shape of the rotatable substrate support surface 250 can be selected in view of the size and shape of the chamber 242. The rotatable substrate support surface 250 can support one or more substrates (e.g., 2 or more, 3 or more, 4 or more, 5 or more, 6 or more, 7 or more, 8 or more, 9 or more, 10 or more, 15 or more, 20 or more, 25 or more, 30 or more, 35 or more, 40 or more, 45 or more, 50 or more, 60 or more, 70 or more, 80 or more, 90 or more, 100 or more, 150 or more, 200 or more, 250 or more, 300 or more, 350 or more, 400 or more, 450 or more, 500 or more, 600 or more, 700 or more, 800 or more, 900 or more, 1000 or more, 1500 or more, or 2000 or more) to be coated with a material via laser-assisted metal-organic vapor deposition from the first precursor 270 and the second precursor 280 (and one or more dopants, if present) within the chamber 242. The number of substrates disposed on the rotatable substrate support surface 250 can be selected, for example, in view of the size of the one or more substrates and/or the size of the rotatable substrate support surface 250. The devices 200 can, for example, be configured to rotate the rotatable substrate support 250 surface to thereby provide a more uniform coating of the material on the one or more substrates via laser-assisted metal-organic vapor deposition.

The one or more substrates can have an average characteristic dimension. The average characteristic dimension of the one or more substrates can, for example, be 1 inch or more (e.g., 2 inches or more, 3 inches or more, 4 inches or more, 5 inches or more, 6 inches or more, 7 inches or more, 8 inches or more, 9 inches or more, 10 inches or more, 11 inches or more, 12 inches or more, 13 inches or more, 14 inches or more, 15 inches or more, 16 inches or more, 17 inches or more, 18 inches or more, 19 inches or more, 20 inches or more, 25 inches or more, 30 inches or more, or 35 inches or more). In some examples, the average characteristic dimension of the one or more substrates can be 36 inches or less (e.g., 35 inches or less, 30 inches or less, 25 inches or less, 20 inches or less, 19 inches or less, 18 inches or less, 17 inches or less, 16 inches or less, 15 inches or less, 14 inches or less, 13 inches or less, 12 inches or less, 11 inches or less, 10 inches or less, 9 inches or less, 8 inches or less, 7 inches or less, 6 inches or less, 5 inches or less, 4 inches or less, 3 inches or less, or 2 inches or less). The average characteristic dimension of the one or more substrates can range from any of the minimum values described above to any of the maximum values described above. For example, the average characteristic dimension of the one or more substrates can be from 1 inch to 36 inches (e.g., from 1 inch to 18 inches, from 18 inches to 36 inches, from 1 inch to 6 inches, from 6 inches to 12 inches, from 12 inches to 18 inches, from 18 inches to 24 inches, from 24 inches to 30 inches, from 30 inches to 36 inches, from 2 inches to 36 inches, from 1 inch to 30 inches, from 2 inches to 30 inches, from 1 inch to 18 inches, from 1 inch to 12 inches, or from 2 inches to 8 inches).

The one or more substrates can be any shape, such as a regular shape, an irregular shape, an isotropic shape, or an anisotropic shape. In some examples, the shape of the one or more substrates can be substantially circular, ovate, ovoid, elliptic, triangular, rectangular, polygonal, etc. In some examples, the shape of the one or more substrates can be substantially circular, such that the average characteristic dimension is the diameter.

The one or more substrates can comprise any suitable material. Examples of suitable substrates include, but are not limited to, bulk GaN, GaN template, sapphire, $Al_2O_3$, $LiAlO_2$, Si, SiC, zinc oxide, bulk AlN, AlN on sapphire template, and combinations thereof.

The devices 200 can, for example, be assembled together with, or in some examples can further comprise, the laser device 260 for producing a plurality of laser beams 262. The laser device 260 can, for example, comprise one or more lasers. In some examples, the laser device 260 can further comprise a laser distributor for splitting each of the one or more lasers into a plurality of laser beams 262. The wavelength(s) of the one or more lasers can be selected, for example, in view of the identity of the first precursor 270. In some examples, the one or more lasers can comprise an infrared laser. In some examples, the one or more lasers can comprise a $CO_2$ laser, such as a tunable $CO_2$ laser. In some examples, the laser device 260 and/or the plurality of laser injectors 210 can further comprise one or more windows, wherein the plurality of laser beams 262 traverse the one or more windows before entering the chamber 242. The one or more windows can comprise any suitable material, such as, for example, ZnSe, ZnS, NaCl, KBr, and combinations thereof.

Figure 24:
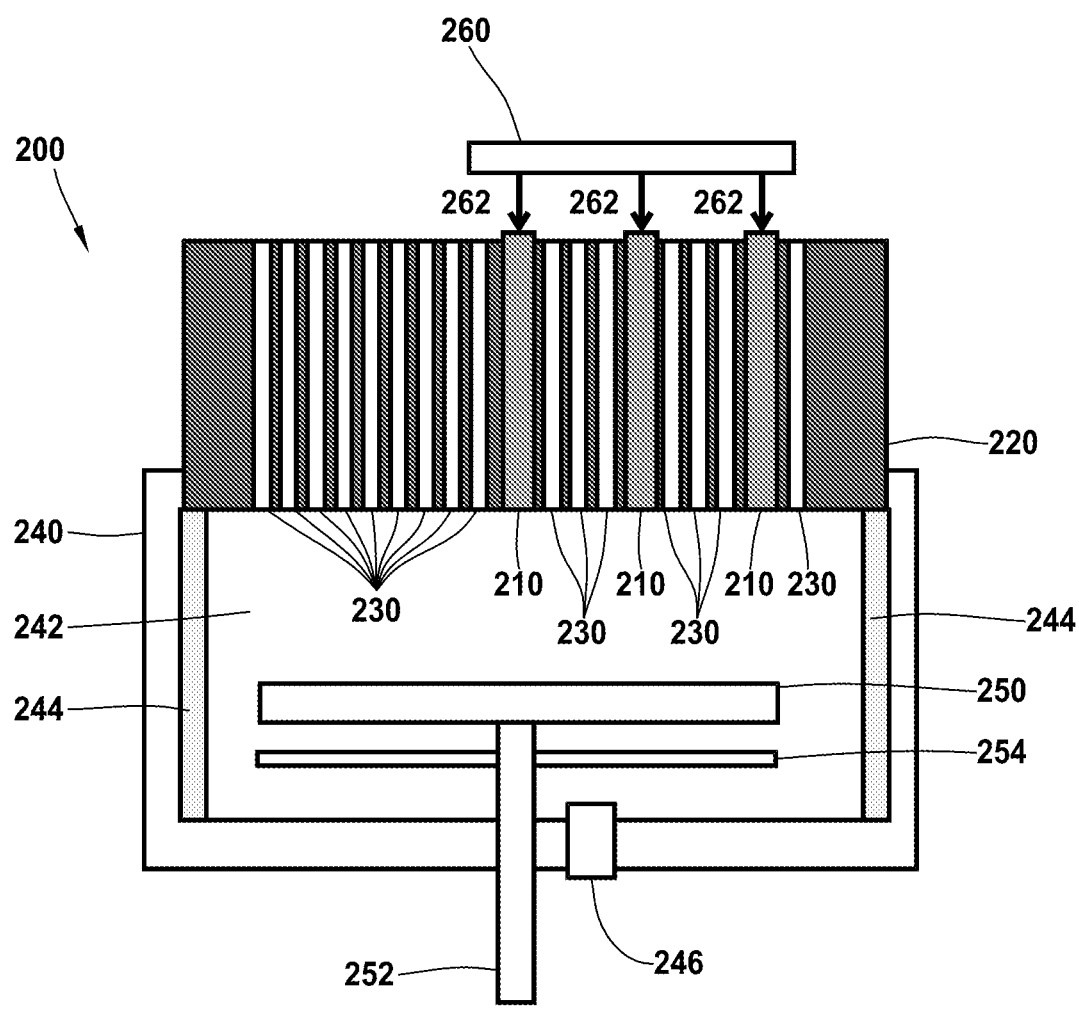
FIG. 24 is a schematic cross-sectional plan view of an example device as disclosed herein according to one implementation.
Figure 25:
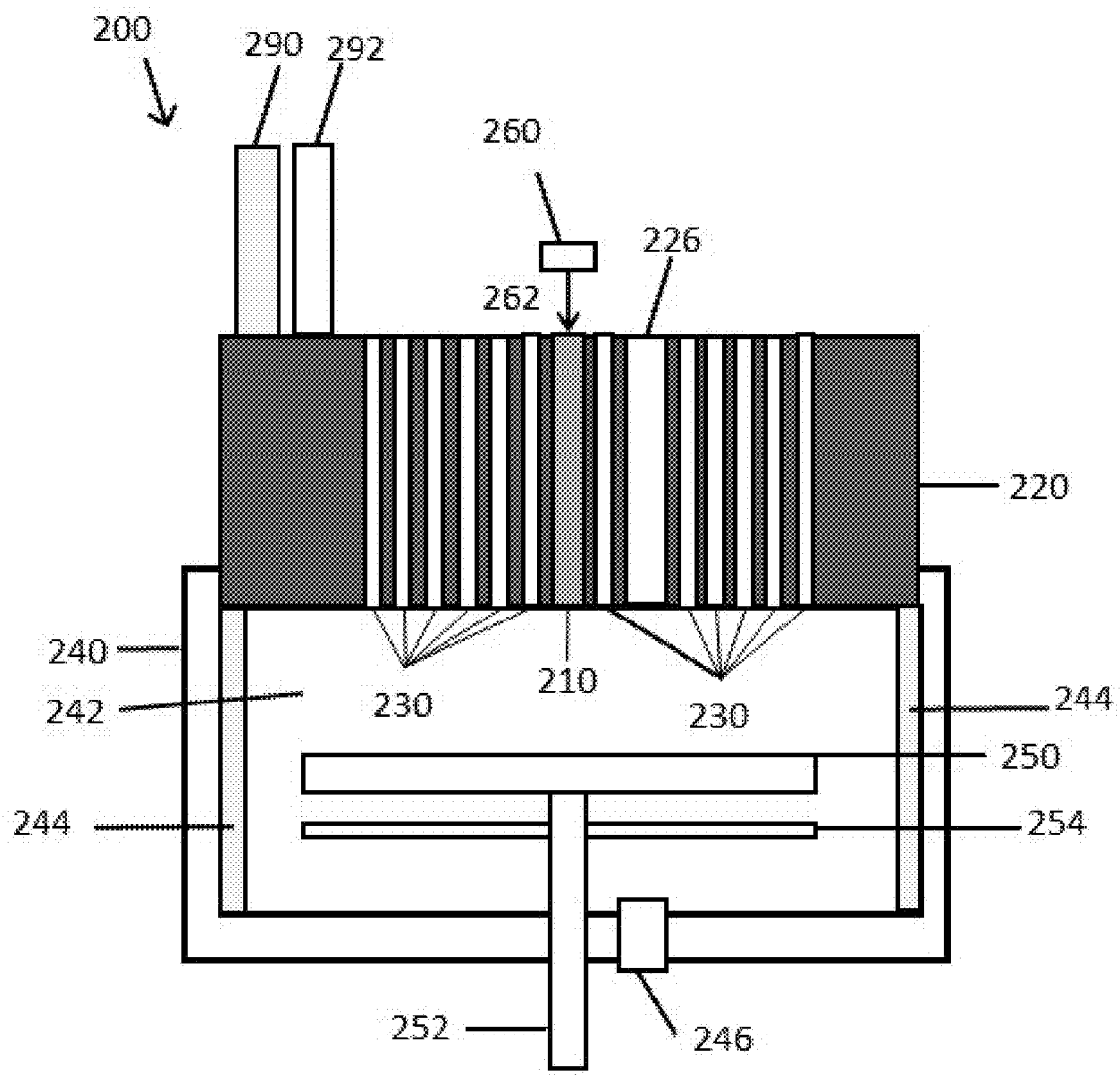
FIG. 25 is a schematic cross-sectional plan view, orthogonal to that of FIG. 24, of the example device shown in FIG. 24.

The devices 200 described herein can further comprise or be assembled with a variety of additional components, for example as shown in FIG. 24 and FIG. 25. Though some of the elements are only shown in FIG. 24 and FIG. 25, any of the one or more additional elements or any combination of the one or more additional elements shown in FIG. 24 and FIG. 25 can be present in any of the other embodiments of the devices 200 described herein.

Referring now to FIG. 24 and FIG. 25, in some examples, the interior surface of wall 240 (e.g., the surface of the wall 240 within the chamber 242) can further comprise a coating 244, wherein the coating 244 can comprise a material that can absorb at least a portion of the laser beam energy. Though the coating 244 is only shown in FIG. 24 and FIG. 25, the coating 244 can be present in any of the other embodiments of the devices 200 described herein.

In some examples, the wall 240 can further comprise an exhaust port 246 which fluidly couples the chamber 242 with an external environment. Though the exhaust port 246 is only shown in FIG. 24 and FIG. 25, the exhaust port 246 can be present in any of the other embodiments of the devices 200 described herein.

In some examples, the rotatable substrate support surface 250 can be coupled to or further comprise a rotary spindle 252. For example, the rotatable substrate support surface 250 can be centrally mounted on the rotary spindle 252, and the rotary spindle 252 can be rotated to rotate the rotatable substrate support surface 250. In some examples, the rotary spindle 252 can further be coupled to a means for rotating the rotary spindle 252. The devices 200 can, for example, be configured to rotate the rotary spindle 252 and thus rotate the rotatable substrate support surface 250 to thereby provide a more uniform coating of the material on the one or more substrates via laser-assisted metal-organic vapor deposition. Though the rotary spindle 252 is only shown in FIG. 24 and FIG. 25, the rotary spindle 252 can be present in any of the other embodiments of the devices 200 described herein.

In some examples, the devices 200 can further be assembled with, or in some examples can further comprise, a heater 254 thermally coupled to the rotatable substrate support surface 250 within the chamber 242. The heater 254 can, for example, be located below the rotatable substrate support surface 250, and optionally spaced apart from the rotatable substrate support surface 250, relative to the position of the outlets 236 of the plurality of conduits 230 and the outlets 216 of the plurality of laser injectors 210. In some examples, the devices 200 can further comprise a means for controlling the temperature of (e.g., heating) the heater 254. In some examples, the heater 254 can be heated such that the one or more substrates is at a temperature of 100° C. or more (e.g., 150° C. or more, 200° C. or more, 250° C. or more, 300° C. or more, 350° C. or more, 400° C. or more, 450° C. or more, 500° C. or more, 550° C. or more, 600° C. or more, 650° C. or more, 700° C. or more, 750° C. or more, 800° C. or more, 850° C. or more, 900° C. or more, 950° C. or more, 1000° C. or more, 1100° C. or more, 1200° C. or more, 1300° C. or more, 1400° C. or more, 1500° C. or more, 1600° C. or more, 1700° C. or more, 1800° C. or more, or 1900° C. or more). In some examples, the heater 254 can be heated such that the one or more substrates is at a temperature of 2000° C. or less (e.g., 1900° C. or less, 1800° C. or less, 1700° C. or less, 1600° C. or less, 1500° C. or less, 1400° C. or less, 1300° C. or less, 1200° C. or less, 1100° C. or less, 1000° C. or less, 950° C. or less, 900° C. or less, 850° C. or less, 800° C. or less, 750° C. or less, 700° C. or less, 650° C. or less, 600° C. or less, 550° C. or less, 500° C. or less, 450° C. or less, 400° C. or less, 350° C. or less, 300° C. or less, 250° C. or less, 200° C. or less, or 150° C. or less). The temperature at which the one or more substrates are heated by the heater 254 can range from any of the minimum values described above to any of the maximum values described above. For example, the heater 254 can be heated such that the one or more substrates is at a temperature of from 100° C. to 2000° C. (e.g., from 100° C. to 1000° C., from 1000° C. to 2000° C., from 100° C. to 500° C., from 500° C. to 900° C., from 900° C. to 1300° C., from 1300° C. to 1700° C., from 1700° C. to 2000° C., from 400° C. to 2000° C., from 100° C. to 1500° C., or from 400° C. to 1500° C.). Though the heater 254 is only shown in FIG. 24 and FIG. 25, the heater 254 can be present in any of the other embodiments of the devices 200 described herein.

The devices 200 can, for example, be assembled together with, or in some examples can further comprise, an in-situ monitor, such as a camera and/or a window. In some examples, the in-situ monitor can comprise a window or viewport 226 defined by the source distributor 220. The in-situ monitor can allow for visual inspection inside the chamber 242 when the device 200 is assembled. Though the viewport 226 is only shown in FIG. 24 and FIG. 25, the viewport 226 can be present in any of the other embodiments of the devices 200 described herein.

The devices 200 can, for example, be assembled together with, or in some examples can further comprise, a first precursor conduit 290 fluidly connected to the chamber 242 via the plurality of conduits 230. For example, the first precursor conduit 290 can be fluidly connected to each of the inlets 234 of the plurality of conduits 230, for example via the source distributor 220. The first precursor conduit 290 can, for example, fluidly connect a first precursor source (not shown) to the chamber 242 via the plurality of conduits 230. The first precursor conduit 290 can define an inlet, an outlet opposite and spaced apart from the inlet, and a path for fluid flow extending from the inlet to the outlet, wherein the inlet of the first precursor conduit 290 can be fluidly coupled to the first precursor source and the outlet of the first precursor conduit 290 can be fluidly connected to each of the inlets 234 of the plurality of conduits 230, for example via the source distributor 220. Though the first precursor conduit 290 is only shown in FIG. 24 and FIG. 25, the first precursor conduit 290 can be present in any of the other embodiments of the devices 200 described herein.

The devices 200 can, for example, be assembled together with, or in some examples can further comprise, a second precursor conduit 292 fluidly connected to the chamber 242 via the plurality of conduits 230. For example, the second precursor conduit 292 can be fluidly connected to each of the inlets 234 of the plurality of conduits 230, for example via the source distributor 220. The second precursor conduit 292 can, for example, fluidly connect a second precursor source (not shown) to the chamber 242 via the plurality of conduits 230. The second precursor conduit 292 can define an inlet, an outlet opposite and spaced apart from the inlet, and a path for fluid flow extending from the inlet to the outlet, wherein the inlet of the second precursor conduit 292 can be fluidly coupled to the second precursor source and the outlet of the second precursor conduit 292 can be fluidly connected to each of the inlets 234 of the plurality of conduits 230, for example via the source distributor 220. Though the second precursor conduit 292 is only shown in FIG. 24 and FIG. 25, the second precursor conduit 292 can be present in any of the other embodiments of the devices 200 described herein.

Figure 26:
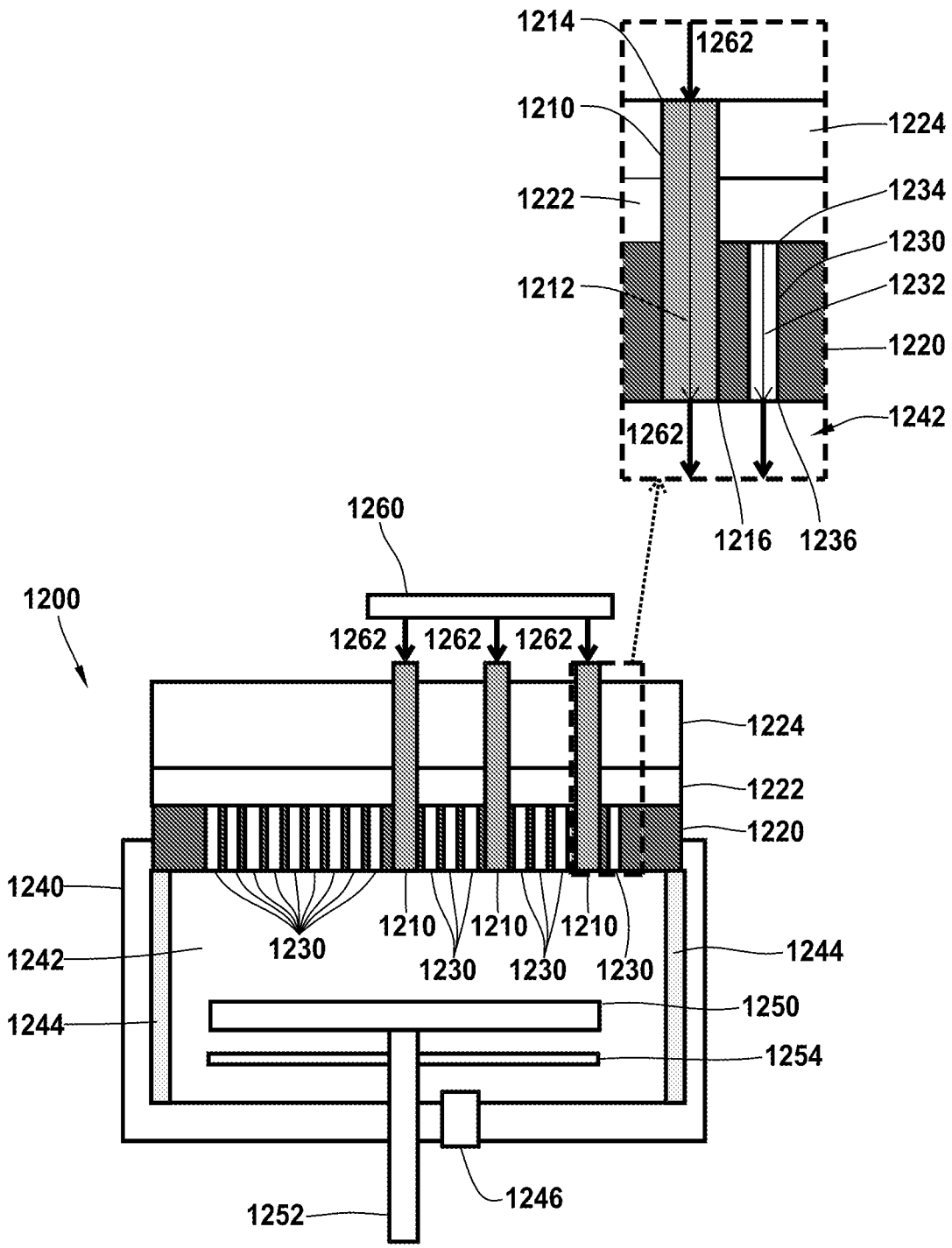
FIG. 26 is a cross-sectional plan view of a schematic of an example device as disclosed herein according to one implementation.
Figure 27:
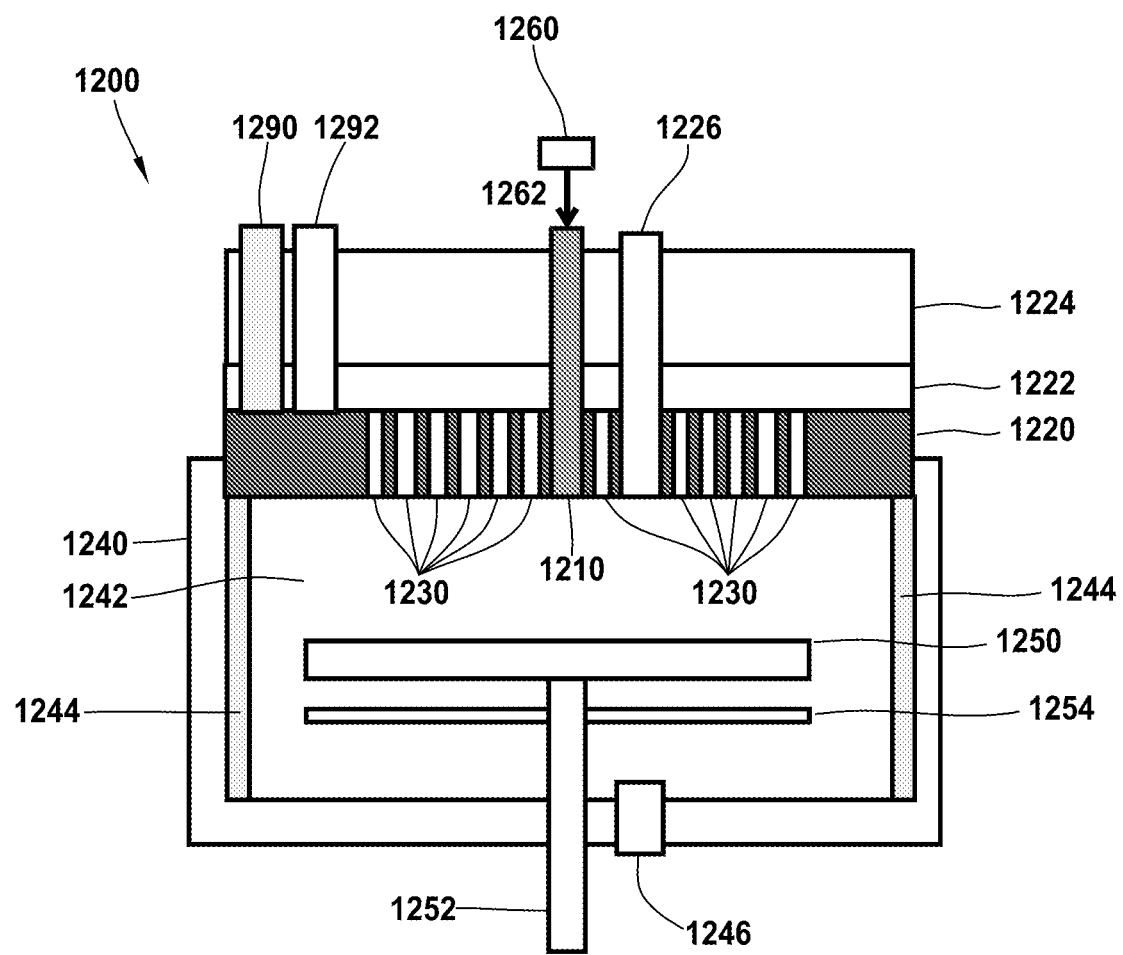
FIG. 27 is a schematic cross-sectional plan view, orthogonal to that of FIG. 26, of the example device shown in FIG. 26.

FIG. 26 and FIG. 27 show two orthogonal views of a laser-assisted metal-organic chemical vapor deposition (MOCVD) device 1200 according to one implementation described herein. Referring now to FIG. 26 and FIG. 27, the devices 1200 comprise: a wall 1240 defining a chamber 1242, a rotatable substrate support surface 1250 disposed within the chamber 1242, and a laser device 1260 for producing a plurality of laser beams 1262.

The wall 1240 can, in some examples be hollow such that a cooling medium can be included within the wall 1240, for example to dissipate heat (e.g., from the heater, from the laser energy, or a combination thereof)). In some examples, the cooling medium can comprise water. The devices 1200 further comprise, in some examples, a coating 1244 on the interior surface of the wall 1240 (e.g., the surface of the wall 1240 within the chamber 1242). The coating 1244 can comprise a material that can absorb at least a portion of the laser beam energy. The devices 1200 further comprise, in some examples, an exhaust port 1246 in the wall 1240 which fluidly couples the chamber 1242 with an external environment.

The size and shape of the rotatable substrate support surface 1250 can be selected in view of the size and shape of the chamber 1242. The rotatable substrate support surface 1250 can support one or more substrates (e.g., 2 or more, 3 or more, 4 or more, 5 or more, 6 or more, 7 or more, 8 or more, 9 or more, 10 or more, 15 or more, 20 or more, 25 or more, 30 or more, 35 or more, 40 or more, 45 or more, 50 or more, 60 or more, 70 or more, 80 or more, 90 or more, 100 or more, 150 or more, 200 or more, 250 or more, 300 or more, 350 or more, 400 or more, 450 or more, 500 or more, 600 or more, 700 or more, 800 or more, 900 or more, 1000 or more, 1500 or more, or 2000 or more) to be coated with a material via laser-assisted metal-organic vapor deposition from a first precursor 1270 and a second precursor 1280 (and one or more dopants, if present) within the chamber 1242. The number of substrates disposed on the rotatable substrate support surface 1250 can be selected, for example, in view of the size of the one or more substrates and/or the size of the rotatable substrate support surface 1250. The devices 1200 can, for example, be configured to rotate the rotatable substrate support 1250 surface to thereby provide a more uniform coating of the material on the one or more substrates via laser-assisted metal-organic vapor deposition.

The one or more substrates can have an average characteristic dimension. The average characteristic dimension of the one or more substrates can, for example, be 1 inch or more (e.g., 2 inches or more, 3 inches or more, 4 inches or more, 5 inches or more, 6 inches or more, 7 inches or more, 8 inches or more, 9 inches or more, 10 inches or more, 11 inches or more, 12 inches or more, 13 inches or more, 14 inches or more, 15 inches or more, 16 inches or more, 17 inches or more, 18 inches or more, 19 inches or more, 20 inches or more, 25 inches or more, 30 inches or more, or 35 inches or more). In some examples, the average characteristic dimension of the one or more substrates can be 36 inches or less (e.g., 35 inches or less, 30 inches or less, 25 inches or less, 20 inches or less, 19 inches or less, 18 inches or less, 17 inches or less, 16 inches or less, 15 inches or less, 14 inches or less, 13 inches or less, 12 inches or less, 11 inches or less, 10 inches or less, 9 inches or less, 8 inches or less, 7 inches or less, 6 inches or less, 5 inches or less, 4 inches or less, 3 inches or less, or 2 inches or less). The average characteristic dimension of the one or more substrates can range from any of the minimum values described above to any of the maximum values described above. For example, the average characteristic dimension of the one or more substrates can be from 1 inch to 36 inches (e.g., from 1 inch to 18 inches, from 18 inches to 36 inches, from 1 inch to 6 inches, from 6 inches to 12 inches, from 12 inches to 18 inches, from 18 inches to 24 inches, from 24 inches to 30 inches, from 30 inches to 36 inches, from 2 inches to 36 inches, from 1 inch to 30 inches, from 2 inches to 30 inches, from 1 inch to 18 inches, from 1 inch to 12 inches, or from 2 inches to 8 inches).

The one or more substrates can be any shape, such as a regular shape, an irregular shape, an isotropic shape, or an anisotropic shape. In some examples, the shape of the one or more substrates can be substantially circular, ovate, ovoid, elliptic, triangular, rectangular, polygonal, etc. In some examples, the shape of the one or more substrates can be substantially circular, such that the average characteristic dimension is the diameter.

The one or more substrates can comprise any suitable material. Examples of suitable substrates include, but are not limited to, bulk GaN, GaN template, sapphire, $Al_2O_3$, $LiAlO_2$, Si, SiC, zinc oxide, bulk AlN, AlN on sapphire template, and combinations thereof.

In some examples, the rotatable substrate support surface 1250 can be coupled to or further comprise a rotary spindle 1252. For example, the rotatable substrate support surface 1250 can be centrally mounted on the rotary spindle 1252, and the rotary spindle 1252 can be rotated to rotate the rotatable substrate support surface 1250. In some examples, the rotary spindle 1252 can further be coupled to a means for rotating the rotary spindle 1252. The devices 1200 can, for example, be configured to rotate the rotary spindle 1252 and thus rotate the rotatable substrate support surface 1250 to thereby provide a more uniform coating of the material on the one or more substrates via laser-assisted metal-organic vapor deposition.

The devices 1200 further comprise, in some examples, a heater 1254 thermally coupled to the rotatable substrate support surface 1250 within the chamber 1242. The heater 1254 can, for example, be located below the rotatable substrate support surface 1250, and optionally spaced apart from the rotatable substrate support surface 1250, relative to the position of the outlets 1236 of the plurality of conduits 1230 and the outlets 1216 of the plurality of laser injectors 1210. In some examples, the devices 1200 can further comprise a means for controlling the temperature of (e.g., heating) the heater 1254. In some examples, the heater 1254 can be heated such that the one or more substrates is at a temperature of 100° C. or more (e.g., 150° C. or more, 200° C. or more, 250° C. or more, 300° C. or more, 350° C. or more, 400° C. or more, 450° C. or more, 500° C. or more, 550° C. or more, 600° C. or more, 650° C. or more, 700° C. or more, 750° C. or more, 800° C. or more, 850° C. or more, 900° C. or more, 950° C. or more, 1000° C. or more, 1100° C. or more, 1200° C. or more, 1300° C. or more, 1400° C. or more, 1500° C. or more, 1600° C. or more, 1700° C. or more, 1800° C. or more, or 1900° C. or more). In some examples, the heater 1254 can be heated such that the one or more substrates is at a temperature of 2000° C. or less (e.g., 1900° C. or less, 1800° C. or less, 1700° C. or less, 1600° C. or less, 1500° C. or less, 1400° C. or less, 1300° C. or less, 1200° C. or less, 1100° C. or less, 1000° C. or less, 950° C. or less, 900° C. or less, 850° C. or less, 800° C. or less, 750° C. or less, 700° C. or less, 650° C. or less, 600° C. or less, 550° C. or less, 500° C. or less, 450° C. or less, 400° C. or less, 350° C. or less, 300° C. or less, 250° C. or less, 200° C. or less, 150° C. or less). The temperature at which the one or more substrates are heated by the heater 1254 can range from any of the minimum values described above to any of the maximum values described above. For example, the heater 1254 can be heated such that the one or more substrates is at a temperature of from 100° C. to 2000° C. (e.g., from 100° C. to 1000° C., from 1000° C. to 2000° C., from 100° C. to 500° C., from 500° C. to 900° C., from 900° C. to 1300° C., from 1300° C. to 1700° C., from 1700° C. to 2000° C., from 400° C. to 2000° C., from 100° C. to 1500° C., or from 400° C. to 1500° C.).

The laser device 1260 can, for example, comprise one or more lasers. In some examples, the laser device 1260 can further comprise a laser distributor for splitting each of the one or more lasers into a plurality of laser beams 1262. The wavelength(s) of the one or more lasers can be selected, for example, in view of the identity of the first precursor 1270. In some examples, the one or more lasers can comprise an infrared laser. In some examples, the one or more lasers can comprise a $CO_2$ laser, such as a tunable $CO_2$ laser. In some examples, the laser device 1260 and/or the plurality of laser injectors 1210 can further comprise one or more windows, wherein the plurality of laser beams 1262 traverse the one or more windows before entering the chamber 1242. The one or more windows can comprise any suitable material, such as, for example, ZnSe, ZnS, NaCl, KBr, and combinations thereof.

The devices 1200 further comprise a plurality of laser injectors 1210, wherein each of the plurality of laser injectors 1210 defines an inlet 1214, an outlet 1216 opposite and spaced apart from the inlet 1214, and an optical path 1212 extending from the inlet 1214 to the outlet 1216. The plurality of laser injectors 1210 are configured such that the outlet 1216 of each of the plurality of laser injectors 1210 directs one of the plurality of laser beams 1262 onto the rotatable substrate support surface 1250 disposed within the chamber 1242.

The plurality of laser injectors 1210 can include two or more laser injectors 1210 (e.g., 3 or more, 4 or more, 5 or more, 6 or more, 7 or more, 8 or more, 9 or more, 10 or more, 15 or more, 20 or more, 25 or more, 30 or more, 40 or more, 50 or more, 60 or more, 70 or more, 80 or more, 90 or more, 100 or more, 150 or more, 200 or more, 250 or more, 300 or more, 350 or more, 400 or more, 450 or more, 500 or more, 600 or more, 700 or more, 800 or more, 900 or more, or 1000 or more). The number of laser injectors 1210 can be selected in view of the size of the chamber 1242, the size of the rotatable substrate support surface 1250, or a combination thereof.

The plurality of laser injectors 1210 can be positioned in an ordered array. The ordered array can be designed, for example, in view of the number of laser injectors 1210, the size of the chamber 1242, the size of the rotatable substrate support surface 1250, and the like, or a combination thereof. In some examples, the ordered array can be designed so as to provide a uniform distribution of lasers over the rotatable substrate support surface as the rotatable substrate support surface is rotated.

The cross-sectional shape of each of the plurality of laser injectors 1210 in a plane perpendicular to the central longitudinal axis of said laser injector 1210 can be any shape, such as a regular shape, an irregular shape, an isotropic shape, or an anisotropic shape. In some examples, the cross-sectional shape of the plurality of laser injectors 1210 can be substantially circular, ovate, ovoid, elliptic, triangular, rectangular, polygonal, etc. In some examples, the cross-sectional shape of the plurality of laser injectors 1210 can be substantially circular.

The outlets 1216 of each of the plurality of laser injectors 1210 can be any shape, such as a regular shape, an irregular shape, an isotropic shape, or an anisotropic shape. In some examples, the outlets 1216 of the plurality of laser injectors 1210 can have a shape that is substantially circular, ovate, ovoid, elliptic, triangular, rectangular, polygonal, etc. In some examples, the shape of the outlets 1216 of the plurality of laser injectors 1210 can be substantially circular. The outlets 1216 of each of the plurality of laser injectors 1210 can, for example, be the cross-section in a plane perpendicular to the longitudinal axis of said laser injector 1210, such that the shape of the outlet 1216 of each of the plurality of laser injectors 1210 can be the cross-sectional shape of each of the plurality of laser injectors 1210.

The plurality of laser injectors 1210 can be configured such that each of the laser beams 1262 has an average spot size on the rotatable substrate support surface 1250. The plurality of laser injectors 1210 can, for example, be configured such that the average spot size of the plurality of laser beams 1262 on the rotatable substrate support surface can be 1 millimeters (mm) or more (e.g., 5 mm or more, 10 mm or more, 15 mm or more, 20 mm or more, 25 mm or more, 30 mm or more, 35 mm or more, 40 mm or more, 45 mm or more, 50 mm or more, 60 mm or more, 70 mm or more, 80 mm or more, or 90 mm or more). In some examples, the plurality of laser injectors 1210 can be configured such that the average spot size of the plurality of laser beams 1262 on the rotatable substrate support surface 1250 can be 100 mm or less (e.g., 90 mm or less, 80 mm or less, 70 mm or less, 60 mm or less, 50 mm or less, 45 mm or less, 40 mm or less, 35 mm or less, 30 mm or less, 25 mm or less, 20 mm or less, 15 mm or less, 10 mm or less, or 5 mm or less). The average spot size of the plurality of laser beams 1262 on the rotatable substrate support surface 1250 can range from any of the minimum values described above to any of the maximum values described above. For example, the plurality of laser injectors 1210 can be configured such that the average spot size of the plurality of laser beams 1262 on the rotatable substrate support surface 1250 can be from 1 mm to 100 mm (e.g., from 1 mm to 50 mm, from 50 mm to 100 mm, from 1 mm to 20 mm, from 20 mm to 40 mm, from 40 mm to 60 mm, from 60 mm to 80 mm, from 80 mm to 100 mm, from 5 mm to 100 mm, from 1 mm to 90 mm, from 5 mm to 90 mm, from 1 mm to 80 mm, from 1 mm to 60 mm, or from 5 mm to 50 mm).

Each of the plurality of laser injectors 1210 can, for example, include one or more lenses 1218 for expanding each of the laser beams 1262 onto the rotatable substrate support surface 1250, e.g., such that each of the laser beams 1262 has the average spot size on the rotatable substrate support surface 1250. The one or more lenses 1218 can be any type of lens, such as a simple lens, a compound lens, a spherical lens, a toric lens, a biconvex lens, a plano-convex lens, a plano-concave lens, a negative meniscus lens, a positive meniscus lens, a biconcave lens, a converging lens, a diverging lens, a cylindrical lens, a Fresnel lens, a lenticular lens, a gradient index lens, or a combination thereof. The one or more lenses 1218 can be selected to control the spot size of each of the laser beams 1262 on the rotatable substrate support surface 1250, the uniformity of each of the laser beams 1262 (e.g., with respect to intensity) on the rotatable substrate support surface 1250, or a combination thereof.

For example, each of the plurality of laser injectors 1210 can include a convex lens 1218a and a concave lens 1218b for expanding each of the laser beams 1262 onto the rotatable substrate support surface 1250. The convex lens 1218a can reduce the waist of the incident laser beam 1262 from $\omega_0$ to $\omega_1$ and increase the divergence angle of the incident laser beam 1262. The concave lens 1218b can be located at the focal point of the convex lens 1218a, $f_1$, to expand the laser beam 1262 size to $\omega_2$ on the rotatable substrate support surface 1250, e.g., the spot size. The concave lens 1218b can also improve the uniformity of the laser beam 1262 inside the Gaussian laser spot on the rotatable substrate support surface 1250.

The number of laser injectors 1210, the arrangement of the laser injectors 1210, the cross-sectional shape of the laser injectors 1210, the number and/or types of lenses in the laser injectors 1210, the average spot size of the laser beams 1262 on the rotatable substrate support surface 1250, or a combination thereof can be selected, for example, in view of the wavelength(s) of the laser beams 1262, the intensity of the laser beams 1262 within the chamber 1242, the size of the chamber 1242, the size of the rotatable substrate support surface 1250, or a combination thereof.

The devices 1200 further comprise a plurality of conduits 1230, wherein each of the plurality of conduits 1230 defines an inlet 1234, an outlet 1236 opposite and spaced apart from the inlet 1234, and a path for fluid flow 1232 extending from the inlet 1234 to the outlet 1236. The outlets 1236 of the plurality of conduits 1230 are configured to introduce a first precursor 1270 and a second precursor 1280 into the chamber 1242 toward the rotatable substrate support surface 1250.

The plurality of conduits 1230 can include two or more conduits (e.g., 3 or more, 4 or more, 5 or more, 6 or more, 7 or more, 8 or more, 9 or more, 10 or more, 15 or more, 20 or more, 25 or more, 30 or more, 40 or more, 50 or more, 60 or more, 70 or more, 80 or more, 90 or more, 100 or more, 150 or more, 200 or more, 250 or more, 300 or more, 350 or more, 400 or more, 450 or more, 500 or more, 600 or more, 700 or more, 800 or more, 900 or more, or 1000 or more). The number of conduits 1230 can be selected in view of the size of the chamber 1242, the size of the rotatable substrate support surface 1250, or a combination thereof. In some embodiments, the plurality of first conduits 1230 can be arranged in an ordered array.

The cross-sectional shape of each of the plurality of conduits 1230 in a plane perpendicular to the central longitudinal axis of said conduit 1230 can be any shape, such as a regular shape, an irregular shape, an isotropic shape, or an anisotropic shape. In some examples, the cross-sectional shape of the plurality of conduits 1230 can be substantially circular, ellipsoidal, triangular, rectangular, polygonal, etc. In some examples, the cross-sectional shape of the plurality of conduits 1230 can be substantially circular.

The plurality of conduits 1230 can have an average characteristic dimension. The average characteristic dimension of the plurality of conduits 1230 can, for example, be 0.1 millimeter (mm) or more (e.g., 0.25 mm or more, 0.5 mm or more, 0.75 mm or more, 1 mm or more, 1.25 mm or more, 1.5 mm or more, 1.75 mm or more, 2 mm or more, 2.5 mm or more, 3 mm or more, 3.5 mm or more, 4 mm or more, or 4.5 mm or more). In some examples, the average characteristic dimension of the plurality of conduits 1230 can be 5 mm or less (e.g., 4.5 mm or less, 4 mm or less, 3.5 mm or less, 3 mm or less, 2.5 mm or less, 2 mm or less, 1.75 mm or less, 1.5 mm or less, 1.25 mm or less, 1 mm or less, 0.75 mm or less, 0.5 mm or less, or 0.25 mm or less). The average characteristic dimension of the plurality of conduits 1230 can range from any of the minimum values described above to any of the maximum values described above. For examples, the average characteristic dimension of the plurality of conduits 1230 can be from 0.1 mm to 5 mm (e.g., from 0.1 mm to 2.5 mm, from 2.5 mm to 5 mm, from 0.1 mm to 1 mm, from 1 mm to 2 mm, from 2 mm to 3 mm, from 3 mm to 4 mm, from 4 mm to 5 mm, from 0.5 mm to 5 mm, from 0.1 mm to 4.5 mm, from 0.5 mm to 4.5 mm, from 0.1 mm to 4 mm, from 0.1 mm to 3 mm, or from 0.5 mm to 2 mm).

The outlets 1236 of each of the plurality of conduits 1230 can be any shape, such as a regular shape, an irregular shape, an isotropic shape, or an anisotropic shape. In some examples, the outlets 1236 of the plurality of conduits 1230 can have a shape that is substantially circular, ellipsoidal, triangular, rectangular, polygonal, etc. In some examples, the shape of the outlets 1236 of the plurality of conduits 1230 can be substantially circular. The outlet 1236 of each of the plurality of conduits 1230 can, for example, be the cross-section in a plane perpendicular to the central longitudinal axis of said conduit 1230, such that the shape of the outlet 1236 of each of the plurality of conduits 1230 can be the cross-sectional shape of each of the plurality of conduits 1230.

The outlets 1236 of the plurality of conduits 1230 can have an average characteristic dimension. The average characteristic dimension of the outlets 1236 of the plurality of conduits 1230 can, for example, be 0.1 millimeter (mm) or more (e.g., 0.25 mm or more, 0.5 mm or more, 0.75 mm or more, 1 mm or more, 1.25 mm or more, 1.5 mm or more, 1.75 mm or more, 2 mm or more, 2.5 mm or more, 3 mm or more, 3.5 mm or more, 4 mm or more, or 4.5 mm or more). In some examples, the average characteristic dimension of the outlets 1236 of the plurality of conduits 1230 can be 5 mm or less (e.g., 4.5 mm or less, 4 mm or less, 3.5 mm or less, 3 mm or less, 2.5 mm or less, 2 mm or less, 1.75 mm or less, 1.5 mm or less, 1.25 mm or less, 1 mm or less, 0.75 mm or less, 0.5 mm or less, or 0.25 mm or less). The average characteristic dimension of the outlets 1236 of the plurality of conduits 1230 can range from any of the minimum values described above to any of the maximum values described above. For examples, the average characteristic dimension of the outlets 1236 of the plurality of conduits 1230 can be from 0.1 mm to 5 mm (e.g., from 0.1 mm to 2.5 mm, from 2.5 mm to 5 mm, from 0.1 mm to 1 mm, from 1 mm to 2 mm, from 2 mm to 3 mm, from 3 mm to 4 mm, from 4 mm to 5 mm, from 0.5 mm to 5 mm, from 0.1 mm to 4.5 mm, from 0.5 mm to 4.5 mm, from 0.1 mm to 4 mm, from 0.1 mm to 3 mm, or from 0.5 mm to 2 mm).

In some examples, the each of the outlets 1236 of the plurality of conduits 1230 can further comprise a nozzle (not shown) fluidly connected to each of the outlets 1236 of the plurality of conduits 1230. Each nozzle can, for example, have an average characteristic dimension and a cross-sectional shape, wherein the average characteristic dimension of the nozzles, the cross-sectional shape of the nozzles, or a combination thereof can be the same or different than that of the outlets 1236 of the plurality of conduits 1230. In some examples, the average characteristic dimension of the nozzles can be smaller than the average characteristic dimension of the outlets 1236 of the plurality of conduits 1230. In some examples, the cross-sectional shape of the nozzles can be substantially circular. The average characteristic dimension of the nozzles, the cross-sectional shape of the nozzles, the orientation of the nozzles, or a combination thereof can be used to affect and/or control how the first precursor 1270 and/or the second precursor 1280 is/are introduced into the chamber 1242 (e.g., speed, direction, volume, etc.).

The number of conduits 1230, the arrangement of the conduits 1230, the cross-sectional shape of the conduits 1230, the shape of the outlets 1236 of the conduits 1230, the average characteristic dimension of the outlets 1236 of the conduits 1230, the presence or absence of the nozzles fluidly connected to each of the outlets 1236 of the plurality of conduits 1230, the average characteristic dimension of the nozzles fluidly connected to each of the outlets 1236 of the plurality of conduits 1230, the cross-sectional shape of the nozzles fluidly connected to each of the outlets 1236 of the plurality of conduits 1230, or a combination thereof can be selected, for example, in view of the number of laser injectors 1210, the location of the laser injectors 1210, the size of the laser beams 1262, the wavelength(s) of the laser beams 1262, the intensity of the laser beams 1262 within the chamber 1242, the size of the chamber 1242, the size of the rotatable substrate support surface 1250, or a combination thereof.

In some examples, the outlets 1236 of the plurality of conduits 1230 are configured to introduce the first precursor 1270 and the second precursor 1280 substantially uniformly throughout the chamber 1242. In some examples, the outlets 1236 of the plurality of conduits 1230 are configured to introduce the first precursor 1270 and the second precursor 1280 substantially parallel to a central axis of each of the plurality of laser beams 1262 within the chamber 1242. In some examples, the plurality of conduits 1230 can comprise a set of first conduits and a set of second conduits, the outlets of the set of first conduits being configured to introduce the first precursor 1270 into the chamber 1242 toward the rotatable substrate support surface 1250, the outlets of the set of second conduits being configured to introduce the second precursor 1280 into the chamber 1242 toward the rotatable substrate support surface 1250. In some examples, the outlets 1236 of the plurality of conduits 1230 are configured to introduce the first precursor 1270 and the second precursor 1280 substantially parallel to a central axis of each of the plurality of laser beams 1262 within the chamber 242 and the first precursor 1270 flows through at least one of the plurality of laser beams 1262 within the chamber, thereby producing an irradiated first precursor 1272 in situ within the chamber, prior to reaching the rotatable substrate support surface 1250.

Each of the plurality of laser beams 1262 comprises electromagnetic radiation with at least one wavelength that overlaps with at least a portion of a vibrational mode of the first precursor 1270, thereby generating an active species (e.g., the irradiated first precursor 1272) in situ. In some examples, the wavelength of the laser beams 1262 are selected in view of the identity of the first precursor 1270, such that each of the plurality of laser beams 1262 comprises electromagnetic radiation with at least one wavelength that overlaps with at least a portion of a vibrational mode of the first precursor 1270, such that irradiation of the first precursor 1270 with the laser beam(s) 1262 can enhance the cracking efficiency of the first precursor 1270.

In some examples, the device 1200 is configured to deposit a III-V semiconductor, such that the first precursor 1270 comprises a V-group precursor and the second precursor 1280 comprises a III-group precursor.

The first precursor 1270 can, for example, comprise a V-group precursor, such as a compound, element, or composition comprising N, P, As, Sb, Bi, or a combination thereof. In some examples, the first precursor 1270 can comprise a nitrogen species. In some examples, the first precursor 1270 can comprise $NH_3$. The first precursor 1270 can, for example, comprise a fluid, such as a gas.

The second precursor 1280 can, for example, comprise a III-group precursor, such as compound, element, or composition comprising B, Al, Ga, In, Tl, or a combination thereof. In some examples, the second precursor 1280 can comprise a gallium species. In some examples, the second precursor 1280 can comprise trimethylgallium, triethylgallium, or a combination thereof. The second precursor 1280 can, for example, comprise a fluid, such as a gas.

In some examples, the device 1200 is configured to deposit a group III oxide semiconductor, such that the first precursor 1270 comprises an oxygen containing precursor and the second precursor 1280 comprises a III-group precursor.

In some examples, the device 1200 is configured to deposit a group II-VI semiconductor material, such that the first precursor 1270 comprises a VI-group precursor (e.g., a compound/composition/element comprising O, S, Se, Te, or a combination thereof) and the second precursor 1280 comprises a II-group precursor (e.g., a compound/composition/element comprising Be, Mg, Ca, Sr, Ba, Zn, Cd, Hg, or a combination thereof).

In some examples, the device 1200 is configured to deposit a group II-IV-$V_2$ semiconductor, such that the first precursor 1270 comprises a V-group precursor (e.g., a compound, element, or composition comprising N, P, As, Sb, Bi, or a combination thereof) and the second precursor 1280 comprises a mixture of a II-group precursor (e.g., a compound/composition/element comprising Be, Mg, Ca, Sr, Ba, Zn, Cd, Hg, or a combination thereof) and a IV-group precursor (e.g., a compound/composition/element comprising C, Si, Ge, Sn, Pb, or a combination thereof).

In some examples, the device 1200 is configured to introduce the first precursor 1270 into the chamber 1242 continuously or intermittently. In some examples, the device 1200 is configured to introduce the second precursor 1280 continuously or intermittently.

In some examples, the device 1200 is configured to introduce the first precursor 1270 and the second precursor 1280 into the chamber 1242 alternately. In some examples, the device 1200 is configured to introduce the first precursor 1270 and the second precursor 1280, wherein at least a portion of the introduction of the second precursor 1280 is concurrent with at least a portion of the introduction of the first precursor 1270, or vice versa. In some examples, the device 1100 is configured to introduce the first precursor 1270 and the second precursor 1280 to the chamber simultaneously.

In some examples, the outlets 1236 of the plurality of conduits 1230 are further configured to introduce a dopant (e.g., one or more dopants) into the chamber 1242 toward the rotatable substrate support surface 1250. The one or more dopants can be selected in view of the first precursor 1270 and/or the second precursor 1280. The one or more dopants can be, for example, a fluid, such as a gas. In some examples, the one or more dopants can comprise an n-type dopant (e.g., silane ($SiH_4$), germane ($GeH_4$), disilane ($Si_2H_6$)), a p-type dopant (e.g., bis(cyclopentadienyl)magnesium ($Cp_2Mg$), bis(methylcyclopentadienyl)magnesium (($MeCp)_2Mg$)), or a combination thereof. In some examples, the one or more dopants can comprise silane ($SiH_4$), germane ($GeH_4$), disilane($Si_2H_6$), bis(cyclopentadienyl)magnesium ($Cp_2Mg$), bis(methylcyclopentadienyl)magnesium (($MeCp)_2Mg$), or a combination thereof. The one or more dopants can, for example, be mixed with the first precursor 1270 and/or the second precursor 1280 prior to introduction into the chamber 1242. In some examples, the device 1200 is configured to introduce the first precursor 1270, the second precursor 1280, and the one or more dopants into the chamber 1242 consecutively in turn. In some examples, the device 1200 is configured to introduce the first precursor 1270 and the one or more dopants, wherein at least a portion of the introduction of the one or more dopants is concurrent with at least a portion of the introduction of the first precursor 1270, or vice versa. In some examples, the device 1200 is configured to introduce the second precursor 1280 and the one or more dopants, wherein at least a portion of the introduction of the one or more dopants is concurrent with at least a portion of the introduction of the second precursor 1280, or vice versa. In some examples, the device is configured to introduce the first precursor 1270, the second precursor 1280, and the one or more dopants into the chamber 1242 simultaneously.

In some examples, the outlets 1236 of the plurality of conduits 1230 are further configured to introduce a carrier gas (e.g., one or more carrier gases) into the chamber 1242 toward the rotatable substrate support surface 1250. The one or more carrier gases can be selected in view of the first precursor 1270, the second precursor 1280, the one or more dopants when present, or a combination thereof. The one or more carrier gases can be, for example, argon, helium, $H_2$, $N_2$, and the like, or combinations thereof. The one or more carrier gases can, for example, be mixed with the first precursor 1270, the second precursor 1280, the one or more dopants when present, or a combination thereof prior to introduction into the chamber 1242. In some examples, the device 1200 is configured to introduce the first precursor 1270, the second precursor 1280, the one or more dopants when present, or a combination thereof concurrently with at least a portion of the introduction of the one or more carrier gases.

The devices 1200 further comprise a source distributor 1220, the source distributor 1220 having a first surface and a second surface opposite and spaced apart from the first surface, the second surface being substantially parallel and spaced apart from the rotatable substrate support surface 1250, wherein the plurality of conduits 1230 are defined by the source distributor 1220 and traverse the source distributor 1220 from the first surface to the second surface. The source distributor 1220 can, for example, form a lid to the chamber 1242.

The source distributor 1220 can, in some examples, be hollow such that a cooling medium can be included within the source distributor 1220, for example to dissipate heat (e.g., from the heater, from the laser energy, or a combination thereof). The source distributor 1220 can, in some examples, comprise inside space (not shown), which have an inlet fluidly connected to an outlet, wherein the inlet and the outlet are configured to provide a path for flowing the cooling medium through the inside space within the source distributor. In some examples, the cooling medium can comprise water.

In some examples, the outlets 1216 of the plurality of laser injectors 1210 are all positioned in an ordered array within a quadrant of the source distributor 1220. In some examples, the plurality of laser injectors 1210 are positioned in the ordered array within a quadrant of the source distributor 1220 so as to provide a uniform distribution of lasers over the rotatable substrate support surface 1250 as the rotatable substrate support surface 1250 is rotated. In some examples, the outlets 1236 of the plurality of conduits 1230 are positioned in an ordered array and evenly spaced throughout the source distributor 1220, such that the outlets 1236 of the plurality of conduits 1230 are configured to introduce the first precursor 1270 and the second precursor

1280 substantially uniformly throughout the chamber 1242. In some examples, the outlet 1216 of each of the plurality of laser injectors 1210 is located adjacent the outlet 1236 of at least one of the plurality of conduits 1230 and the outlets 1216 of the plurality of laser injectors 1210 are regularly interspersed between the outlets 1236 of the plurality of conduits 1230 within the quadrant of the source distributor 1220; the outlets 1236 of the plurality of conduits 1230 are configured to introduce the first precursor 1270 and the second precursor 1280 substantially parallel to a central axis of each of the plurality of laser beams 1262 within the chamber 1242 and the first precursor 1270 flows through at least one of the plurality of laser beams 1262 within the chamber, thereby producing an irradiated first precursor 1272 in situ within the chamber, prior to reaching the rotatable substrate support surface 1250.

In some examples, the plurality of conduits 1230 can comprise a set of first conduits and a set of second conduits, the outlets of the set of first conduits being configured to introduce the first precursor 1270 into the chamber 1242 toward the rotatable substrate support surface 1250, the outlets of the set of second conduits being configured to introduce the second precursor 1280 into the chamber 1242 toward the rotatable substrate support surface 1250, wherein the outlets of the plurality of conduits 1230 are all located within the same quadrant of the source distributor 1220 as the plurality of laser injectors 1210.

The devices 1200 further comprise a cooling plate 1222 thermally coupled to the source distributor 1220, wherein the cooling plate 1222 is in contact with the first surface of the source distributor 1220; and a top cover 1224, wherein the top cover 1224 is located above and in contact with the cooling plate 1222, such that the cooling plate 1222 is sandwiched between the source distributor 1220 and the top cover 1224, and wherein the source distributor 1220, the cooling plate 1222, and the top cover 1224 define the plurality of laser injectors 1210. The cooling plate 1222 can be configured to cool the source distributor 1220. In some examples, the devices 1200 can further comprise a means for controlling the temperature of (e.g., cooling) the cooling plate 1222. The cooling plate 1222 can, in some examples, be hollow such that a cooling medium can be included within the cooling plate 1222, for example to dissipate heat (e.g., from the heater, from the laser energy, or a combination thereof). In some examples, the cooling medium can comprise water.

The devices 1200 further comprise an in-situ monitor viewport 1226 defined by the source distributor, the cooling plate, and top cover. The in-situ monitor viewport 1226 can allow for visual inspection inside the chamber 1242 when the device 1200 is assembled.

The devices 1200 further comprise, for example, a first precursor conduit 1290 defining an inlet, an outlet opposite and spaced apart from the inlet, and a path for fluid flow extending from the inlet to the outlet, wherein the outlet of the first precursor conduit 1290 can be fluidly connected to each of the inlets 1234 of the plurality of conduits 1230, for example via the source distributor 1220; wherein, the cooling plate 1222 and the top cover 1224 define the first precursor conduit 1292. The first precursor conduit 1292 can be fluidly connected to the chamber 1242 via the plurality of conduits 1230. The first precursor conduit 1292 can, for example, fluidly connect a first precursor source (not shown) to the chamber 1242 via the plurality of conduits 1230.

The devices 1200 further comprise, for example, a second precursor conduit 1292 defining an inlet, an outlet opposite and spaced apart from the inlet, and a path for fluid flow extending from the inlet to the outlet, wherein the outlet of the second precursor conduit 1292 can be fluidly connected to each of the inlets 1234 of the plurality of conduits 1230, for example via the source distributor 1220; wherein, the cooling plate 1222 and the top cover 1224 define the second precursor conduit 1292. The second precursor conduit 1292 can be fluidly connected to the chamber 1242 via the plurality of conduits 1230. The second precursor conduit 1292 can, for example, fluidly connect a second precursor source (not shown) to the chamber 1242 via the set of second conduits 1230.

Figure 28:
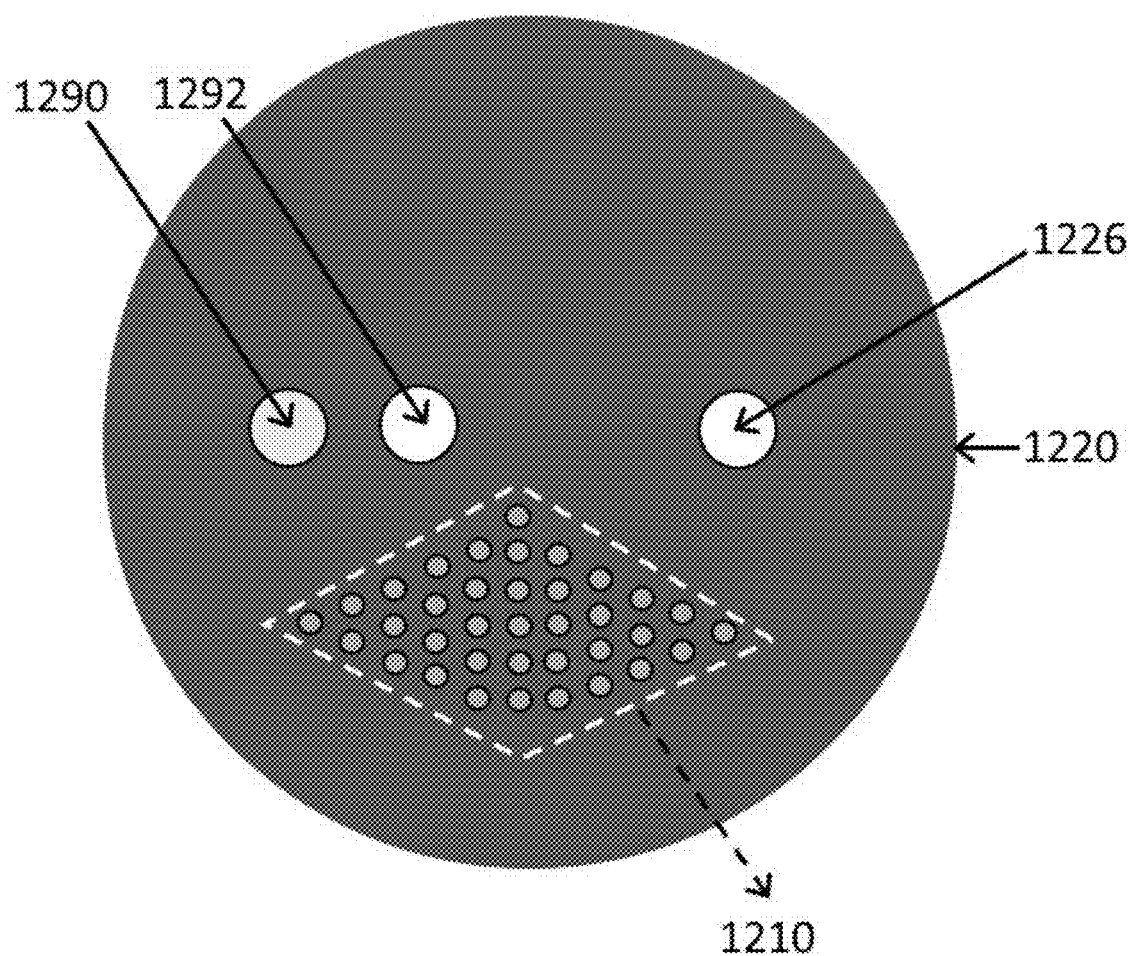
FIG. 28 is a schematic cross-sectional plan view of the first (e.g., top) surface of the source distributor showing the arrangement of the first precursor conduit, the second precursor conduit, the viewport, and the plurality of laser injectors in one implementation of the example device shown in FIG. 26 and FIG. 27.
Figure 29:
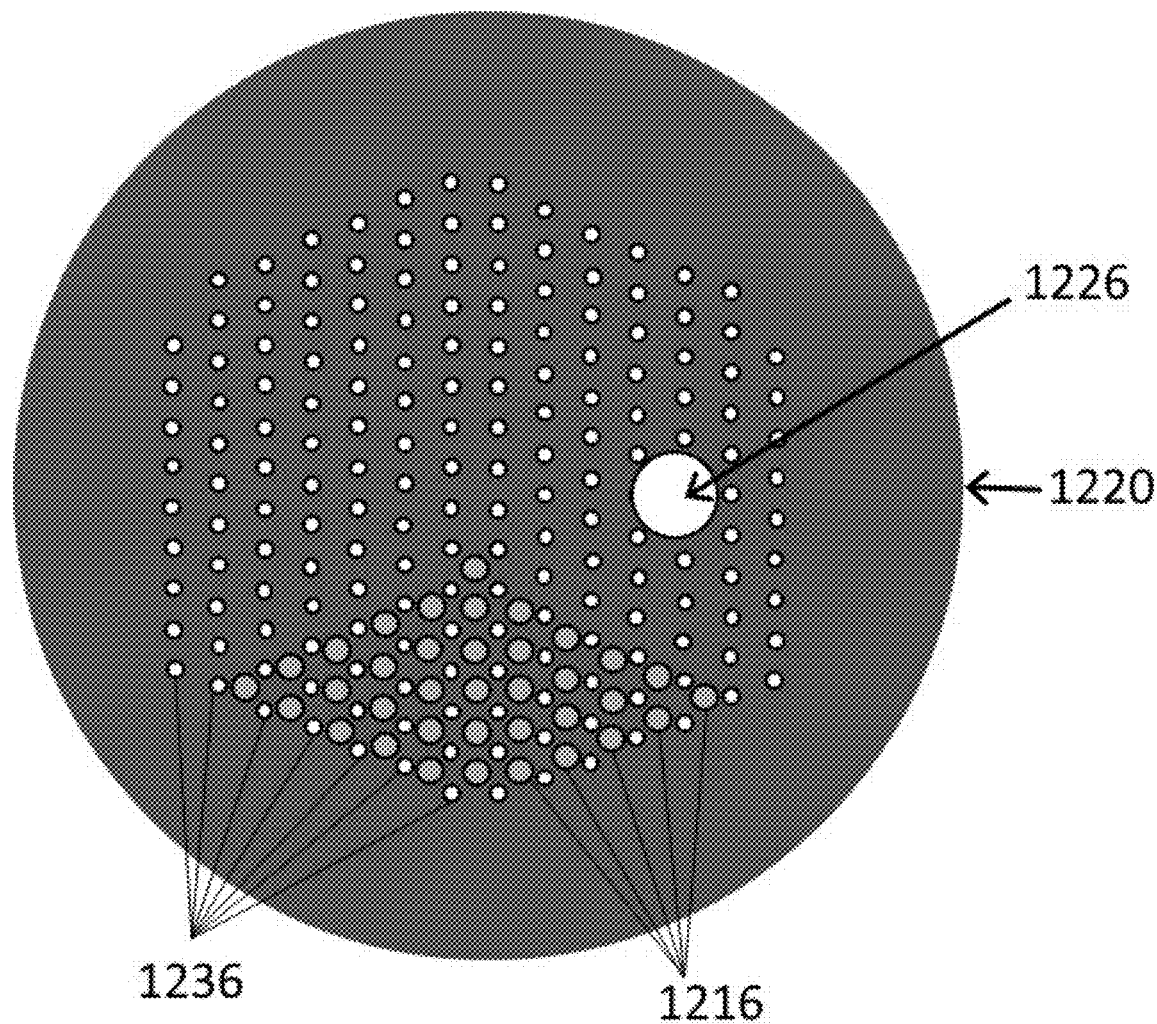
FIG. 29 is a schematic cross-sectional plan view of the second (e.g., bottom) surface of the source distributor (a view of the opposite surface of the source distributor shown in FIG. 28) showing the arrangement of the outlets of the plurality of laser injectors, the outlets of the plurality of conduits, and the viewport according to one implementation of the example device shown in FIG. 26-FIG. 28.

FIG. 28 is a schematic cross-sectional plan view of the example device 1200 shown in FIG. 26 and FIG. 27, showing the first surface (e.g., top surface) of the source distributor 1220 and the arrangement of the laser distributors 1210, the first precursor conduit 1290, the second precursor conduit 1292, and the in-situ monitor viewport 1226. FIG. 29 is a schematic cross-sectional plan view of the example device 1200 shown in FIG. 26 and FIG. 27, showing the second surface (e.g., bottom surface) of the source distributor 1220 (e.g., the opposite surface as shown in FIG. 28) and the arrangement of the outlets 1236 of the plurality of conduits 1230, the outlets 1216 of the plurality of laser injectors 1210, and the in-situ monitor viewport 1226 in one implementation of the device 1200. Referring now to FIG. 28 and FIG. 29, the plurality of laser injectors 1210 are all positioned in an ordered array within a quadrant of the source distributor 1220; the outlets 1236 of the plurality of conduits 1230 are positioned in an ordered array and evenly spaced throughout the source distributor 1220; the outlets 1216 of each of the plurality of laser injectors 1210 is located adjacent the outlet 1236 of at least one of the plurality of conduits 1230; and the outlets 1216 of the plurality of laser injectors 1210 are regularly interspersed between the outlets 1236 of the plurality of conduits 1230 within the quadrant of the source distributor 1220.

Figure 30:
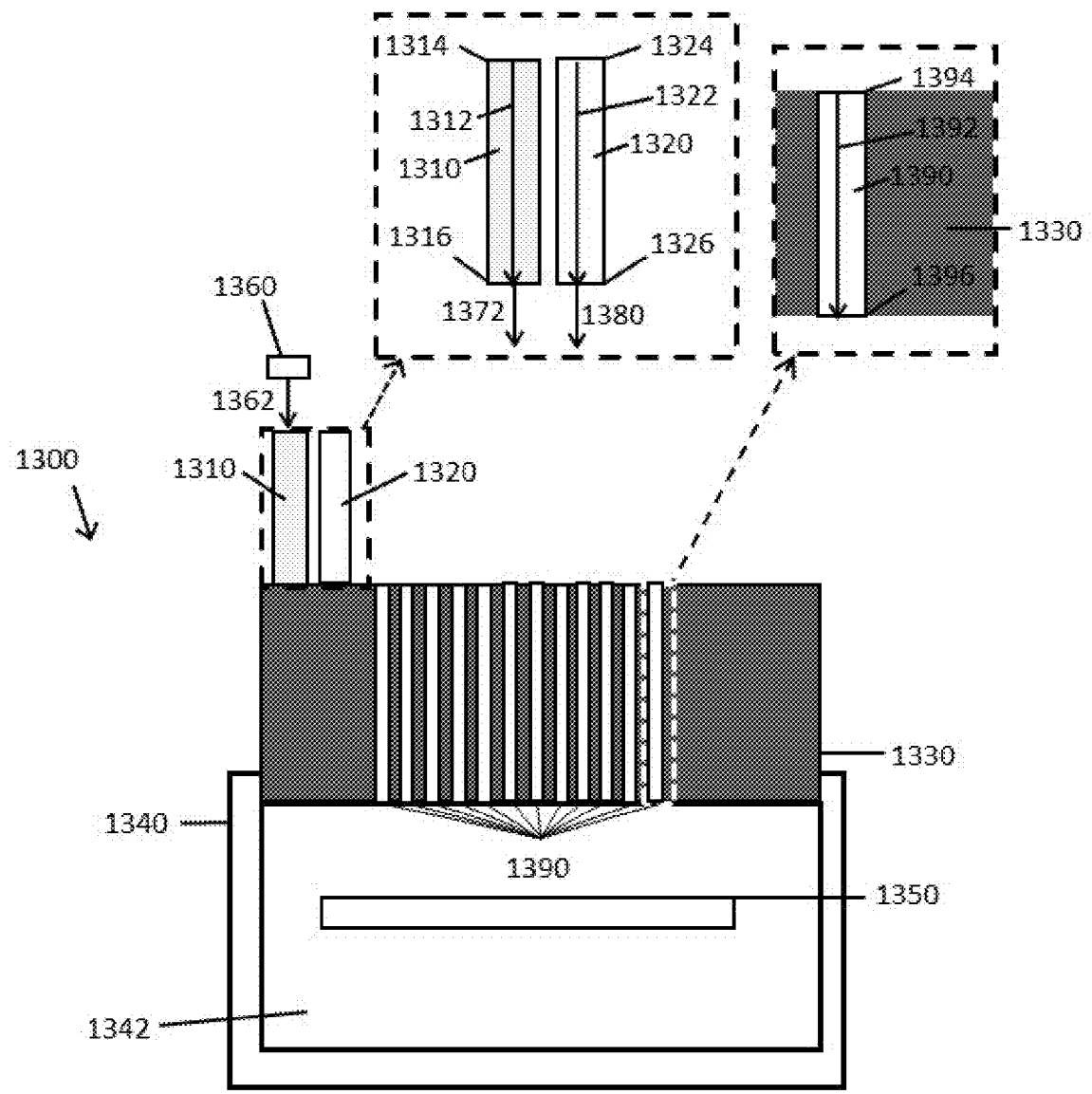
FIG. 30 is a cross-sectional plan view of a schematic of an example device as disclosed herein according to one implementation.

Referring now to FIG. 30, also disclosed herein are laser-assisted metal-organic chemical vapor deposition (MOCVD) devices 1300, the devices 1300 comprising: a source distributor 1330 defining a plurality of conduits 1390, wherein each of the plurality of conduits 1390 defines an inlet 1394, an outlet 1396 opposite and spaced apart from the inlet 1394, and a path for fluid flow 1392 extending from the inlet 1394 to the outlet 1396; a first precursor conduit 1310 defining an inlet 1314, an outlet 1316 opposite and spaced apart from the inlet 1314, and a path for fluid flow 1312 extending from the inlet 1314 to the outlet 1316; and a second precursor conduit 1320 defining an inlet 1324, an outlet 1326 opposite and spaced apart from the inlet 1324, and a path for fluid flow 1322 extending from the inlet 1324 to the outlet 1326. When the device 1300 is assembled together with a wall 1340 defining a chamber 1342, a rotatable substrate support surface 1350 disposed within the chamber 1342, and a laser device 1360 for producing one or more laser beams 1362: the outlet 1326 of the second precursor conduit 1320 is configured to introduce a second precursor 1380 into the plurality of conduits 1390, the outlets 1396 of the plurality of conduits 1390 being configured to introduce the second precursor into the chamber 1342 toward the rotatable substrate support surface 1350; the outlet 1316 of the first precursor conduit 1310 is configured to introduce an irradiated first precursor 1372 into the plurality of conduits 1390, the outlets 1396 of the plurality of conduits 1390 being configured to introduce the irradiated first precursor 1372 into the chamber 1342 towards the rotatable substrate support surface 1350 disposed within the chamber 1342; and the irradiated first precursor 1372 is formed by irradiating a first precursor 1370 with the one or more laser beams 1362 prior to introducing the irradiated first precursor 1372 into the plurality of conduits 1390. In some examples, the inlet 1314 of the first precursor conduit 1310 is configured to receive the irradiated first precursor 1372 from an irradiation chamber (not shown). In some examples, the first precursor 1370 is irradiated by the one or more laser beams 1162 within the first precursor conduit 1310.

The plurality of conduits 1390 can include two or more conduits (e.g., 3 or more, 4 or more, 5 or more, 6 or more, 7 or more, 8 or more, 9 or more, 10 or more, 15 or more, 20 or more, 25 or more, 30 or more, 40 or more, 50 or more, 60 or more, 70 or more, 80 or more, 90 or more, 100 or more, 150 or more, 200 or more, 250 or more, 300 or more, 350 or more, 400 or more, 450 or more, 500 or more, 600 or more, 700 or more, 800 or more, 900 or more, or 1000 or more). The number of conduits 1390 can be selected in view of the size of the chamber 1342, the size of the rotatable substrate support surface 1350, or a combination thereof. In some embodiments, the plurality of conduits 1390 can be arranged in an ordered array.

The cross-sectional shape of each of the plurality of conduits 1390 in a plane perpendicular to the central longitudinal axis of said conduit 1390 can be any shape, such as a regular shape, an irregular shape, an isotropic shape, or an anisotropic shape. In some examples, the cross-sectional shape of the plurality of conduits 1390 can be substantially circular, ellipsoidal, triangular, rectangular, polygonal, etc. In some examples, the cross-sectional shape of the plurality of conduits 1390 can be substantially circular.

The plurality of conduits 1390 can have an average characteristic dimension. The average characteristic dimension of the plurality of conduits 1390 can, for example, be 0.1 millimeter (mm) or more (e.g., 0.25 mm or more, 0.5 mm or more, 0.75 mm or more, 1 mm or more, 1.25 mm or more, 1.5 mm or more, 1.75 mm or more, 2 mm or more, 2.5 mm or more, 3 mm or more, 3.5 mm or more, 4 mm or more, or 4.5 mm or more). In some examples, the average characteristic dimension of the plurality of conduits 1390 can be 5 mm or less (e.g., 4.5 mm or less, 4 mm or less, 3.5 mm or less, 3 mm or less, 2.5 mm or less, 2 mm or less, 1.75 mm or less, 1.5 mm or less, 1.25 mm or less, 1 mm or less, 0.75 mm or less, 0.5 mm or less, or 0.25 mm or less). The average characteristic dimension of the plurality of conduits 1390 can range from any of the minimum values described above to any of the maximum values described above. For examples, the average characteristic dimension of the plurality of conduits 1390 can be from 0.1 mm to 5 mm (e.g., from 0.1 mm to 2.5 mm, from 2.5 mm to 5 mm, from 0.1 mm to 1 mm, from 1 mm to 2 mm, from 2 mm to 3 mm, from 3 mm to 4 mm, from 4 mm to 5 mm, from 0.5 mm to 5 mm, from 0.1 mm to 4.5 mm, from 0.5 mm to 4.5 mm, from 0.1 mm to 4 mm, from 0.1 mm to 3 mm, or from 0.5 mm to 2 mm).

The outlets 1396 of each of the plurality of conduits 1390 can be any shape, such as a regular shape, an irregular shape, an isotropic shape, or an anisotropic shape. In some examples, the outlets 1396 of the plurality of conduits 1390 can have a shape that is substantially circular, ellipsoidal, triangular, rectangular, polygonal, etc. In some examples, the shape of the outlets 1396 of the plurality of conduits 1390 can be substantially circular. The outlet 1396 of each of the plurality of conduits 1390 can, for example, be the cross-section in a plane perpendicular to the central longitudinal axis of said conduit 1390, such that the shape of the outlet 1396 of each of the plurality of conduits 1390 can be the cross-sectional shape of each of the plurality of conduits 1390.

The outlets 1396 of the plurality of conduits 1390 can have an average characteristic dimension. The average characteristic dimension of the outlets 1396 of the plurality of conduits 1390 can, for example, be 0.1 millimeter (mm) or more (e.g., 0.25 mm or more, 0.5 mm or more, 0.75 mm or more, 1 mm or more, 1.25 mm or more, 1.5 mm or more, 1.75 mm or more, 2 mm or more, 2.5 mm or more, 3 mm or more, 3.5 mm or more, 4 mm or more, or 4.5 mm or more). In some examples, the average characteristic dimension of the outlets 1396 of the plurality of conduits 1390 can be 5 mm or less (e.g., 4.5 mm or less, 4 mm or less, 3.5 mm or less, 3 mm or less, 2.5 mm or less, 2 mm or less, 1.75 mm or less, 1.5 mm or less, 1.25 mm or less, 1 mm or less, 0.75 mm or less, 0.5 mm or less, or 0.25 mm or less). The average characteristic dimension of the outlets 1396 of the plurality of conduits 1390 can range from any of the minimum values described above to any of the maximum values described above. For examples, the average characteristic dimension of the outlets 1396 of the plurality conduits 1390 can be from 0.1 mm to 5 mm (e.g., from 0.1 mm to 2.5 mm, from 2.5 mm to 5 mm, from 0.1 mm to 1 mm, from 1 mm to 2 mm, from 2 mm to 3 mm, from 3 mm to 4 mm, from 4 mm to 5 mm, from 0.5 mm to 5 mm, from 0.1 mm to 4.5 mm, from 0.5 mm to 4.5 mm, from 0.1 mm to 4 mm, from 0.1 mm to 3 mm, or from 0.5 mm to 2 mm).

In some examples, the each of the outlets 1396 of the plurality of conduits 1390 can further comprise a nozzle (not shown) fluidly connected to each of the outlets 1396 of the plurality of conduits 1390. Each nozzle can, for example, have an average characteristic dimension and a cross-sectional shape, wherein the average characteristic dimension of the nozzles, the cross-sectional shape of the nozzles, or a combination thereof can be the same or different than that of the outlets 1396 of the plurality of conduits 1390. In some examples, the average characteristic dimension of the nozzles can be smaller than the average characteristic dimension of the outlets 1396 of the plurality of conduits 1390. In some examples, the cross-sectional shape of the nozzles can be substantially circular. The average characteristic dimension of the nozzles, the cross-sectional shape of the nozzles, the orientation of the nozzles, or a combination thereof can be used to affect and/or control how the irradiated first precursor 1372 and/or the second precursor 1380 is/are introduced into the chamber 1342 (e.g., speed, direction, volume, etc.).

The number of conduits 1390, the arrangement of the conduits 1390, the cross-sectional shape of the conduits 1390, the shape of the outlets 1396 of the conduits 1390, the average characteristic dimension of the outlets 1396 of the conduits 1390, the presence or absence of the nozzles fluidly connected to each of the outlets 1396 of the plurality of conduits 1390, the average characteristic dimension of the nozzles fluidly connected to each of the outlets 1396 of the plurality of conduits 1390, the cross-sectional shape of the nozzles fluidly connected to each of the outlets 1396 of the plurality of conduits 1390, or a combination thereof can be selected, for example, in view of the size of the chamber 1342, the size of the rotatable substrate support surface 1350, or a combination thereof.

In some examples, the outlets 1396 of the plurality of conduits 1390 are configured to introduce the irradiated first precursor 1372 and the second precursor 1380 substantially uniformly throughout the chamber 1342. In some examples, the outlets 1396 of the plurality of conduits 1390 are configured to introduce the irradiated first precursor 1372 and the second precursor 1380 substantially perpendicular to the rotatable substrate support surface 1350. In some examples, the outlets 1396 of the plurality of conduits 1390 are configured to introduce the irradiated first precursor 1372 and the second precursor 1380 substantially uniformly over the rotatable substrate support surface 1350 as the rotatable substrate support surface 130 is rotated. In some examples, the plurality of conduits 1390 can comprise a set of first conduits and a set of second conduits, the outlets of the set of first conduits being configured to introduce the irradiated first precursor 1372 into the chamber 1342 toward the rotatable substrate support surface 1350, the outlets of the set of second conduits being configured to introduce the second precursor 1380 into the chamber 1342 toward the rotatable substrate support surface 1350.

The source distributor 1330 can, for example, have a first surface and a second surface opposite and spaced apart from the first surface, wherein the second surface of the source distributor 1330 is substantially parallel to and spaced apart from the rotatable substrate support surface 1350, and wherein the outlets 1396 of the plurality of conduits 1390 are defined by the second surface of the source distributor 1330. The source distributor 1330 can, for example, form a lid to the chamber 1342.

The source distributor 1330 can, in some examples, be hollow such that a cooling medium can be included within the source distributor 1330, for example to dissipate heat (e.g., from the heater, from the laser energy, or a combination thereof). The source distributor 1330 can, in some examples, comprise inside space (not shown), which have an inlet fluidly connected to an outlet, wherein the inlet and the outlet are configured to provide a path for flowing the cooling medium through the inside space within the source distributor. In some examples, the cooling medium can comprise water.

In some examples, the outlets 1396 of the plurality of conduits 1390 are positioned in an ordered array and evenly spaced throughout the source distributor 1330, such that the outlets 1396 of the plurality of conduits 1390 are configured to introduce the irradiated first precursor 1372 and the second precursor 1380 substantially uniformly throughout the chamber 1342.

In some examples, the plurality of conduits 1390 can comprise a set of first conduits and a set of second conduits, the outlets of the set of first conduits being configured to introduce the irradiated first precursor 1372 into the chamber 1342 toward the rotatable substrate support surface 1350, the outlets of the set of second conduits being configured to introduce the second precursor 1380 into the chamber 1342 toward the rotatable substrate support surface 1350. In some examples, the outlets of the first set of conduits are located within a quadrant of the source distributor 1330. In some examples, the outlet of one or more of the first set of conduits is/are located adjacent the outlet of at least one of the second set of conduits. In some examples, the outlet of one or more of the first set of conduits is/are located directly adjacent the outlet of at least one of the second set of conduits. In some examples, the outlets of the first set of conduits are located in an ordered array and the outlets of the second set of conduits are located in an ordered array, evenly spaced and interspersed between the outlets of the first set of conduits.

The first precursor conduit 1310 can be fluidly connected to the chamber 1342 via the plurality of conduits 1390. For example, the outlet 1316 of the first precursor conduit 1310 can be fluidly connected to each of the inlets 1394 of the plurality of conduits 1390, for example via the source distributor 1330. The first precursor conduit 1310 can, for example, fluidly connect a first precursor source (not shown) to the chamber 1342 via the plurality of conduits 1390. The inlet 1314 of the first precursor conduit 1310 can be fluidly coupled to the first precursor source and the outlet 1316 of the first precursor conduit 1310 can be fluidly connected to each of the inlets 1394 of the plurality of conduits 1390, for example via the source distributor 1330.

The second precursor conduit 1320 can be fluidly connected to the chamber 1342 via the plurality of conduits 1390. For example, the outlet 1326 of the second precursor conduit 1320 can be fluidly connected to each of the inlets 1394 of the plurality of conduits 1390, for example via the source distributor 1330. The second precursor conduit 1320 can, for example, fluidly connect a second precursor source (not shown) to the chamber 1342 via the plurality of conduits 1390. The inlet 1324 of the second precursor conduit 1320 can be fluidly coupled to the second precursor source and the outlet 1326 of the second precursor conduit 292 can be fluidly connected to each of the inlets 1394 of the plurality of conduits 1390, for example via the source distributor 1330.

Each of the one or more laser beams 1362 comprises electromagnetic radiation with at least one wavelength that overlaps with at least a portion of a vibrational mode of the first precursor 1370, thereby generating an active species (e.g., the irradiated first precursor 1372) in situ before being introduced to the plurality of conduits 1390. In some examples, the wavelength of the one or more laser beams 1362 are selected in view of the identity of the first precursor 1370, such that each of one or more laser beams 1362 comprises electromagnetic radiation with at least one wavelength that overlaps with at least a portion of a vibrational mode of the first precursor 1370, such that irradiation of the first precursor 1370 with the one or more laser beams 1362 can enhance the cracking efficiency of the first precursor 1370.

In some examples, the device 1300 is configured to deposit a III-V semiconductor, such that the first precursor 1370 comprises a V-group precursor and the second precursor 1380 comprises a III-group precursor The first precursor 1370 can, for example, comprise a V-group precursor, such as a compound, element, or composition comprising N, P, As, Sb, Bi, or a combination thereof. In some examples, the first precursor 1370 can comprise a nitrogen species. In some examples, the first precursor 1370 can comprise $NH_3$. The first precursor 1370 can, for example, comprise a fluid, such as a gas. In some examples, the devices 1300 can further comprise a first precursor source (not shown) fluidly coupled to the inlet 1314 of the first precursor conduit 1310.

The second precursor 1380 can, for example, comprise a III-group precursor, such as compound, element, or composition comprising B, Al, Ga, In, Tl, or a combination thereof. In some examples, the second precursor 1380 can comprise a gallium species. In some examples, the second precursor 1380 can comprise trimethylgallium, triethylgallium, or a combination thereof. The second precursor 1380 can, for example, comprise a fluid, such as a gas. In some examples, the devices 1300 can further comprise a second precursor source (not shown) fluidly coupled to the inlet 1324 of the second precursor conduit 1320.

In some examples, the device 1300 is configured to deposit a group III oxide semiconductor, such that the first precursor 1370 comprises an oxygen containing precursor and the second precursor 1380 comprises a III-group precursor.

In some examples, the device 1300 is configured to deposit a group II-VI semiconductor material, such that the first precursor 1370 comprises a VI-group precursor (e.g., a compound/composition/element comprising O, S, Se, Te, or a combination thereof) and the second precursor 1380 comprises a II-group precursor (e.g., a compound/composition/element comprising Be, Mg, Ca, Sr, Ba, Zn, Cd, Hg, or a combination thereof).

In some examples, the device 1300 is configured to deposit a group II-IV-V$_2$ semiconductor, such that the first precursor 1370 comprises a V-group precursor (e.g., a compound, element, or composition comprising N, P, As, Sb, Bi, or a combination thereof) and the second precursor 1380 comprises a mixture of a II-group precursor (e.g., a compound/composition/element comprising Be, Mg, Ca, Sr, Ba, Zn, Cd, Hg, or a combination thereof) and a IV-group precursor (e.g., a compound/composition/element comprising C, Si, Ge, Sn, Pb, or a combination thereof).

In some examples, the device 1300 is configured to introduce the irradiated first precursor 1372 into the chamber 1342 continuously or intermittently. In some examples, the device 1300 is configured to introduce the second precursor 1380 continuously or intermittently.

In some examples, the device 1300 is configured to introduce the irradiated first precursor 1372 and the second precursor 1380 into the chamber 1342 alternately. In some examples, the device 1300 is configured to introduce the irradiated first precursor 1372 and the second precursor 1380, wherein at least a portion of the introduction of the second precursor 1380 is concurrent with at least a portion of the introduction of the irradiated first precursor 1372, or vice versa. In some examples, the device 1300 is configured to introduce the irradiated first precursor 1372 and the second precursor 1380 to the chamber simultaneously.

In some examples, the outlets 1396 of the plurality of conduits 1390 are further configured to introduce a dopant (e.g., one or more dopants) into the chamber 1342 toward the rotatable substrate support surface 1350. The one or more dopants can be selected in view of the first precursor 1370 and/or the second precursor 1380. The one or more dopants can be, for example, a fluid, such as a gas. In some examples, the one or more dopants can comprise an n-type dopant (e.g., silane (SiH$_4$), germane (GeH$_4$), disilane (Si$_2$H$_6$)), a p-type dopant (e.g., bis(cyclopentadienyl)magnesium (Cp$_2$Mg), bis(methylcyclopentadienyl)magnesium ((MeCp)$_2$Mg)), or a combination thereof. In some examples, the one or more dopants can comprise silane (SiH$_4$), germane (GeH$_4$), disilane(Si$_2$H$_6$), bis(cyclopentadienyl)magnesium (Cp$_2$Mg), bis(methylcyclopentadienyl)magnesium ((MeCp)$_2$Mg), or a combination thereof. The one or more dopants can, for example, be mixed with the irradiated first precursor 1372 and/or the second precursor 1380 prior to introduction into the chamber 1342. In some examples, the device 1300 is configured to introduce the irradiated first precursor 1372, the second precursor 1380, and the one or more dopants into the chamber 1342 consecutively in turn. In some examples, the device 1300 is configured to introduce the irradiated first precursor 1372 and the one or more dopants, wherein at least a portion of the introduction of the one or more dopants is concurrent with at least a portion of the introduction of the irradiated first precursor 1372, or vice versa. In some examples, the device 1300 is configured to introduce the second precursor 1380 and the one or more dopants, wherein at least a portion of the introduction of the one or more dopants is concurrent with at least a portion of the introduction of the second precursor 1380, or vice versa. In some examples, the device is configured to introduce the irradiated first precursor 1372, the second precursor 1380, and the one or more dopants into the chamber 1342 simultaneously.

In some examples, the outlets 1396 of the plurality of conduits 1390 are further configured to introduce a carrier gas (e.g., one or more carrier gases) into the chamber 1342 toward the rotatable substrate support surface 1350. The one or more carrier gases can be selected in view of the first precursor 1370, the second precursor 1380, the one or more dopants when present, or a combination thereof. The one or more carrier gases can be, for example, argon, helium, H$_2$, N$_2$, and the like, or combinations thereof. The one or more carrier gases can, for example, be mixed with the irradiated first precursor 1372, the second precursor 1380, the one or more dopants when present, or a combination thereof prior to introduction into the chamber 1342. In some examples, the device 1300 is configured to introduce the irradiated first precursor 1372, the second precursor 1380, the one or more dopants when present, or a combination thereof concurrently with at least a portion of the introduction of the one or more carrier gases.

The devices 1300 described herein can further comprise or be assembled with a variety of additional components. For example, the devices 1300 can be assembled together with, or in some examples can further comprise, the wall 1340 defining the chamber 1342. The wall 1340 can, in some examples be hollow such that a cooling medium can be included within the wall 1340, for example to dissipate heat (e.g., from the heater, from the laser energy, or a combination thereof). In some examples, the cooling medium can comprise water.

The devices 1300 can, for example, be assembled together with, or in some examples can further comprise, the rotatable substrate support surface 1350. The size and shape of the rotatable substrate support surface 1350 can be selected in view of the size and shape of the chamber 1342. The rotatable substrate support surface 1350 can support one or more substrates (not shown) (e.g., 2 or more, 3 or more, 4 or more, 5 or more, 6 or more, 7 or more, 8 or more, 9 or more, 10 or more, 15 or more, 20 or more, 25 or more, 30 or more, 35 or more, 40 or more, 45 or more, 50 or more, 60 or more, 70 or more, 80 or more, 90 or more, 100 or more, 150 or more, 200 or more, 250 or more, 300 or more, 350 or more, 400 or more, 450 or more, 500 or more, 600 or more, 700 or more, 800 or more, 900 or more, 1000 or more, 1500 or more, or 2000 or more) to be coated with a material via laser-assisted metal-organic vapor deposition from the irradiated first precursor 1372 and the second precursor 1380 (and one or more dopants, if present) within the chamber 1342. The number of substrates disposed on the rotatable substrate support surface 1350 can be selected, for example, in view of the size of the one or more substrates and/or the size of the rotatable substrate support surface 1350. The devices 1300 can, for example, be configured to rotate the rotatable substrate support 1350 surface to thereby provide a more uniform coating of the material on the one or more substrates via laser-assisted metal-organic vapor deposition.

The one or more substrates can have an average characteristic dimension. The average characteristic dimension of the one or more substrates can, for example, be 1 inch or more (e.g., 2 inches or more, 3 inches or more, 4 inches or more, 5 inches or more, 6 inches or more, 7 inches or more, 8 inches or more, 9 inches or more, 10 inches or more, 11 inches or more, 12 inches or more, 13 inches or more, 14 inches or more, 15 inches or more, 16 inches or more, 17 inches or more, 18 inches or more, 19 inches or more, 20 inches or more, 25 inches or more, 30 inches or more, or 35 inches or more). In some examples, the average characteristic dimension of the one or more substrates can be 36 inches or less (e.g., 35 inches or less, 30 inches or less, 25 inches or less, 20 inches or less, 19 inches or less, 18 inches or less, 17 inches or less, 16 inches or less, 15 inches or less, 14 inches or less, 13 inches or less, 12 inches or less, 11 inches or less, 10 inches or less, 9 inches or less, 8 inches or less, 7 inches or less, 6 inches or less, 5 inches or less, 4 inches or less, 3 inches or less, or 2 inches or less). The average characteristic dimension of the one or more substrates can range from any of the minimum values described above to any of the maximum values described above. For example, the average characteristic dimension of the one or more substrates can be from 1 inch to 36 inches (e.g., from 1 inch to 18 inches, from 18 inches to 36 inches, from 1 inch to 6 inches, from 6 inches to 12 inches, from 12 inches to 18 inches, from 18 inches to 24 inches, from 24 inches to 30 inches, from 30 inches to 36 inches, from 2 inches to 36 inches, from 1 inch to 30 inches, from 2 inches to 30 inches, from 1 inch to 18 inches, from 1 inch to 12 inches, or from 2 inches to 8 inches).

The one or more substrates can be any shape, such as a regular shape, an irregular shape, an isotropic shape, or an anisotropic shape. In some examples, the shape of the one or more substrates can be substantially circular, ovate, ovoid, elliptic, triangular, rectangular, polygonal, etc. In some examples, the shape of the one or more substrates can be substantially circular, such that the average characteristic dimension is the diameter.

The one or more substrates can comprise any suitable material. Examples of suitable substrates include, but are not limited to, bulk GaN, GaN template, sapphire, $Al_2O_3$, $LiAlO_2$, Si, SiC, zinc oxide, bulk AlN, AlN on sapphire template, and combinations thereof.

The devices 1300 can, for example, be assembled together with, or in some examples can further comprise, the laser device 1360 for producing the one or more laser beams 1362. The laser device 1360 can, for example, comprise one or more lasers. In some examples, the laser device 1360 can further comprise a laser distributor for splitting each of the one or more lasers into one or more laser beams 1362. The wavelength(s) of the one or more lasers can be selected, for example, in view of the identity of the first precursor 1370. In some examples, the one or more lasers can comprise an infrared laser. In some examples, the one or more lasers can comprise a $CO_2$ laser, such as a tunable $CO_2$ laser. In some examples, the laser device 1360 can further comprise one or more windows, wherein the one or more laser beams 1362 traverse the one or more windows before entering the first precursor conduit 1310. The one or more windows can comprise any suitable material, such as, for example, ZnSe, ZnS, NaCl, KBr, and combinations thereof.

Figure 31:
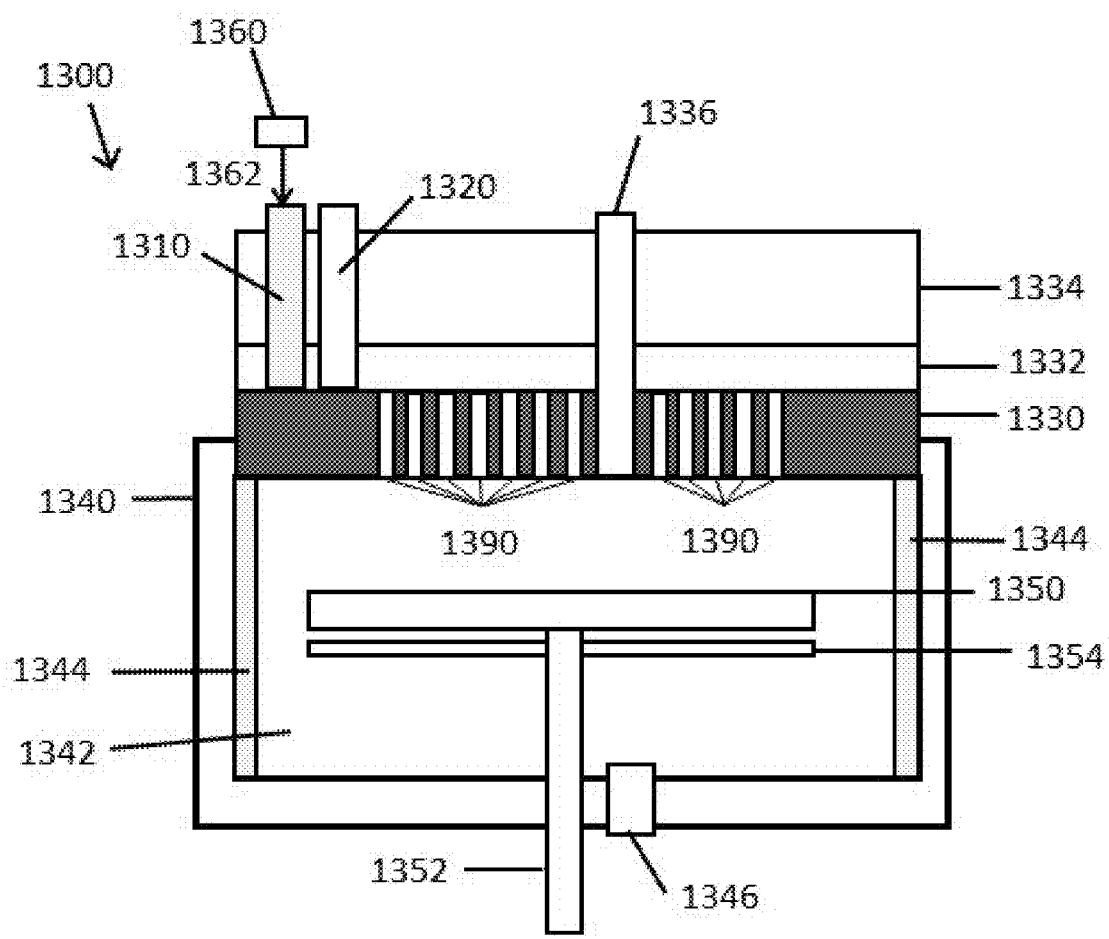
FIG. 31 is a cross-sectional plan view of a schematic of an example device as disclosed herein according to one implementation.

The devices 1300 described herein can further comprise or be assembled with a variety of additional components, for example as shown in FIG. 31. Though the some of the elements are only shown in FIG. 31, any of the one or more additional elements or any combination of the one or more additional elements shown in FIG. 31 can be present in any of the other embodiments of the devices 1300 described herein.

Referring now to FIG. 31, in some examples, the interior surface of wall 1340 (e.g., the surface of the wall 1340 within the chamber 1342) can further comprise a coating 1344, wherein the coating 1344 can comprise a material that can absorb at least a portion of the laser beam energy. Though the coating 1344 is only shown in FIG. 31, the coating 1344 can be present in any of the other embodiments of the devices 1300 described herein.

In some examples, the wall 1340 can further comprise an exhaust port 1346 which fluidly couples the chamber 1342 with an external environment. Though the exhaust port 1346 is only shown in FIG. 31, the exhaust port 1346 can be present in any of the other embodiments of the devices 1300 described herein.

In some examples, the rotatable substrate support surface 1350 can be coupled to or further comprise a rotary spindle 1352. For example, the rotatable substrate support surface 1350 can be centrally mounted on the rotary spindle 1352, and the rotary spindle 1352 can be rotated to rotate the rotatable substrate support surface 1350. In some examples, the rotary spindle 1352 can further be coupled to a means for rotating the rotary spindle 1352. The devices 1300 can, for example, be configured to rotate the rotary spindle 1352 and thus rotate the rotatable substrate support surface 1350 to thereby provide a more uniform coating of the material on the one or more substrates via laser-assisted metal-organic vapor deposition. Though the rotary spindle 1352 is only shown in FIG. 31, the rotary spindle 1352 can be present in any of the other embodiments of the devices 1300 described herein.

In some examples, the devices 1300 can further be assembled with, or in some examples can further comprise, a heater 1354 thermally coupled to the rotatable substrate support surface 1350 within the chamber 1342. The heater 1354 can, for example, be located below the rotatable substrate support surface 1350, and optionally spaced apart from the rotatable substrate support surface 1350, relative to the position of the outlets 1396 of the plurality of conduits 1390. In some examples, the devices 1300 can further comprise a means for controlling the temperature of (e.g., heating) the heater 1354. In some examples, the heater 1354 can be heated such that the one or more substrates is at a temperature of 100° C. or more (e.g., 150° C. or more, 200° C. or more, 250° C. or more, 300° C. or more, 350° C. or more, 400° C. or more, 450° C. or more, 500° C. or more, 550° C. or more, 600° C. or more, 650° C. or more, 700° C. or more, 750° C. or more, 800° C. or more, 850° C. or more, 900° C. or more, 950° C. or more, 1000° C. or more, 1100° C. or more, 1200° C. or more, 1300° C. or more, 1400° C. or more, 1500° C. or more, 1600° C. or more, 1700° C. or more, 1800° C. or more, or 1900° C. or more). In some examples, the heater 1354 can be heated such that the one or more substrates is at a temperature of 2000° C. or less (e.g., 1900° C. or less, 1800° C. or less, 1700° C. or less, 1600° C. or less, 1500° C. or less, 1400° C. or less, 1300° C. or less, 1200° C. or less, 1100° C. or less, 1000° C. or less, 950° C. or less, 900° C. or less, 850° C. or less, 800° C. or less, 750° C. or less, 700° C. or less, 650° C. or less, 600° C. or less, 550° C. or less, 500° C. or less, 450° C. or less, 400° C. or less, 350° C. or less, 300° C. or less, 250° C. or less, 200° C. or less, or 150° C. or less). The temperature at which the one or more substrates are heated by the heater 1354 can range from any of the minimum values described above to any of the maximum values described above. For example, the heater 1354 can be heated such that the one or more substrates is at a temperature of from 100° C. to 2000° C. (e.g., from 100° C. to 1000° C., from 1000° C. to 2000° C., from 100° C. to 500° C., from 500° C. to 900° C., from 900° C. to 1300° C., from 1300° C. to 1700° C., from 1700° C. to 2000° C., from 400° C. to 2000° C., from 100° C. to 1500° C., or from 400° C. to 1500° C.). Though the heater 1354 is only shown in FIG. 31, the heater 1354 can be present in any of the other embodiments of the devices 1300 described herein.

The devices 1300 can, for example, be assembled together with, or in some examples can further comprise, a cooling plate 1332 disposed outside the chamber adjacent and thermally coupled to top surface of the source distributor 1330. The cooling plate can 1332, in some examples, be in contact with the top surface of the source distributor 1330. The cooling plate 1332 can be configured to cool the source distributor 1330. In some examples, the devices 1300 can further comprise a means for controlling the temperature of (e.g., cooling) the cooling plate 1332. The cooling plate 1332 can, in some examples, be hollow such that a cooling medium can be included within the cooling plate 1332, for example to dissipate heat (e.g., from the heater, from the laser energy, or a combination thereof). In some examples, the cooling medium can comprise water. When present, the cooling plate 1332 can further define the first precursor conduit 1310, the second precursor conduit 1320, or a combination thereof. Though the cooling plate 1332 is only shown in FIG. 31, the cooling plate 1332 can be present in any of the other embodiments of the devices 1300 described herein.

The devices 1300 can, for example, further be assembled together with, or in some examples can further comprise, a top cover 1334, disposed outside of the chamber 1342 adjacent to the top surface of the source distributor 1330. The top cover 1334 can, in some examples, be in contact with the top surface of the source distributor 1330. When present, the cooling plate 1332 can be sandwiched between the top surface of the source distributor 1330 and the top cover 1334, such that the top cover 1334 is located above and in contact with the cooling plate 1332. When present, the cooling plate 1332 and/or the top cover 1334 can further define the first precursor conduit 1310, the second precursor conduit 1320, or a combination thereof. Though the top cover 1334 is only shown in FIG. 31, the top cover 1334 can be present in any of the other embodiments of the devices 1300 described herein.

The devices 1300 can, for example, be assembled together with, or in some examples can further comprise, an in-situ monitor, such as a camera and/or a window. In some examples, the in-situ monitor can comprise a window or viewport 1336 defined by the source distributor 1330 and, when present, the cooling plate 1332 and/or top cover 1334. The in-situ monitor can allow for visual inspection inside the chamber 1342 when the device 1300 is assembled. Though the viewport 1336 is only shown in FIG. 31, the viewport 1336 can be present in any of the other embodiments of the devices 1300 described herein.

Figure 32:
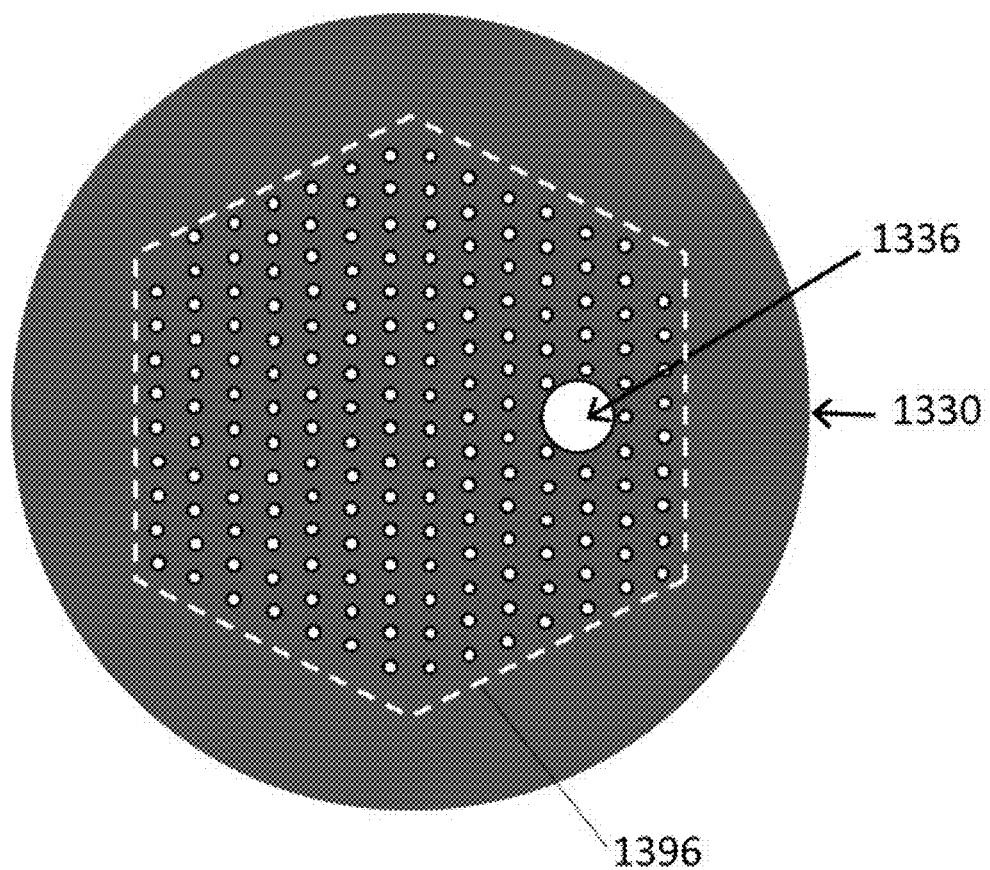
FIG. 32 is a schematic cross-sectional plan view of the second (e.g., bottom) surface of the source distributor showing the arrangement of the outlets of the plurality of conduits and the viewport according to one implementation of the example device shown in FIG. 30-FIG. 31.

FIG. 32 is a schematic cross-sectional plan view of the example device 1300 shown in FIG. 30 and FIG. 31, showing the second (e.g., bottom) surface of the source distributor 1330 showing the arrangement of the outlets 1396 of the plurality of conduits 1390 and the viewport 1336. Referring now to FIG. 32, the outlets 1396 of the plurality of conduits 1390 are positioned in an ordered array and evenly spaced throughout the source distributor 1330.

Also disclosed herein are methods comprising of depositing a material, for example a III-V semiconductor material, on one or more substrates via laser-assisted metal-organic chemical vapor deposition using any of the devices described herein. Also disclosed herein are coated substrates made by any of the methods described herein. Also disclosed herein are methods of use of any of the coated substrates made by any of the methods described herein, for example in optical devices, electronic devices, etc. Also disclosed herein are systems comprising any of the devices described herein and one or more components assembled therewith.

A number of embodiments of the invention have been described. Nevertheless, it will be understood that various modifications may be made without departing from the spirit and scope of the invention. Accordingly, other embodiments are within the scope of the following claims.

The examples below are intended to further illustrate certain aspects of the systems and methods described herein, and are not intended to limit the scope of the claims.

EXAMPLES

The following examples are set forth below to illustrate the methods and results according to the disclosed subject matter. These examples are not intended to be inclusive of all aspects of the subject matter disclosed herein, but rather to illustrate representative methods and results. These examples are not intended to exclude equivalents and variations of the present invention which are apparent to one skilled in the art.

Efforts have been made to ensure accuracy with respect to numbers (e.g., amounts, temperature, etc.) but some errors and deviations should be accounted for. Unless indicated otherwise, parts are parts by weight, temperature is in ° C. or is at ambient temperature, and pressure is at or near atmospheric. There are numerous variations and combinations of measurement conditions, e.g., component concentrations, temperatures, pressures and other measurement ranges and conditions that can be used to optimize the described process.

Example 1

III-nitrides represent an important semiconductor material system for both optoelectronic and power electronic device applications. The direct band gap of III-nitrides (including InN, GaN, AlN, BN, and related alloys) ranges between 0.64 and 6.14 eV, which covers a wide spectral range from ultraviolet to infrared. Additional advantages for III-nitrides include high electron saturation velocity, high critical electric field, high radiation resistance and decent thermal performance Therefore, III-nitrides have attracted increasing interests in device applications.

The fabrication of III-nitride films mainly rely on epitaxy technology, owing to the high saturated vapor pressure of N species. Epitaxy methods include, for example, hydride vapor phase epitaxy (HYPE), molecular beam epitaxy (MBE), and metal-organic chemical vapor deposition (MOCVD). Among these, MOCVD has been widely adopted in production of III-nitride optoelectronic and electronic devices, such as InGaN LEDs, AlGaN HEMT, etc.

For MOCVD fabrication of III-nitrides, the group-III precursors are typically metal-organics, such as trimethylgallium (TMGa), triethylgallium (TEGa), trimethylindium (TMIn), trimethylaluminum (TMAl). Silane ($SiH_4$) and bis(cyclopentadienyl)magnesium ($Cp_2Mg$) can be used as n- and p-type dopant sources, respectively. The most common precursor for N species is ammonia ($NH_3$).

Low cracking efficiency of $NH_3$ is one of the key challenges for III-nitride epitaxy. It was reported that pyrolysis of $NH_3$ starts at ~450° C. The thermal decomposition efficiency of $NH_3$ is only ~4%, even at temperature as high as 950° C. (White et al. JACS, 1905, 27, 373-386; Ban. J Electrochem Soc, 1972, 119, 761-765). The difficulties can result in limited N species being available at the growth interface, which in turn can affect the growth properties of the III-nitride material, such as growth rate, crystalline quality, impurities incorporation, native point defects generation, etc. Moreover, these effects become more severe for materials grown at relatively low temperatures, such as InN and InGaN. Therefore, methods for enhancing the cracking efficiency of $NH_3$ are strongly needed for high quality and highly efficient III-nitride epitaxy using MOCVD.

The infrared active vibrational modes of a molecule can be excited by using resonant wavelengths, which in turn can lead to the breaking of atomic bonds (Zare. Science, 1998, 279, 1875). The wagging modes of $NH_3$ at 932.51 $cm^{-1}$, 968.32 $cm^{-1}$, and 1084.63 $cm^{-1}$ coincide with wavelengths of 10.719 μm, 10.35 μm, and 9.219 μm, respectively (Golgir et al. Cryst. Growth Des, 2014, 14, 6248-6253). These wavelengths can be obtained from an infrared (IR) laser, for example, a tunable $CO_2$ lasers.

Laser-assisted MOCVD with $CO_2$ laser excitation for GaN growth has been demonstrated (Golgir et al. Cryst Growth Des, 2014, 14, 6248-6253; Golgir et al. ACS Appl. Mater. Interfaces, 2017, 9, 21539-21547). A $CO_2$ laser beam was introduced from a ZnSe window parallel or inclined to substrate surface. The coupling between $NH_3$ molecules and $CO_2$ laser energy led to a fast growth rate of GaN of up to 25.8 μm/h (Golgir et al. ACS Appl. Mater. Interfaces, 2017, 9, 21539-21547).

Herein, the design of scalable laser-assisted MOCVD chambers for III-nitride material epitaxy with $CO_2$ laser energy input are described. To obtain uniform activation of N species, the laser energy is delivered into the chamber with a laser injector array or the group-V precursor inlet is directly irradiated.

Figure 33:
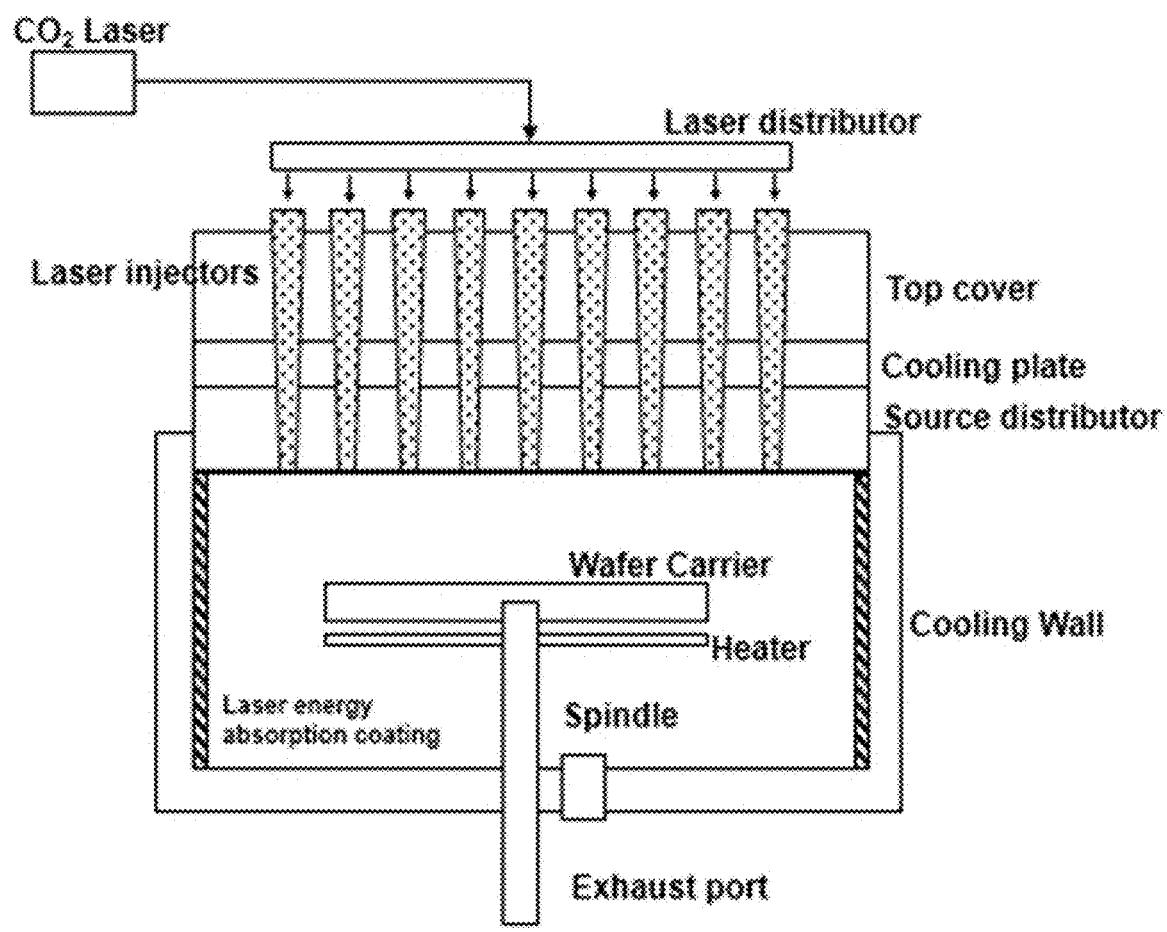
FIG. 33 is a sectional view of a laser-assisted MOCVD chamber with a laser injector array.
Figure 34:
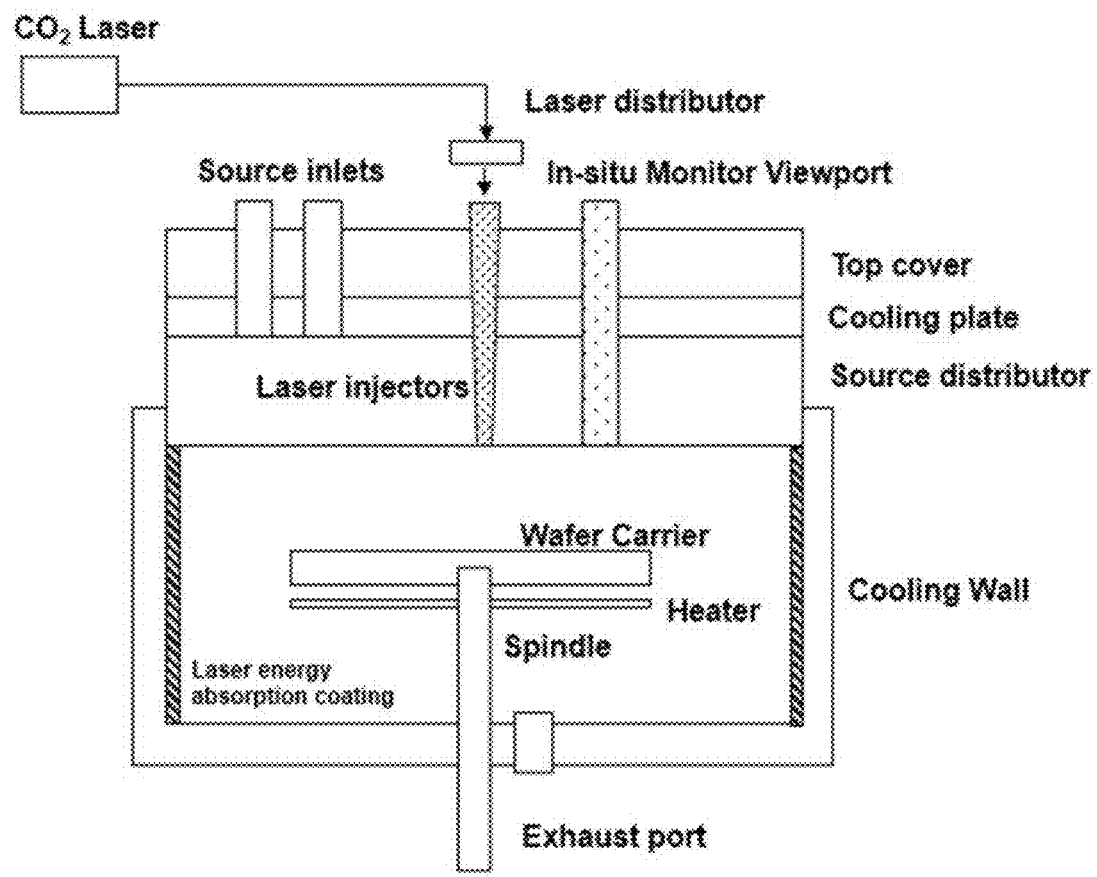
FIG. 34 is a sectional view orthogonal to that of FIG. 33 of a laser-assisted MOCVD chamber with a laser injector array.

FIG. 33 and FIG. 34 show sectional views from two orthogonal directions of a laser-assisted MOCVD chamber with a laser injector array. The design includes a chamber frame, a shower head, and optical components.

The chamber frame can comprise a cooling wall, a laser energy absorption coating, a rotary spindle, and a heating plate. The chamber wall is coated with materials which can absorb the scattered $CO_2$ laser energy. The chamber frame is hollow such that it can include water flowing therein, wherein the water can take away heat from the heater and scattered laser energy. The rotary spindle is installed in the center of chamber. The wafer carrier sits on the top of spindle and above the heating plate. The dimensions of the wafer carrier can be scaled up, considering the dimension of chamber frame. The spindle is surrounded by heating plate.

The shower head comprises source inlets, a source distributor, a cooling plate, a top cover, and an in-situ monitor viewport. The III-group precursor, V-group precursor, and doping sources are mixed with carrier gases, then injected into the chamber from the source distributor. The cooling plate is inserted between the top cover and the source distributor to take away heat from the heating plate and scattered laser energy. The precursor inlets are integrated in the top cover and connected with the source distributor.

The optical components comprise a laser distributor, a laser injector array, and in-situ monitors. The laser distributor is a component which can divide an original laser beam into multiple beams to form a laser beam array. The $CO_2$ laser beam is connected to laser distributor and then introduced to the MOCVD chamber through the laser injector array.

The laser injectors are used to introduce the laser beams to the MOCVD chamber. FIG. 3 shows a schematic of the structure of the laser injectors, which includes a convex lens and a concave lens. The convex lens is used to reduce the waist of the incident laser beam from $\omega_0$ to $\omega_1$ and increase the divergence angle of the incident laser beam. The concave lens is located at the focal point of the convex lens, $f_1$, to expand the laser beam to a spot size with a diameter of $\omega_2$ on the wafer carrier. The concave lens can also improve the uniformity inside the Gaussian laser spots.

The source injectors are designed as nozzles distributed on the bottom face of source distributor. The laser injectors are designed and distributed at intervals with respect to the source injectors to improve the uniformity of the interaction between the laser energy and the group-V precursor (e.g., N species). Based on the distribution of the laser injectors and source injectors, the designs described herein include a Laser-precursor-match (LPM) design and a Precursor-distribution-independent (PDI) design.

Figure 35:
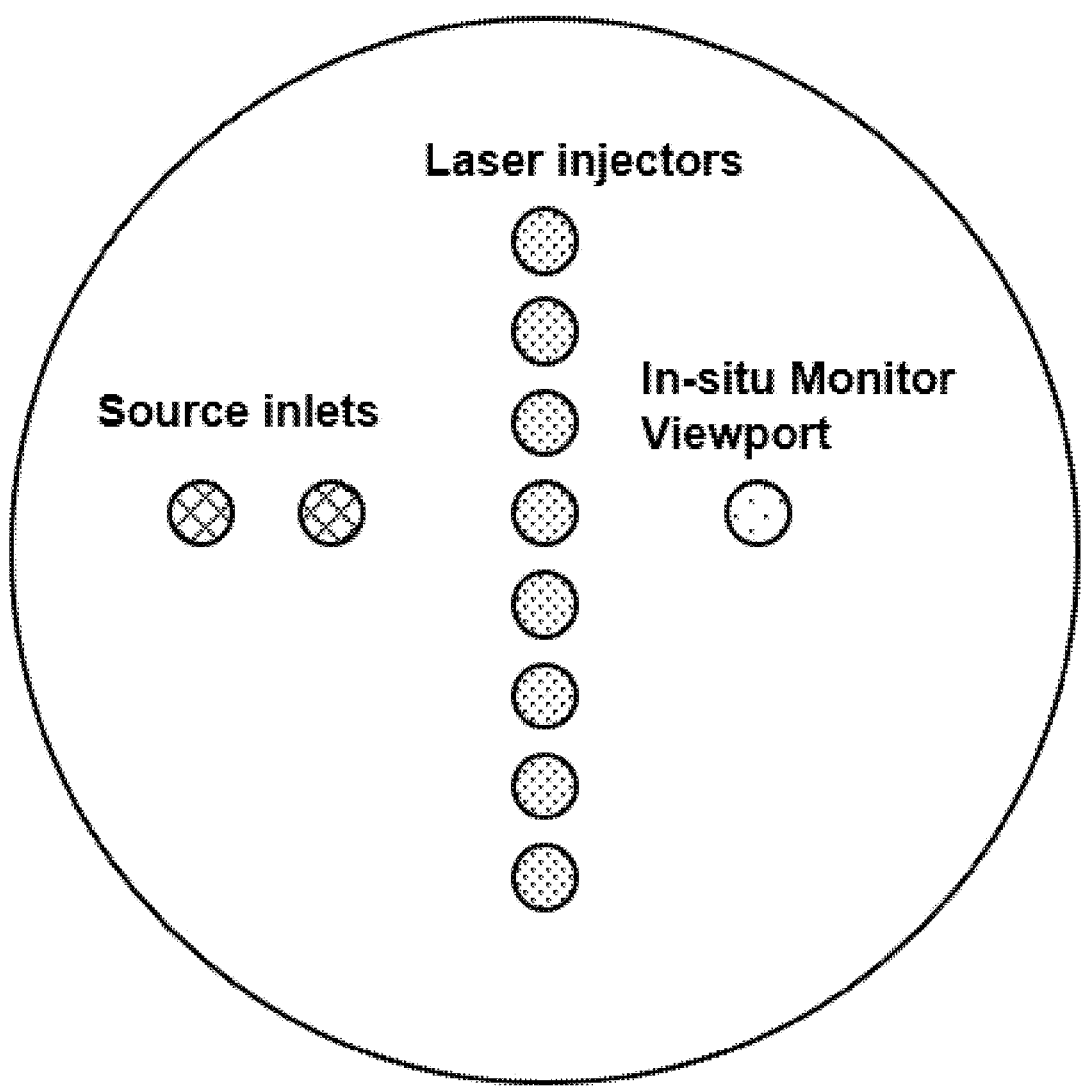
FIG. 35 is the top face of a shower head with a Laser-precursor-match (LPM) design.
Figure 36:
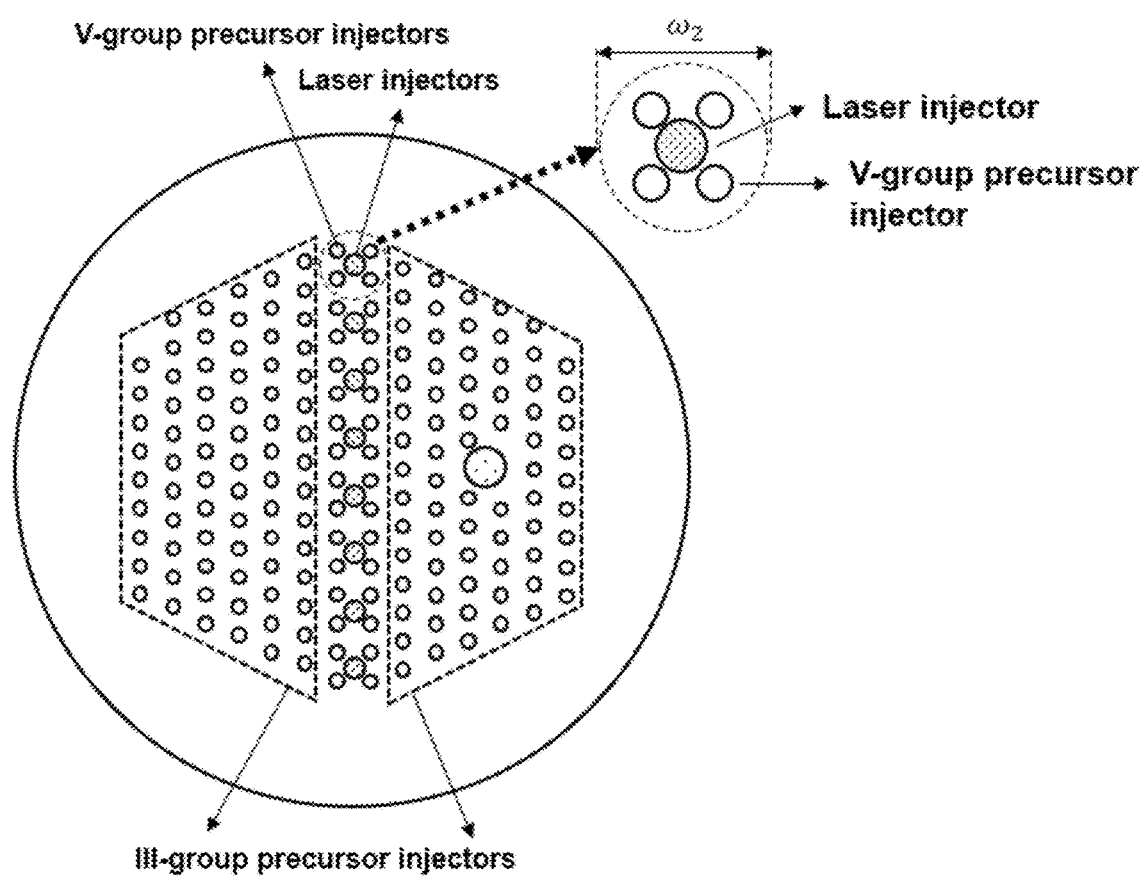
FIG. 36 the bottom face of the shower head of FIG. 35 with a Laser-precursor-match (LPM) design. An enlarged schematic of a laser injector surrounded by V-group injectors is shown in the inset in the top-right corner.

FIG. 35 and FIG. 36 show the top face and the bottom face, respectively, of the shower head with a Laser-precursor-match (LPM) design. The V-group precursor injectors are distributed as stripes at the center of the bottom face of the source distributor. The III-group precursor injectors are distributed at the two sides of the V-group injector stripes. The laser injectors are distributed at the intervals of the III-group injectors. An enlarged schematic of a laser injector surrounded by V-group injectors is shown in the inset at the top-right corner of FIG. 36. The expanded beam spots in the chamber are designed to cover the region of V-group injectors (e.g., within the laser beam to a spot size with a diameter of $\omega_2$ on the wafer carrier, as shown in the inset in FIG. 36).

Figure 37:
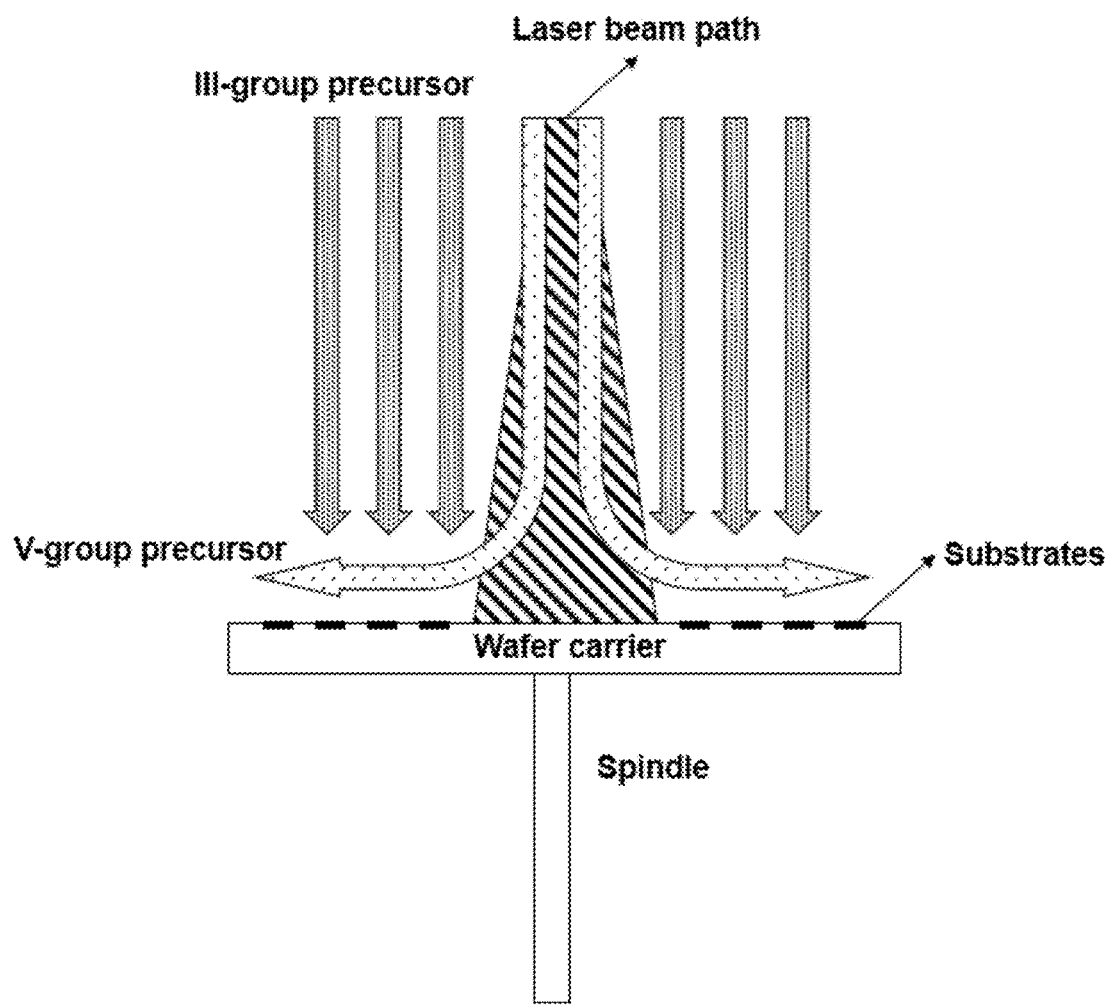
FIG. 37 is a schematic view of the precursor flow pattern and laser beam path in a MOCVD chamber with a Laser-precursor-match (LPM) design.

FIG. 37 shows a schematic of the precursor flow pattern and laser beam path in the MOCVD chamber using the LPM design. The downward V-group precursor flow pattern is fully covered by the laser beam path to provide a more uniform and efficient interaction between the laser energy and V-group precursor N species. Active nitrogen species, such as N, NH, and $NH_2$ are generated in the downward V-group precursor flow and diffuse along surface of the high-speed rotary wafer carrier. Then, the active nitrogen species will react with III-group precursors and incorporate into the lattice of the substrates.

Figure 38:
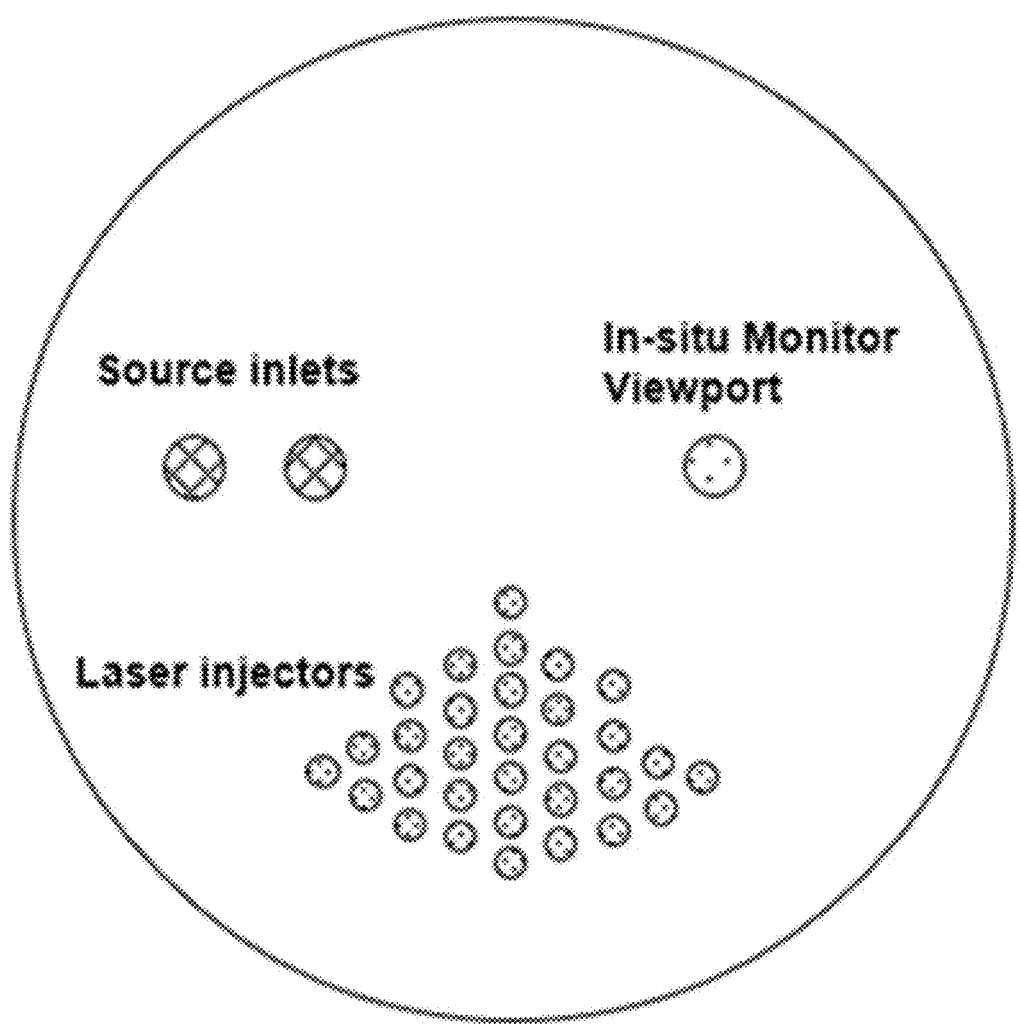
FIG. 38 is the top face of the shower head in a Precursor-distribution-independent (PDI) design.
Figure 39:
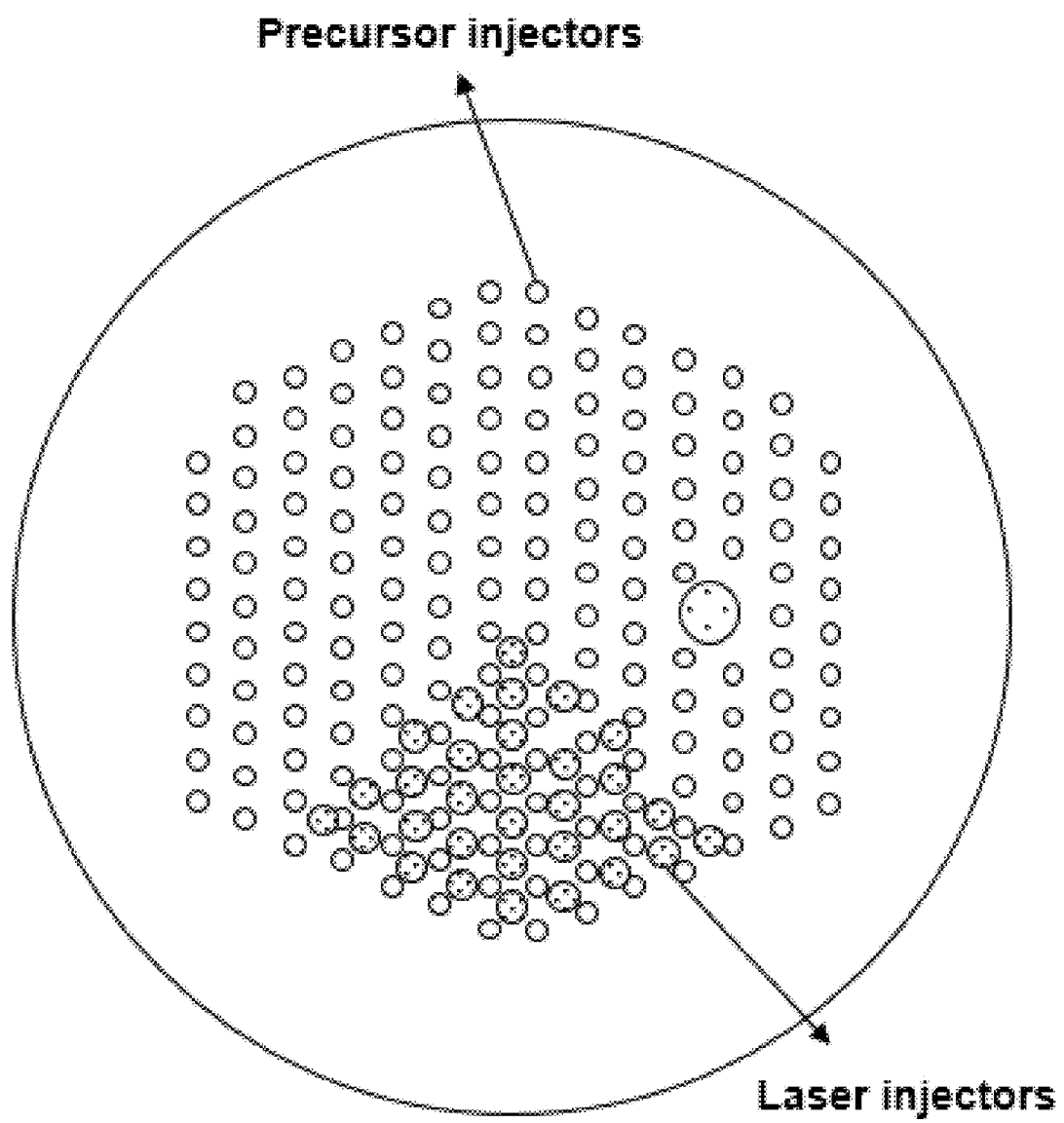
FIG. 39 is the bottom face of the shower head in FIG. 38 in the Precursor-distribution-independent (PDI) design.

FIG. 38 and FIG. 39 show the top face and bottom face, respectively, of a shower head with a Precursor-distribution-independent (PDI) design. The laser injectors are distributed as a sector array at the intervals of the source injectors at the bottom face of shower head. The laser energy would be distributed uniformly in the sector region in the MOCVD chamber. This sector-shaped design can compensate for the difference of laser irradiation time for substrates along radial direction of the wafer carrier caused by the different line velocity of the wafer carrier along that direction. The distribution of the III-group and V-group precursor injectors can be designed independent of the laser injector distribution in this design.

Figure 40:
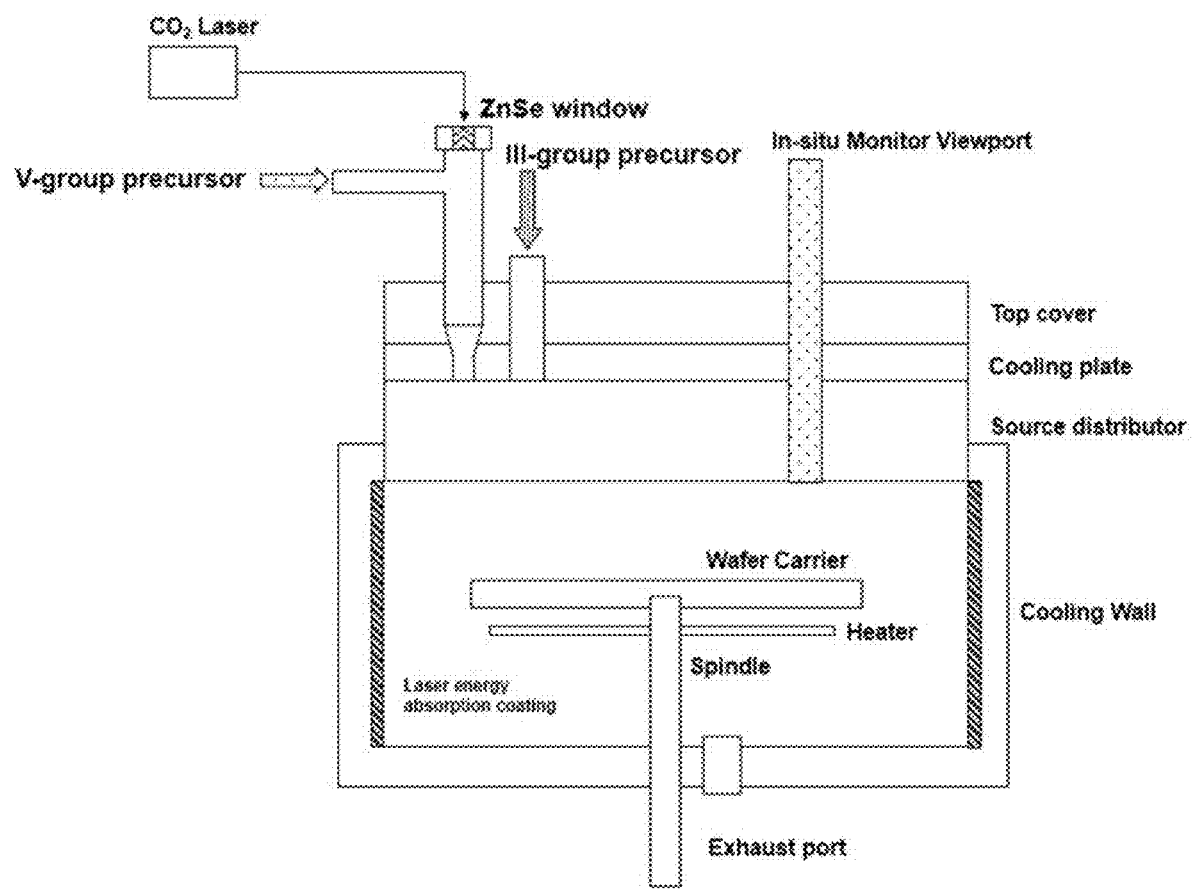
FIG. 40 is a sectional view of a Laser-assisted MOCVD chamber with laser irradiation on the V-group precursor inlet.

FIG. 40 shows a sectional view of a Laser-assisted MOCVD chamber with laser irradiation at the V-group precursor inlet. In this design, the laser energy is introduced into the V-group precursor inlet directly from an inserted ZnSe window. The activation of N species thus happens in the inlet before injecting into MOCVD chamber. The input laser power depends on the length of the inlet, diameter of the inlet, and the precursor flow rate to guarantee enough active nitrogen species. A smaller inlet diameter can be designed at the joint of the source distributor to increase the velocity of the active nitrogen species to reduce their transport time.

The chambers described herein can be used for laser-assisted III-nitride materials growth on single or multiple wafers. The devices described herein can be used for single or multiple layer growth.

A typical GaN growth can be performed by the following steps:

1. The substrates are loaded on wafer carriers and then transferred to the growth chamber. The substrates can be bulk GaN, GaN template, sapphire, Si, SiC, etc. GaN growth on GaN template is introduced here as an example.
2. The wafer carriers are loaded on the rotary spindle.
3. The rotation speed, heater power, chamber pressure, and process gas flow rates are ramped up. $NH_3$ is supplied while the heater is heating up to minimize or prevent decomposition of the substrates.
4. A thermal cleaning process with $H_2$ carrier gas is used prior to GaN growth.
5. After thermal cleaning, the laser system is turned on. The laser energy is introduced to the chamber through the laser injector array or precursor inlet, depending on the chamber design used.
6. $NH_3$ in the region of laser array will crack first and then the cracked N species will be transported from the laser input region to other regions due to the high rotation speed of the wafer carrier.
7. TMGa is introduced into the growth chamber after several minutes of stabilization of $NH_3$ cracking. Laser-assisted GaN growth initiates after TMGa is introduced.
8. TMGa and the laser system are turned off when the growth finishes but the $NH_3$ remains on to protect the growth GaN epilayer from decomposition at high temperatures.
9. The heater power and rotation speed are decreased. $NH_3$ is turned off when the temperature is low enough.
10. The wafer carriers are then removed from the growth chamber.

The same concept of laser-assisted MOCVD chamber design can be applied for systems for materials growth other than III-nitrides, such as III-V, III-oxides, group V, and II-VI. Different laser excitation wavelength can be generated by using other laser system than $CO_2$ laser.

The laser-assisted MOCVD chamber designs described herein can provide a new route to achieve growth conditions that cannot be reached with the conventional chamber design, especially for large scale production.

Other advantages which are obvious and which are inherent to the invention will be evident to one skilled in the art. It will be understood that certain features and sub-combinations are of utility and may be employed without reference to other features and sub-combinations. This is contemplated by and is within the scope of the claims. Since many possible embodiments may be made of the invention without departing from the scope thereof, it is to be understood that all matter herein set forth or shown in the accompanying drawings is to be interpreted as illustrative and not in a limiting sense.

The methods of the appended claims are not limited in scope by the specific methods described herein, which are intended as illustrations of a few aspects of the claims and any methods that are functionally equivalent are intended to fall within the scope of the claims. Various modifications of the methods in addition to those shown and described herein are intended to fall within the scope of the appended claims. Further, while only certain representative method steps disclosed herein are specifically described, other combinations of the method steps also are intended to fall within the scope of the appended claims, even if not specifically recited. Thus, a combination of steps, elements, components, or constituents may be explicitly mentioned herein or less, however, other combinations of steps, elements, components, and constituents are included, even though not explicitly stated.

What is claimed is:

1. A laser-assisted metal-organic chemical vapor deposition (MOCVD) device, the device comprising:
    a plurality of laser injectors, wherein each of the plurality of laser injectors defines an inlet, an outlet opposite and spaced apart from the inlet, and an optical path extending from the inlet to the outlet;
    a plurality of first conduits, wherein each of the first conduits defines an inlet, an outlet opposite and spaced apart from the inlet, and a path for fluid flow extending from the inlet to the outlet;
    a plurality of second conduits, wherein each of the second conduits defines an inlet, an outlet opposite and spaced apart from the inlet, and a path for fluid flow extending from the inlet to the outlet; and
    a source distributor, wherein the plurality of first conduits and the plurality of second conduits are defined by the source distributor;
    wherein, when the device is assembled together with a wall defining a chamber, a rotatable substrate support surface disposed within the chamber, and a laser device for producing a plurality of laser beams:
    the plurality of laser injectors are configured such that the outlet of each of the plurality of laser injectors directs one of the plurality of laser beams onto the rotatable substrate support surface disposed within the chamber;
    the outlets of the plurality of laser injectors are positioned in a line across a central width of the chamber;
    the outlets of the plurality of first conduits are configured to introduce a first precursor into the chamber toward the rotatable substrate support surface such that the first precursor flows through at least one of the plurality of laser beams within the chamber prior to reaching the rotatable substrate support surface;
    the outlet of each of the plurality of first conduits is located directly adjacent the outlet of at least one of the plurality of laser injectors;
    the outlet of each of the plurality of laser injectors has the outlets of three or more of the first conduits located directly adjacent thereto, the outlets of the three or more first conduits being evenly spaced around the periphery of the outlet of said laser injector;
    the outlets of the plurality of second conduits are configured to introduce a second precursor into the chamber toward the rotatable substrate support surface; and
    the outlets of the plurality of second conduits are arranged in an ordered array and are evenly spaced throughout at least a portion of the source distributor on either side of the outlets of the first conduits and the outlets of the plurality of laser injectors.

2. The device of claim 1, wherein the first precursor is a V-group precursor and the second precursor is a III-group precursor.

3. The device of claim 1, wherein each of the plurality of laser injectors includes one or more lenses for expanding each of the laser beams onto the rotatable substrate support surface.

4. The device of claim 1, wherein the outlets of the plurality of first conduits are configured to introduce the first precursor substantially parallel to a central axis of each of the plurality of laser beams within the chamber.

5. The device of claim 1, wherein the plurality of laser injectors are defined by the source distributor.

6. The device of claim 1, further comprising a laser device for producing the plurality of laser beams.

7. A laser-assisted metal-organic chemical vapor deposition (MOCVD) device, the device comprising:
- a plurality of laser injectors, wherein each of the plurality of laser injectors defines an inlet, an outlet opposite and spaced apart from the inlet, and an optical path extending from the inlet to the outlet;
- a source distributor defining a plurality of conduits, wherein each of the plurality of conduits defines an inlet, an outlet opposite and spaced apart from the inlet, and a path for fluid flow extending from the inlet to the outlet;
- wherein, when the device is assembled together with a wall defining a chamber, a rotatable substrate support disposed within the chamber, and a laser device for producing a plurality of laser beams:
- the plurality of laser injectors are configured such that the outlet of each of the plurality of laser injectors directs one of the plurality of laser beams onto the rotatable substrate support surface disposed within the chamber;
- the outlets of the plurality of conduits are configured to introduce a first precursor and a second precursor into the chamber toward the rotatable substrate support surface;
- wherein the plurality of laser injectors are defined by the source distributor;
- wherein the outlets of the plurality of laser injectors are all positioned in an ordered array within a quadrant of the source distributor;
- wherein the outlets of the plurality of conduits are evenly spaced throughout the source distributor;
- wherein the outlet of each of the plurality of laser injectors is located directly adjacent the outlet of at least one of the plurality of conduits; and
- wherein the outlets of the plurality of laser injectors are regularly interspersed between the outlets of the plurality of conduits within the quadrant.

8. The device of claim 7, wherein the first precursor is a V-group precursor and the second precursor is a III-group precursor.

9. The device of claim 7, wherein the plurality of conduits comprise a set of first conduits and a set of second conduits, the outlets of the set of first conduits being configured to introduce the first precursor into the chamber toward the rotatable substrate support surface, the outlets of the set of second conduits being configured to introduce the second precursor into the chamber toward the rotatable substrate support surface.

10. The device of claim 9, wherein the outlets of the set of first conduits are all located within the same quadrant of the source distributor as the plurality of laser injectors.

11. The device of claim 7, wherein each of the plurality of laser injectors includes one or more lenses for expanding each of the laser beams onto the rotatable substrate support surface.

12. The device of claim 7, wherein the outlets of the plurality of conduits are configured to introduce the first precursor and the second precursor substantially parallel to a central axis of each of the plurality of laser beams within the chamber.

13. The device of claim 7, further comprising a laser device for producing the plurality of laser beams.

* * * * *